(12) United States Patent
Shirakawa et al.

(10) Patent No.: US 9,659,663 B2
(45) Date of Patent: May 23, 2017

(54) SEMICONDUCTOR MEMORY DEVICE

(71) Applicant: KABUSHIKI KAISHA TOSHIBA, Minato-ku (JP)

(72) Inventors: Masanobu Shirakawa, Chigasaki (JP); Takuya Futatsuyama, Yokohama (JP); Koji Hosono, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 4 days.

(21) Appl. No.: 14/645,740

(22) Filed: Mar. 12, 2015

(65) Prior Publication Data
US 2016/0078954 A1 Mar. 17, 2016

(30) Foreign Application Priority Data
Sep. 16, 2014 (JP) .................................. 2014-188192

(51) Int. Cl.
| G11C 16/26 | (2006.01) |
| G11C 16/34 | (2006.01) |
| G11C 11/56 | (2006.01) |
| G11C 16/04 | (2006.01) |

(52) U.S. Cl.
CPC .......... *G11C 16/26* (2013.01); *G11C 11/5628* (2013.01); *G11C 11/5642* (2013.01); *G11C 16/3427* (2013.01); *G11C 16/3459* (2013.01); *G11C 16/0483* (2013.01)

(58) Field of Classification Search
CPC ........................... G11C 16/26; G11C 16/3459
USPC ......................................................... 365/72
See application file for complete search history.

(56) References Cited

U.S. PATENT DOCUMENTS

| 7,852,675 | B2 | 12/2010 | Maejima |
| 8,233,323 | B2 | 7/2012 | Hishida et al. |
| 8,372,720 | B2 | 2/2013 | Fukuzumi et al. |
| 8,514,627 | B2 | 8/2013 | Itagaki et al. |
| 8,952,426 | B2 | 2/2015 | Maejima |
| 2011/0007572 | A1* | 1/2011 | Ueno .................. G11C 11/5628 365/185.22 |
| 2011/0284946 | A1 | 11/2011 | Kiyotoshi |

(Continued)

FOREIGN PATENT DOCUMENTS

| JP | 2010-40109 | 2/2010 |
| JP | 2011-258289 | 12/2011 |

(Continued)

OTHER PUBLICATIONS

Office Action issued Aug. 29, 2016 in Taiwanese Patent Application No. 104106916 (with English translation).

*Primary Examiner* — Hoai V Ho
*Assistant Examiner* — Muna A Techane
(74) *Attorney, Agent, or Firm* — Oblon, McClelland, Maier & Neustadt, L.L.P.

(57) ABSTRACT

According to one embodiment, a semiconductor memory device includes: a first memory cell; a second memory cell; a first word line coupled to the first memory cell; and a second word line coupled to the second memory cell. When data is read from the first memory cell, a first voltage and a second voltage is applied to the first word line. A voltage of the second word line changes a first number of times while the first voltage is applied to the first word line, and the voltage changes a second number of times different from the first number of times while the second voltage is applied to the first word line.

20 Claims, 60 Drawing Sheets

(56) References Cited

U.S. PATENT DOCUMENTS

| | | | |
|---|---|---|---|
| 2011/0305089 A1 | 12/2011 | Abe et al. | |
| 2012/0069667 A1* | 3/2012 | Shirakawa | G11C 11/5628 365/185.17 |
| 2012/0069678 A1 | 3/2012 | Arai et al. | |
| 2012/0307557 A1 | 12/2012 | Itagaki | |
| 2013/0003454 A1 | 1/2013 | Edahiro et al. | |
| 2013/0329495 A1* | 12/2013 | Shiino | G11C 16/0483 365/185.09 |

FOREIGN PATENT DOCUMENTS

| | | |
|---|---|---|
| JP | 2012-69203 | 4/2012 |
| JP | 2013-12267 | 1/2013 |
| JP | 2013-254542 | 12/2013 |

\* cited by examiner

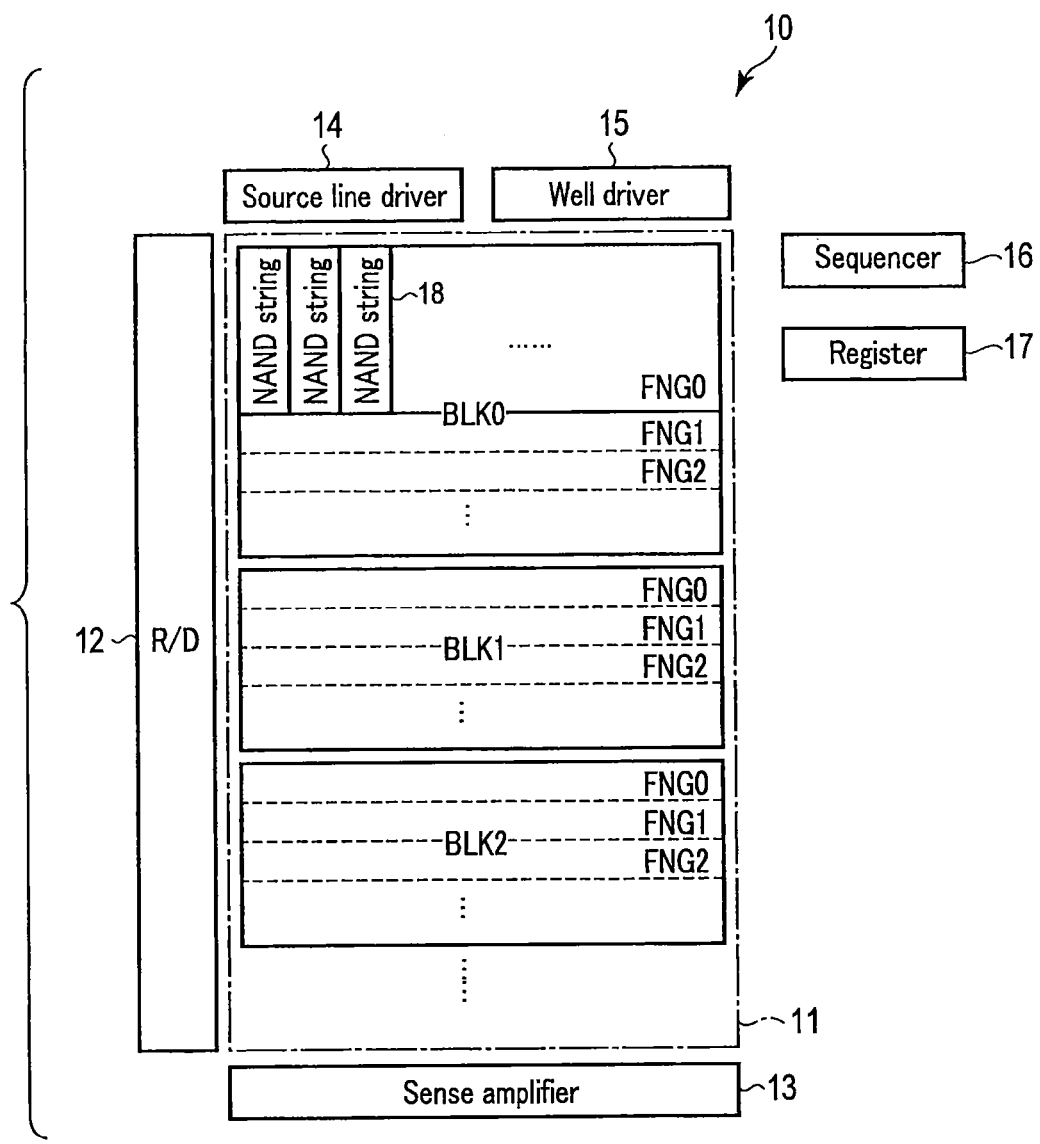
F I G. 1

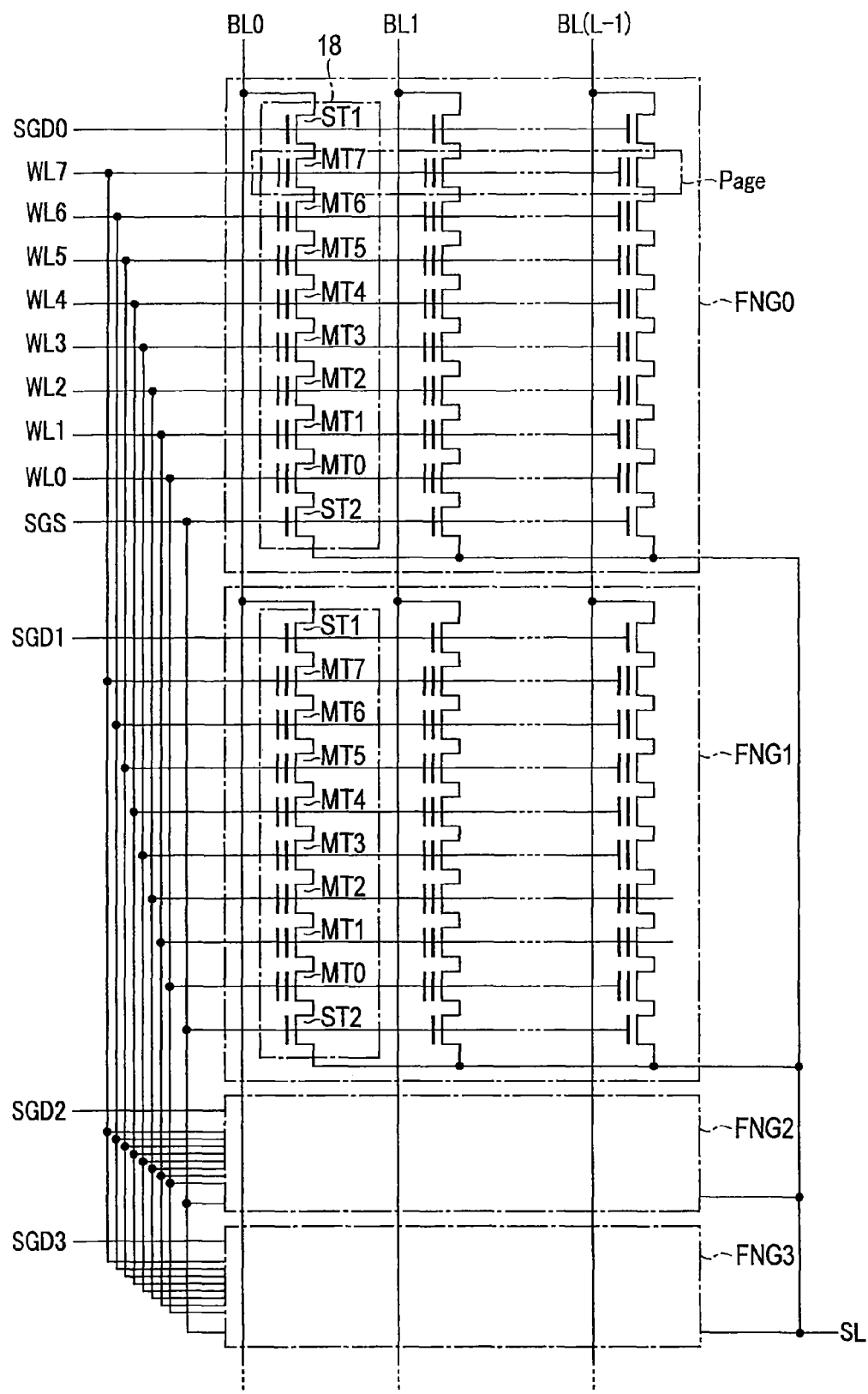
F I G. 2

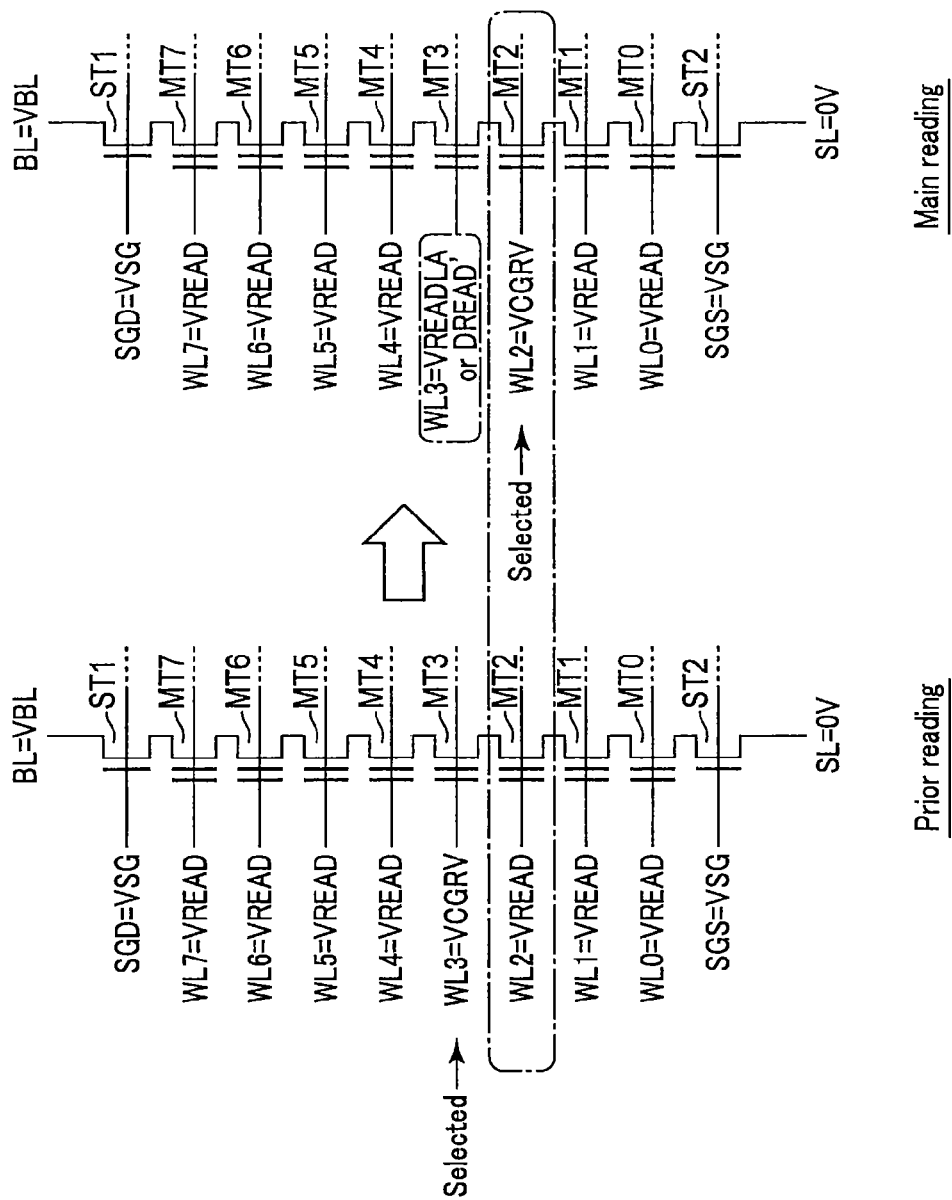
F I G. 7

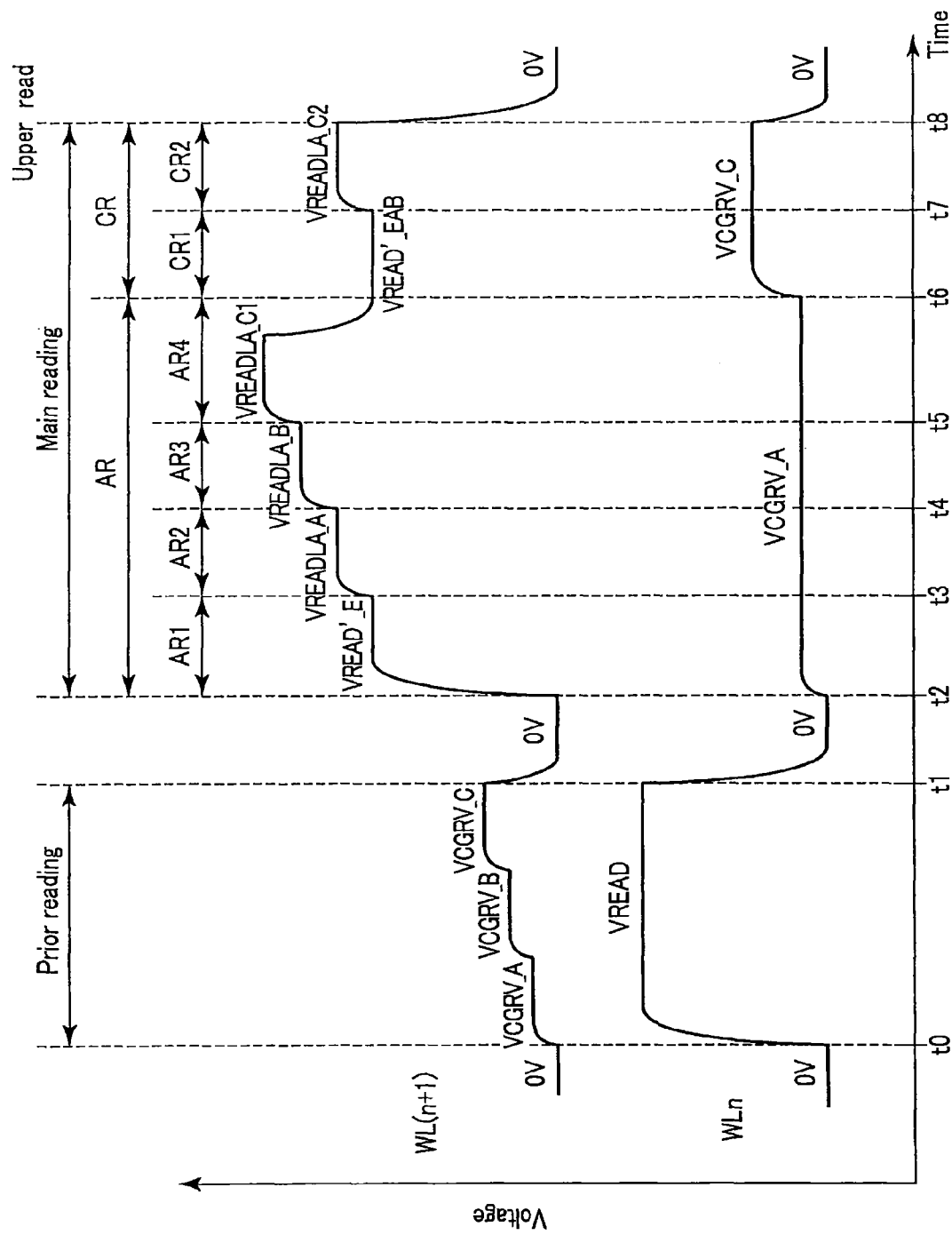
F I G. 8

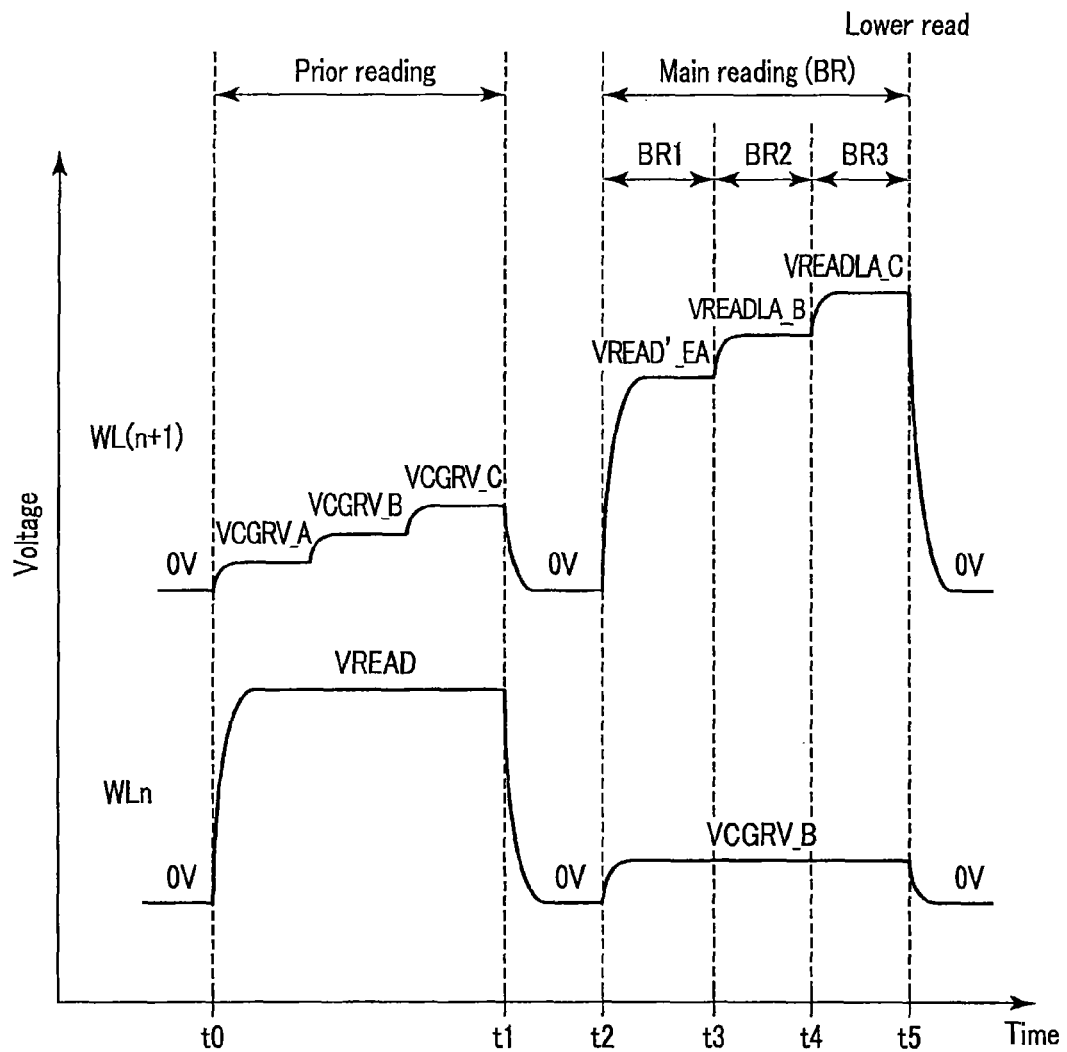
F I G. 10

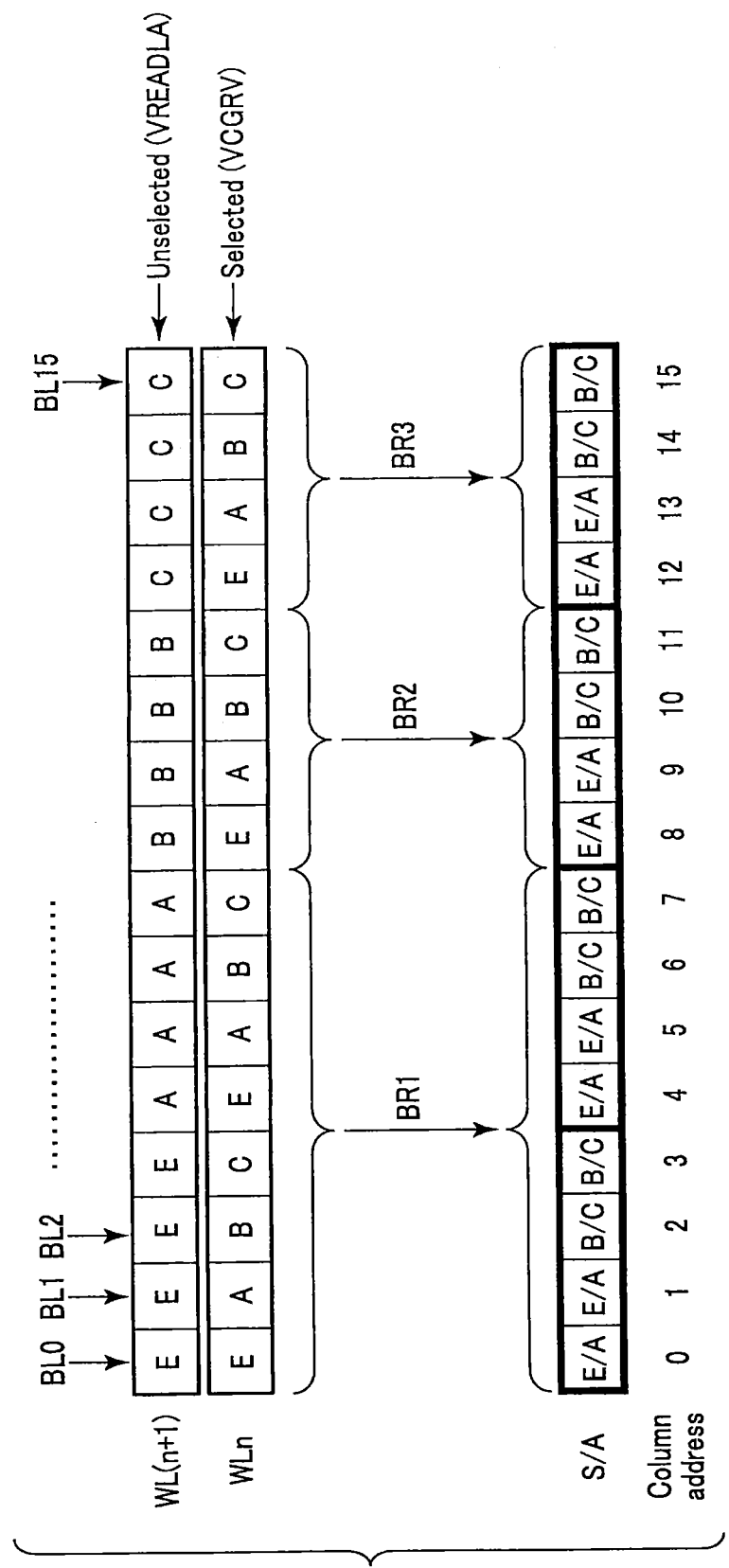
F I G. 11

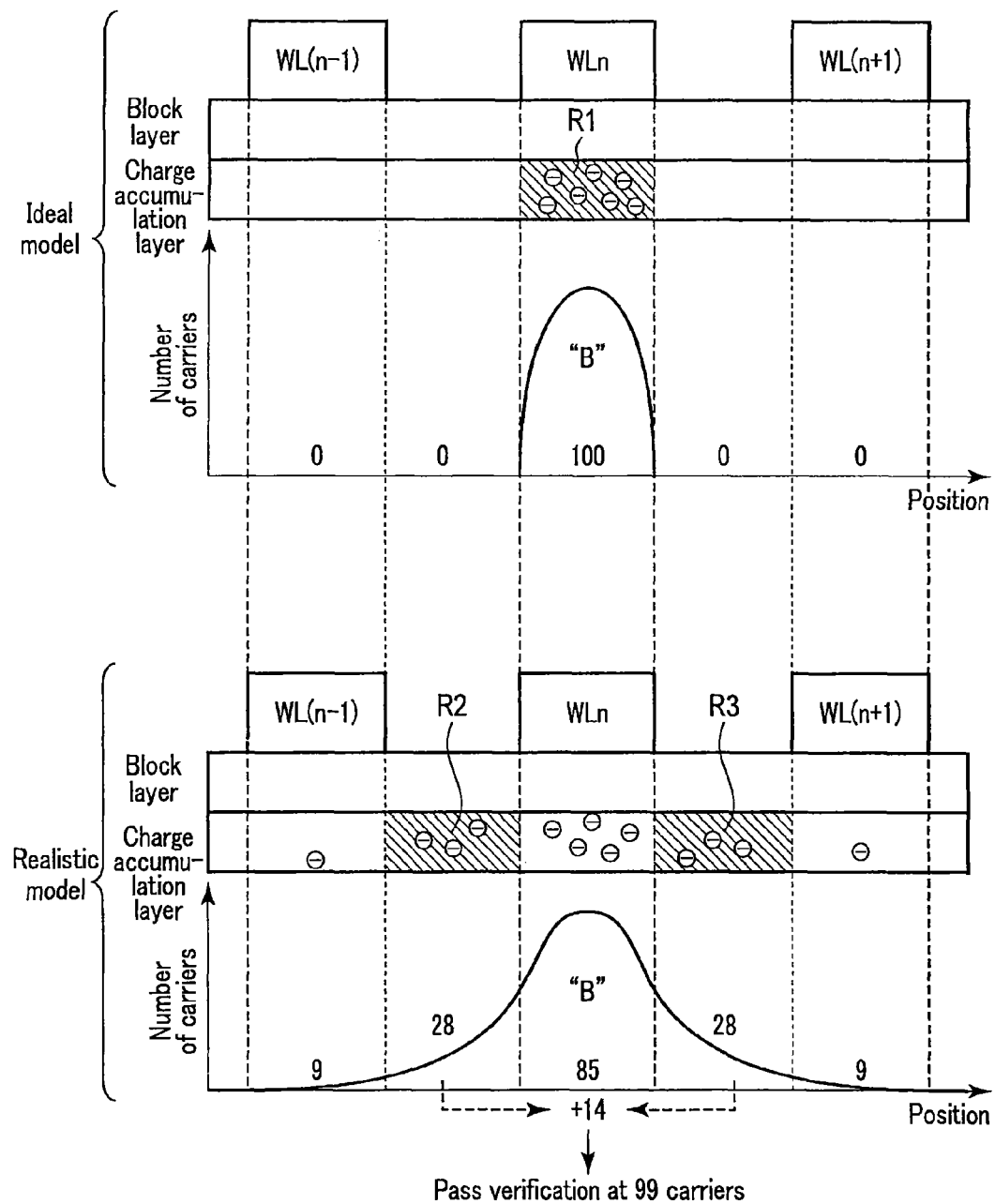
F I G. 13

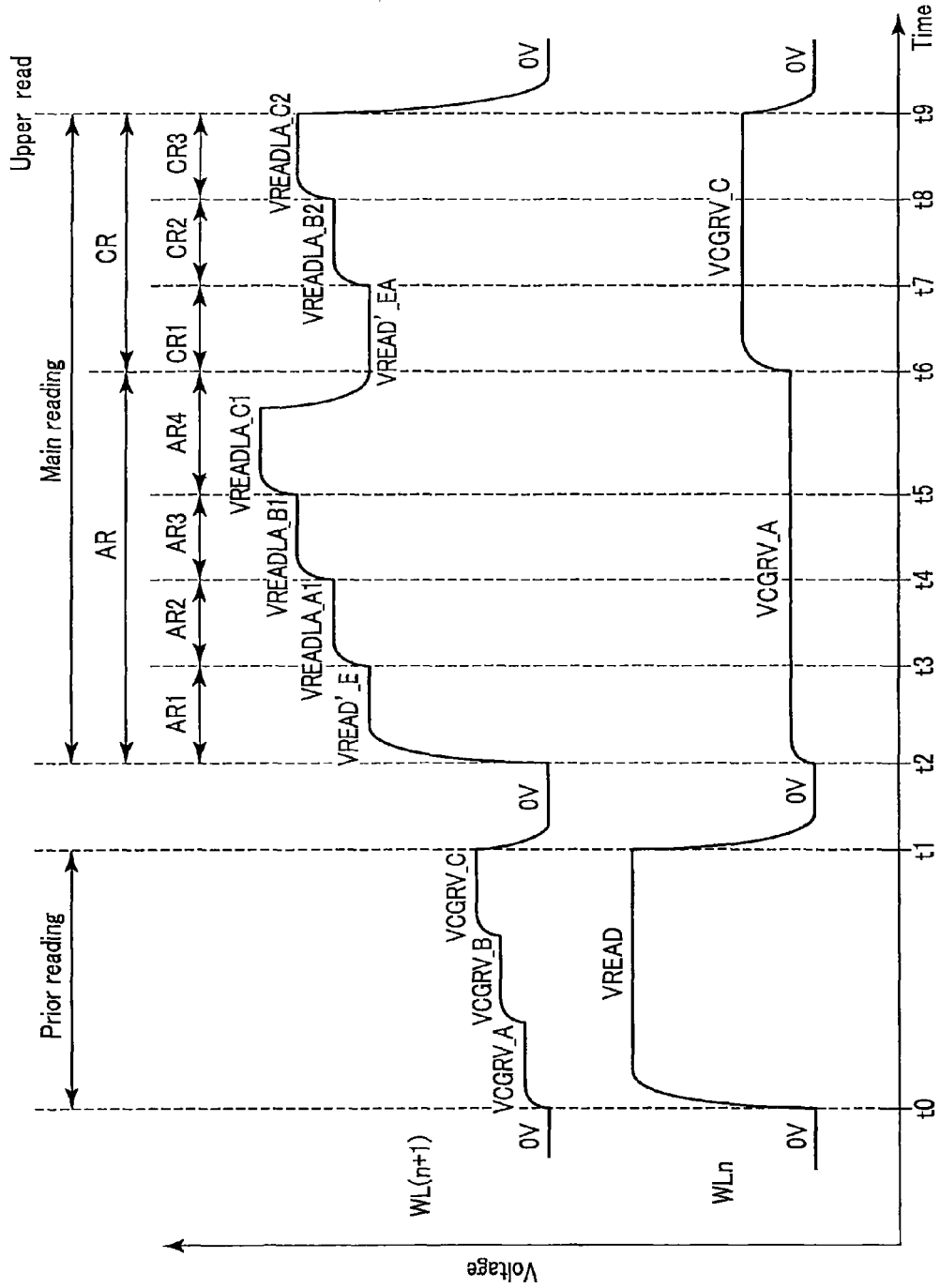
F I G. 18

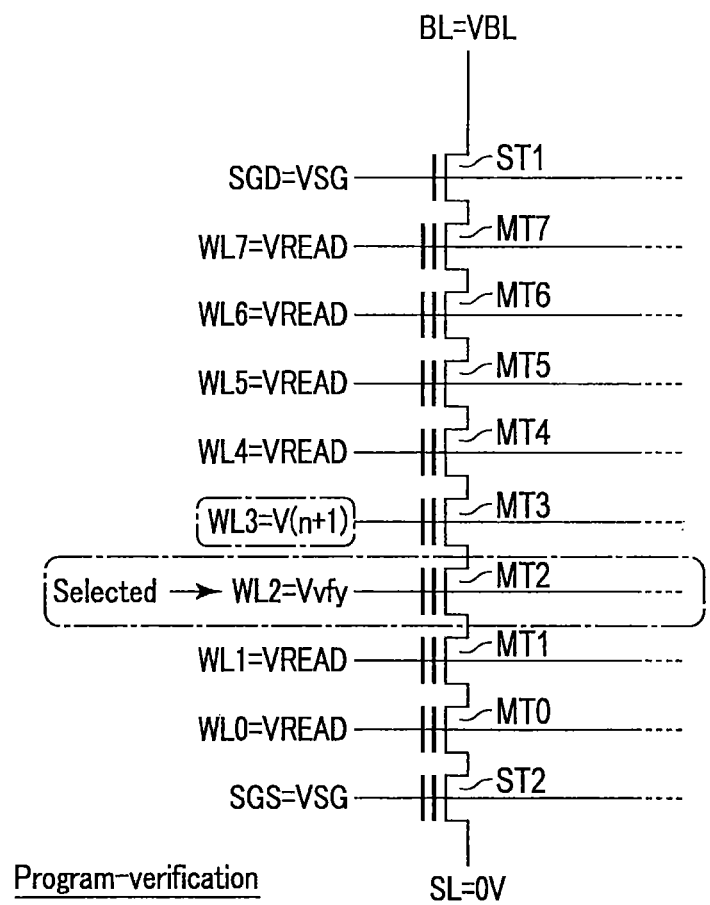
F I G. 24

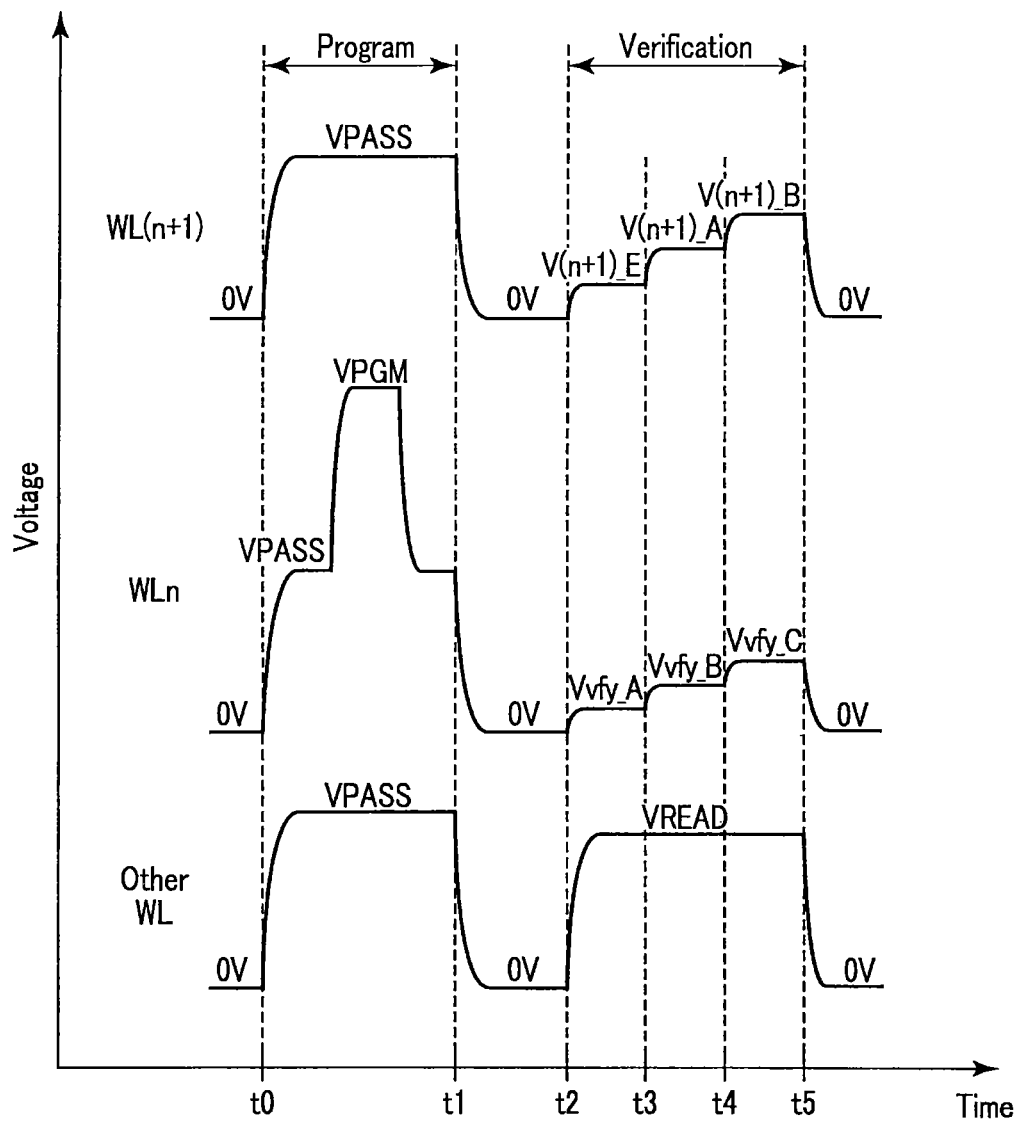
F I G. 25

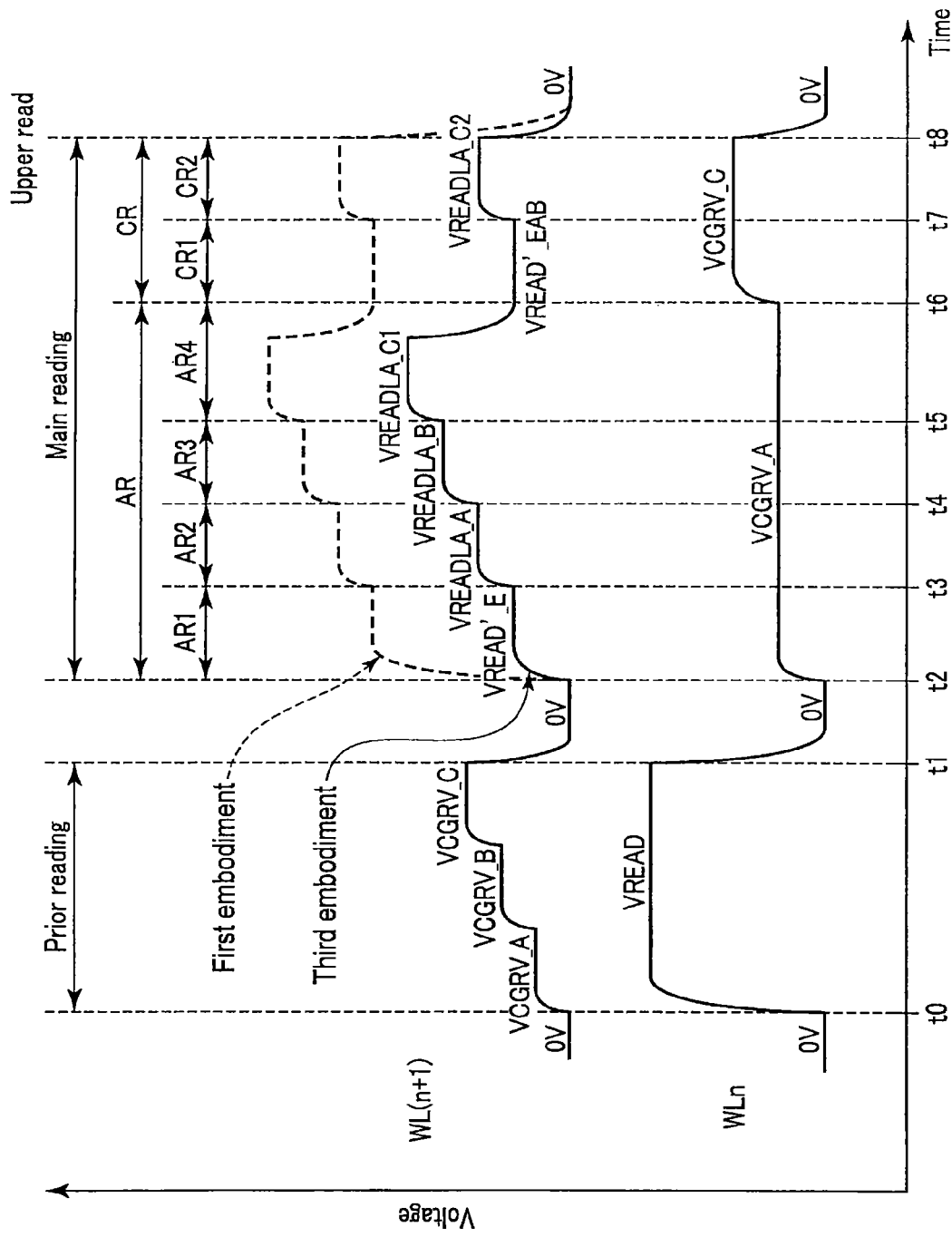
F I G. 26

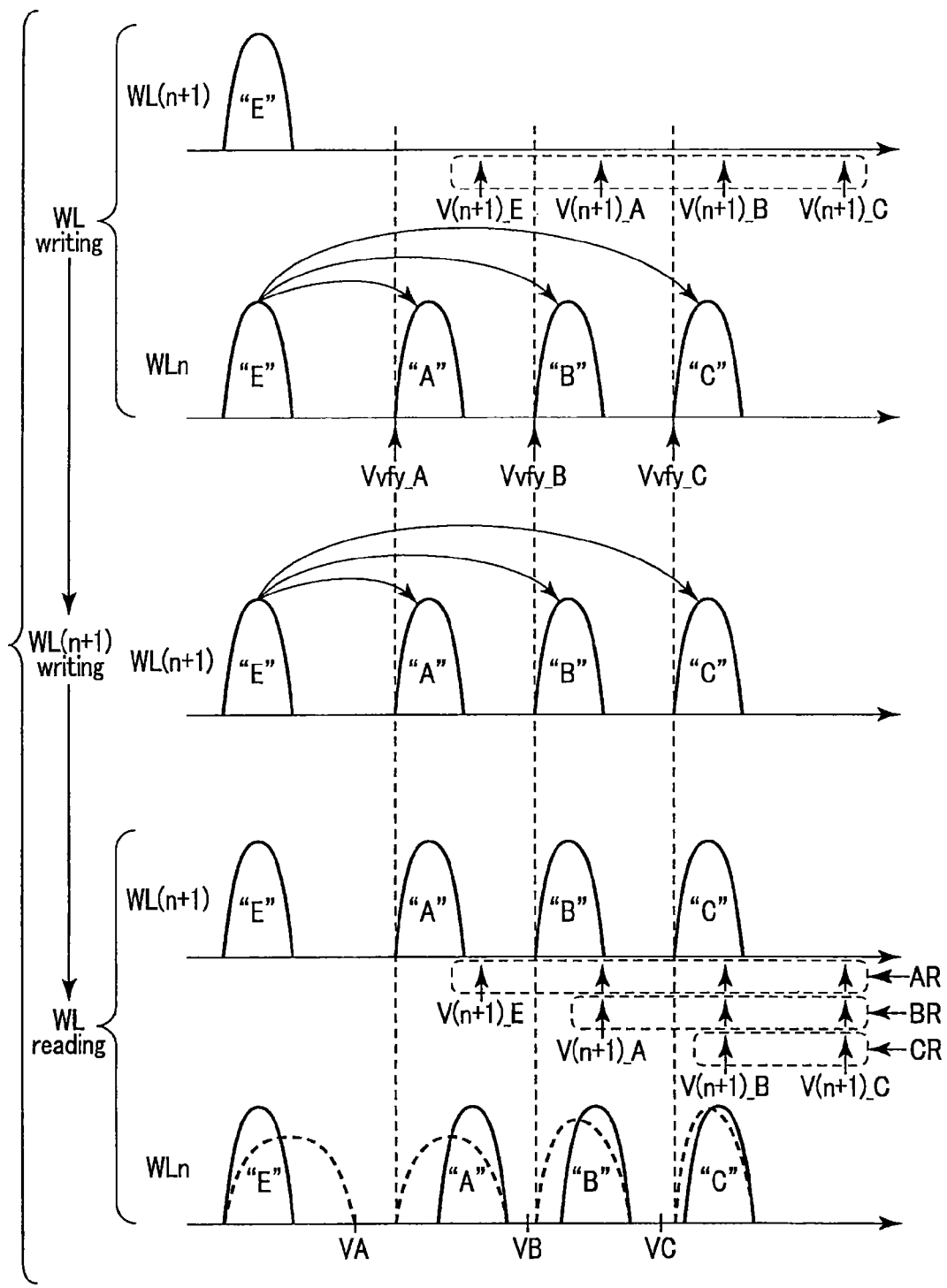
F I G. 27

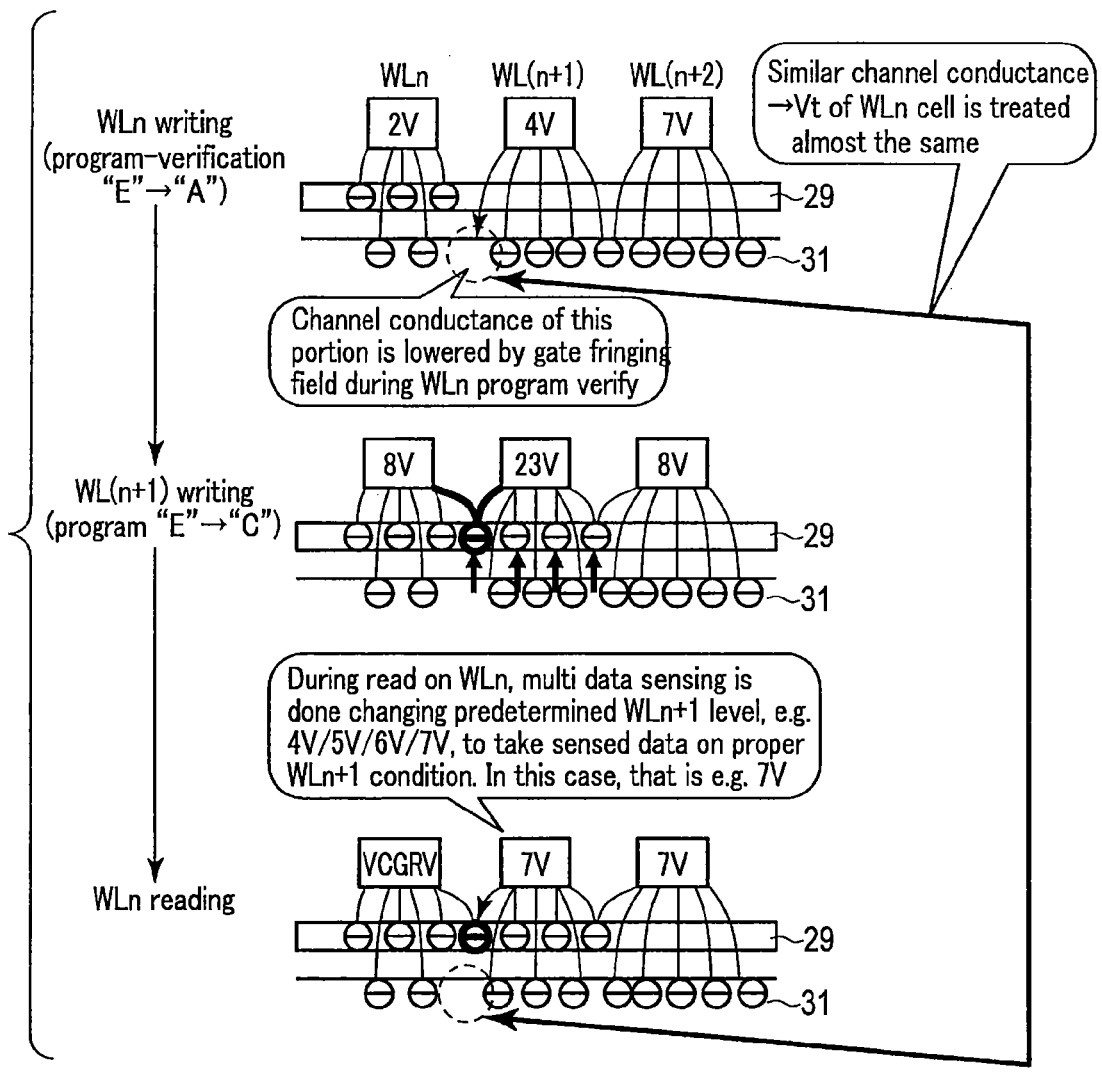
F I G. 28

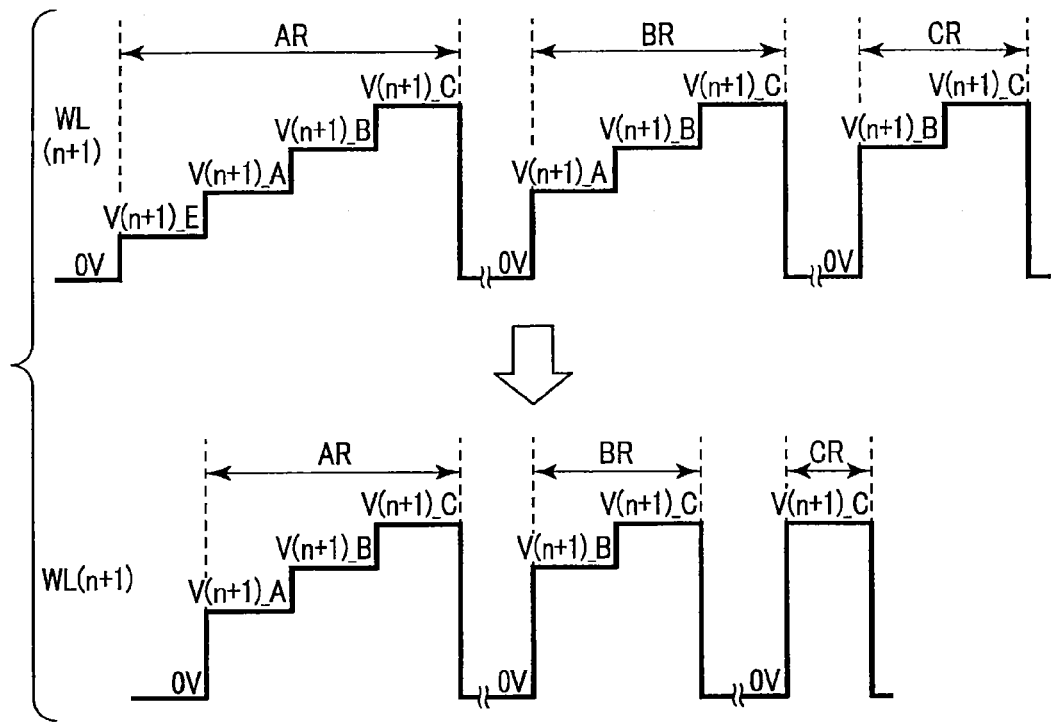
F I G. 29
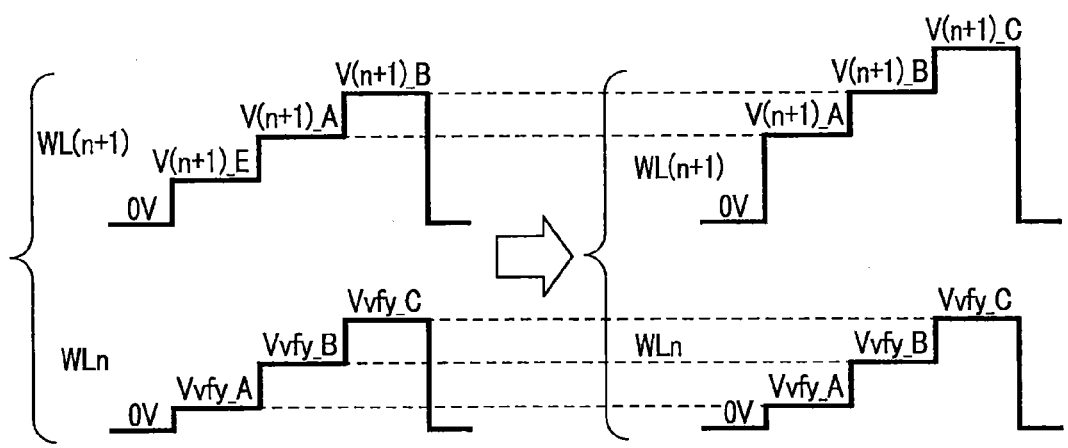
F I G. 30

| | VREAD'_E | VREADLA_A | VREADLA_B | VREADLA_C |
|---|---|---|---|---|
| Upper layer | ΔVE_upper | ΔVA_upper | ΔVB_upper | ΔVC_upper |
| Middle layer | ΔVE_mid | ΔVA_mid | ΔVB_mid | ΔVC_mid |
| Lower layer | ΔVE_low | ΔVA_low | ΔVB_low | ΔVC_low |

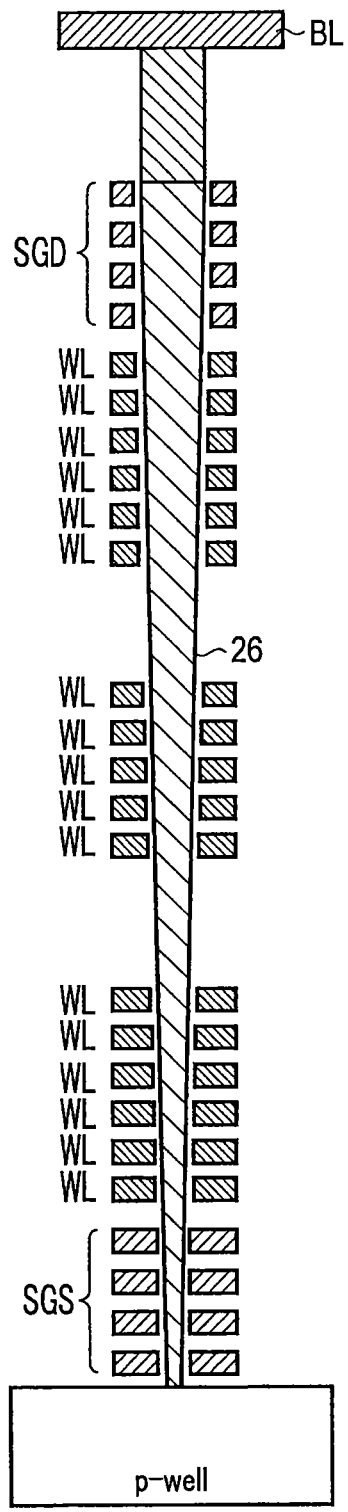
F I G. 38

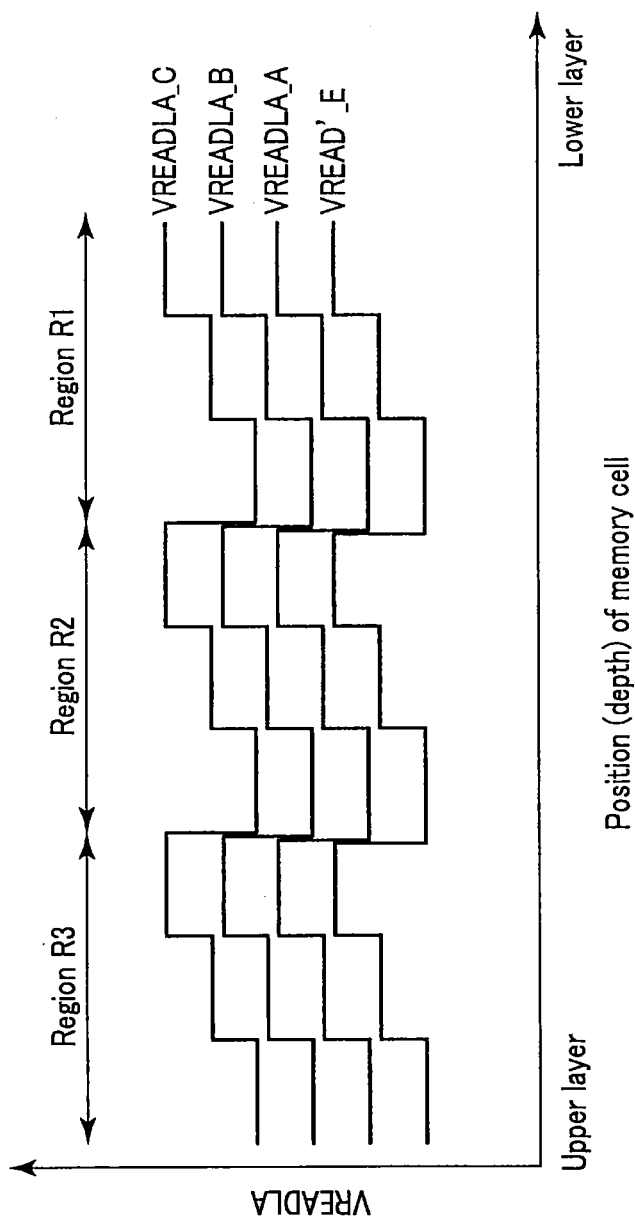
F I G. 40

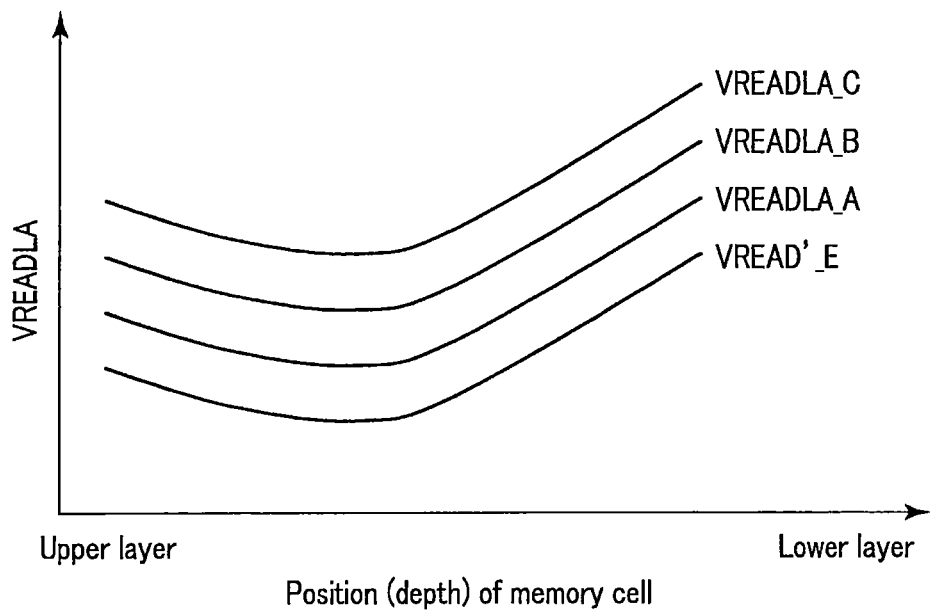
F I G. 41
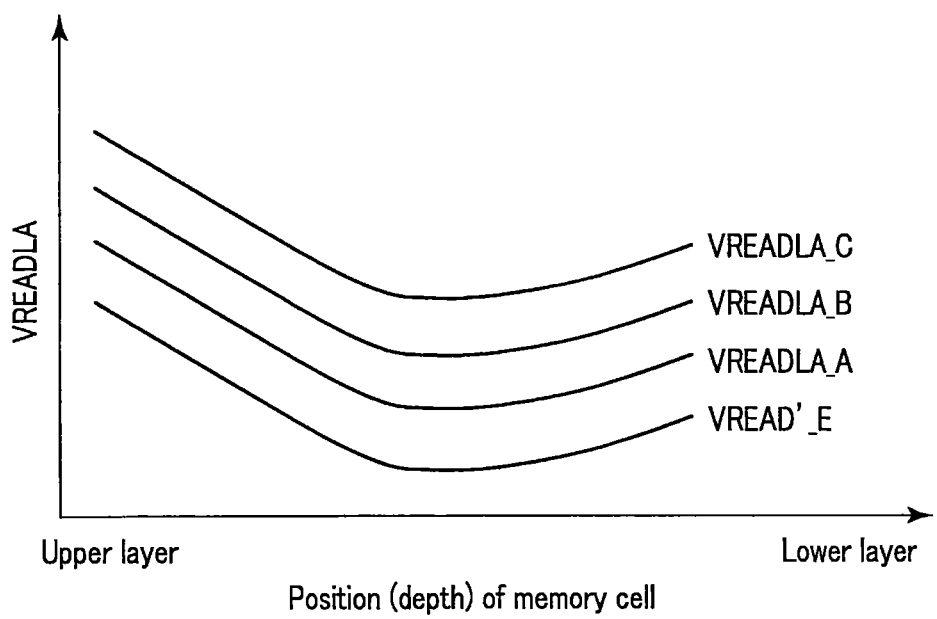
F I G. 42

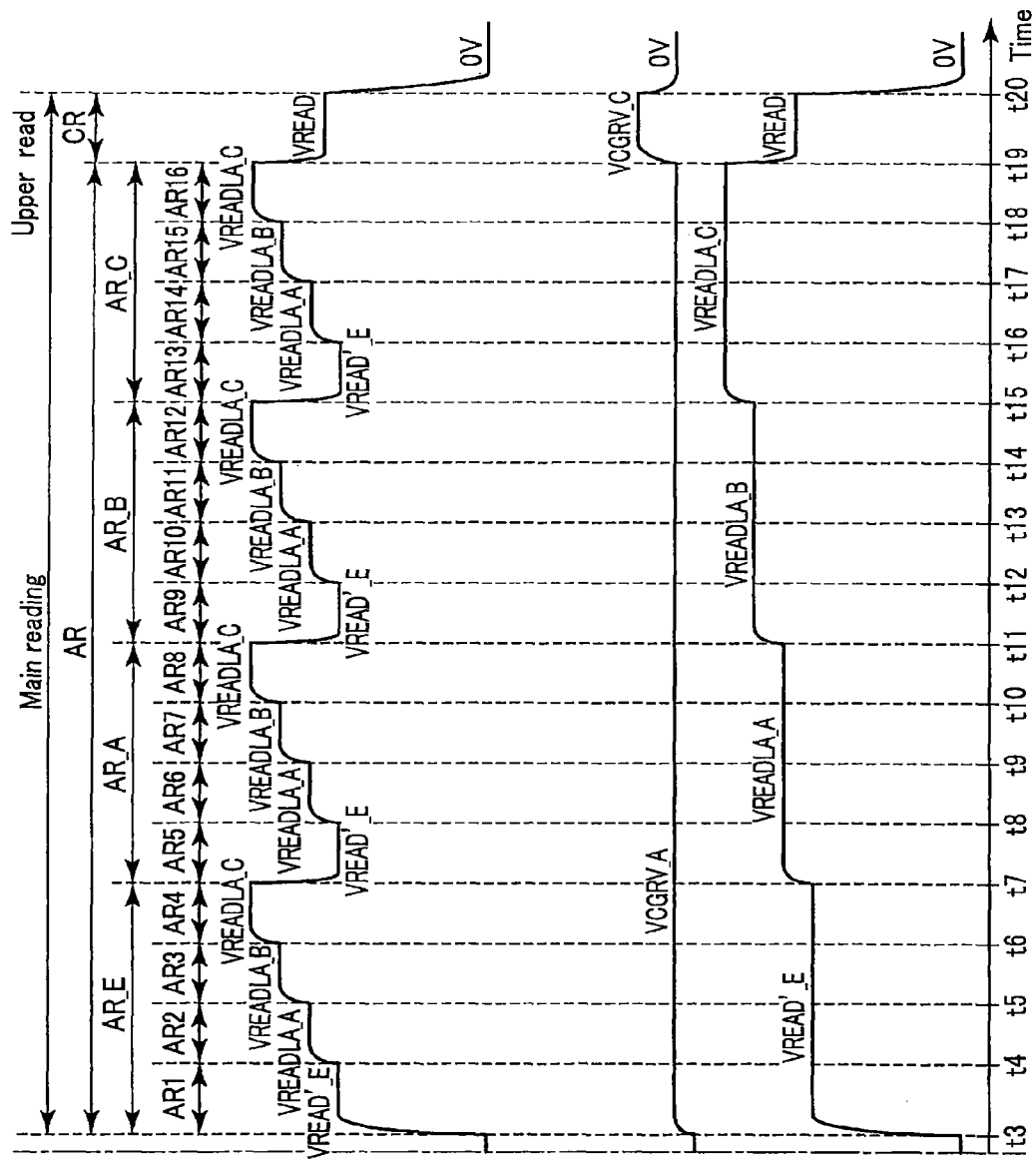
F I G. 45B

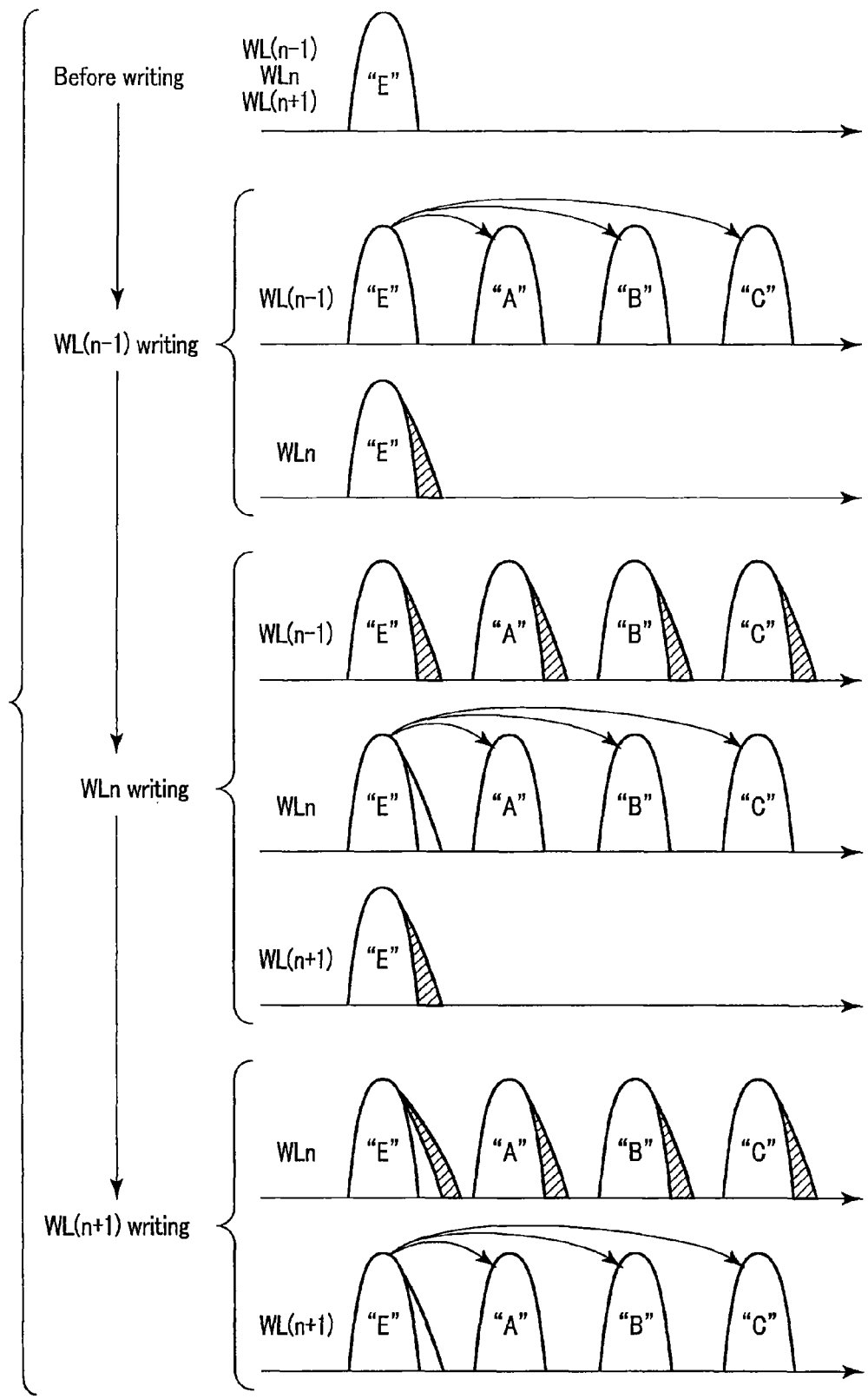
F I G. 47

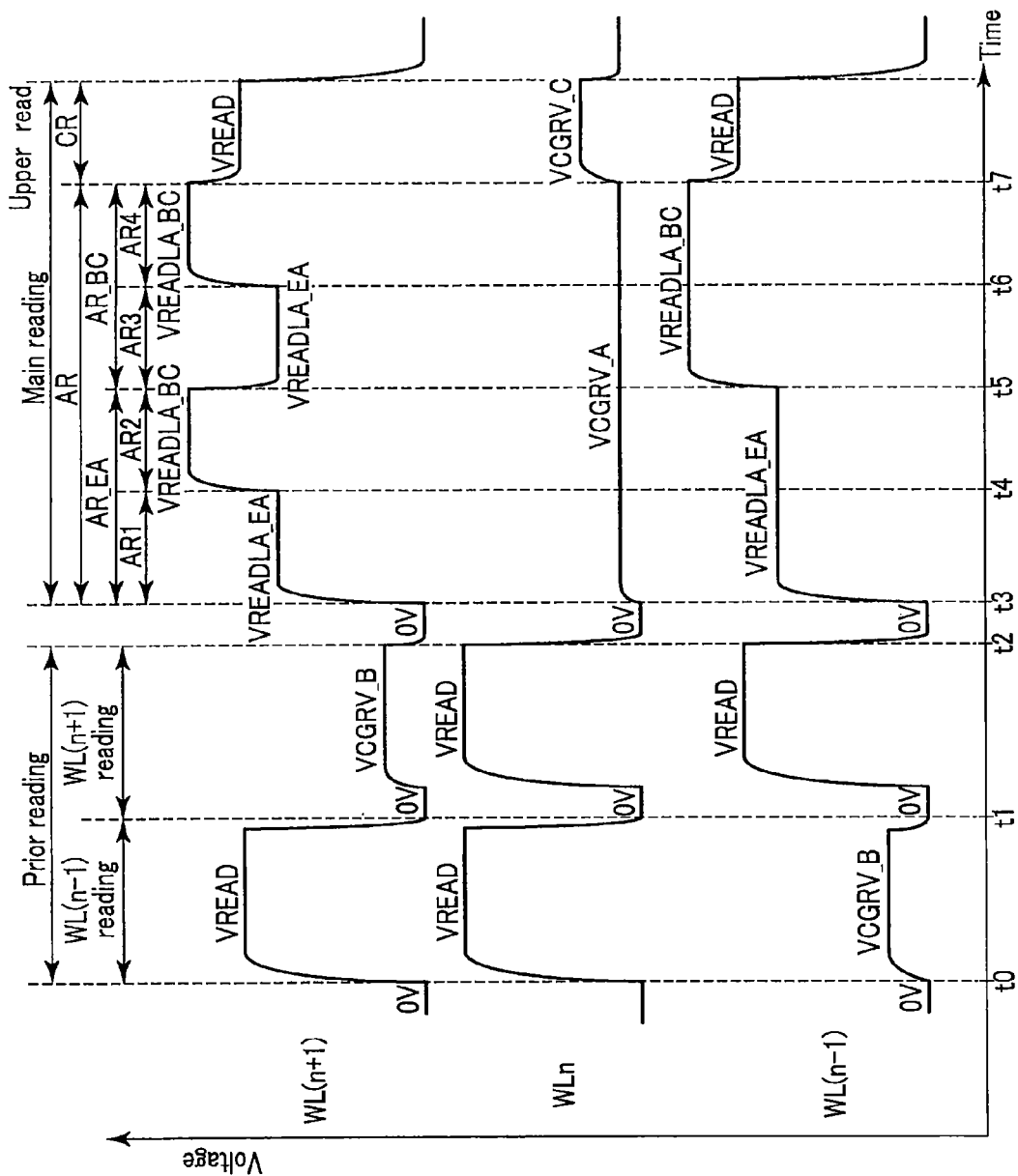
F I G. 48

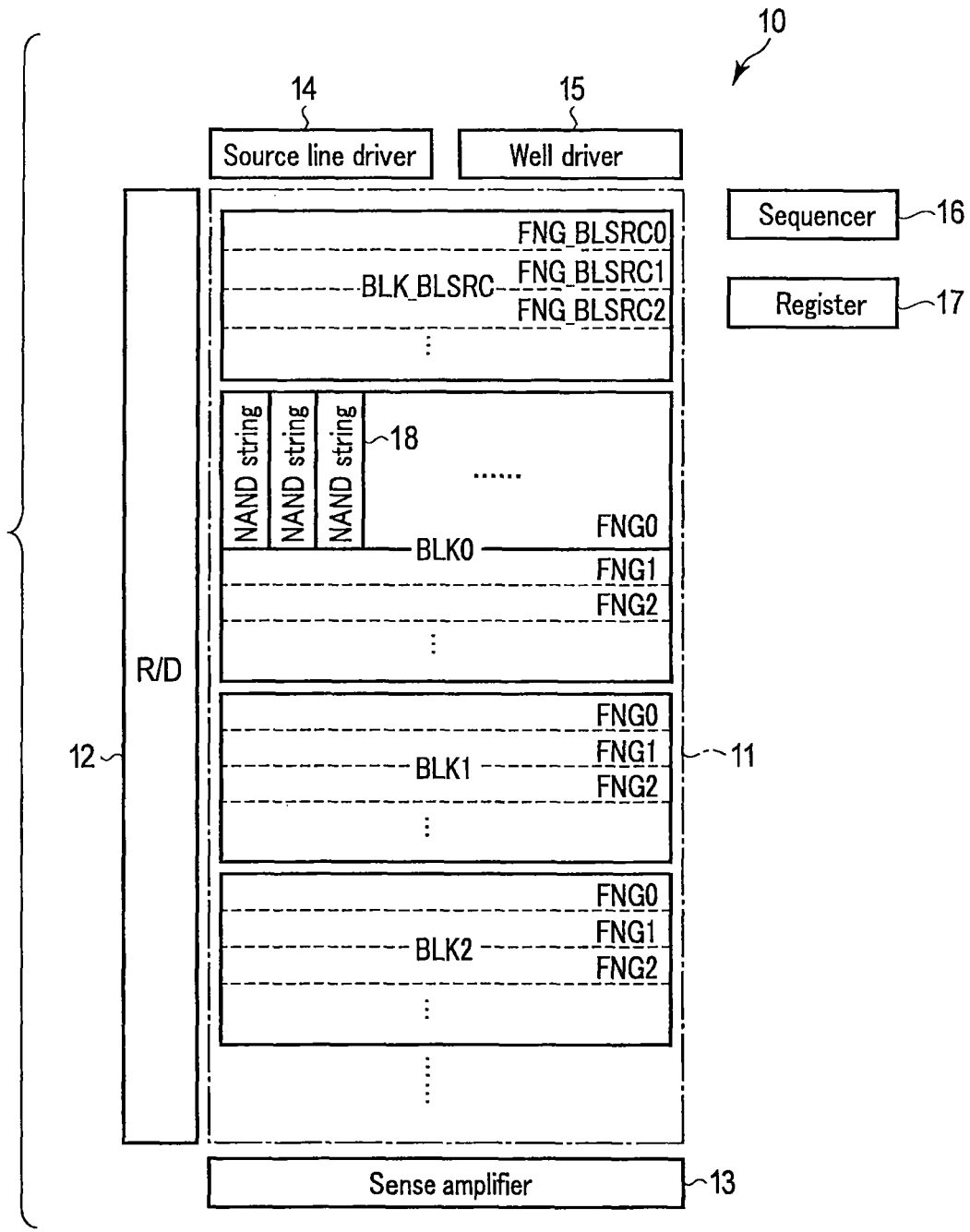
F I G. 50

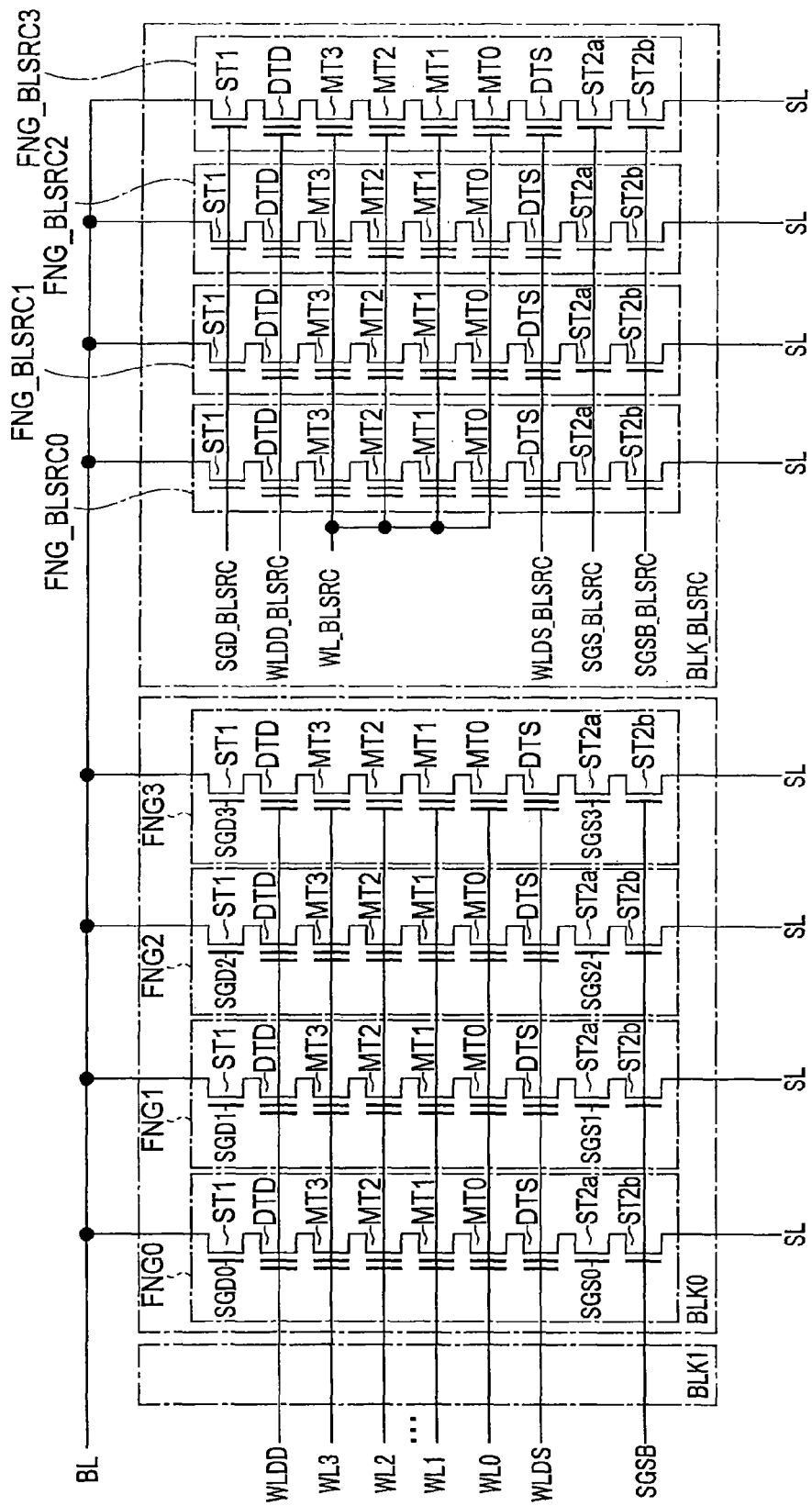
F I G. 51

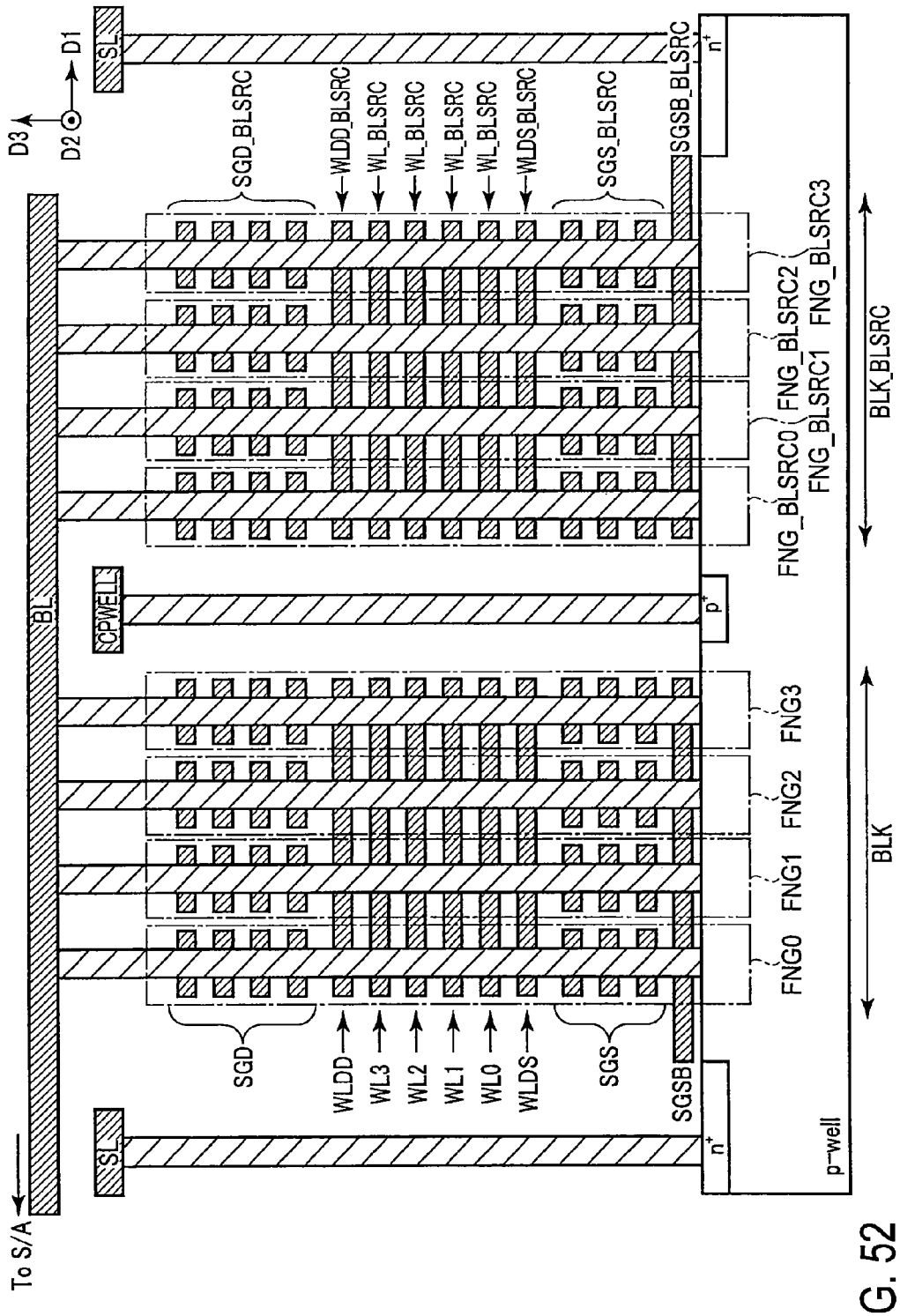
F I G. 52

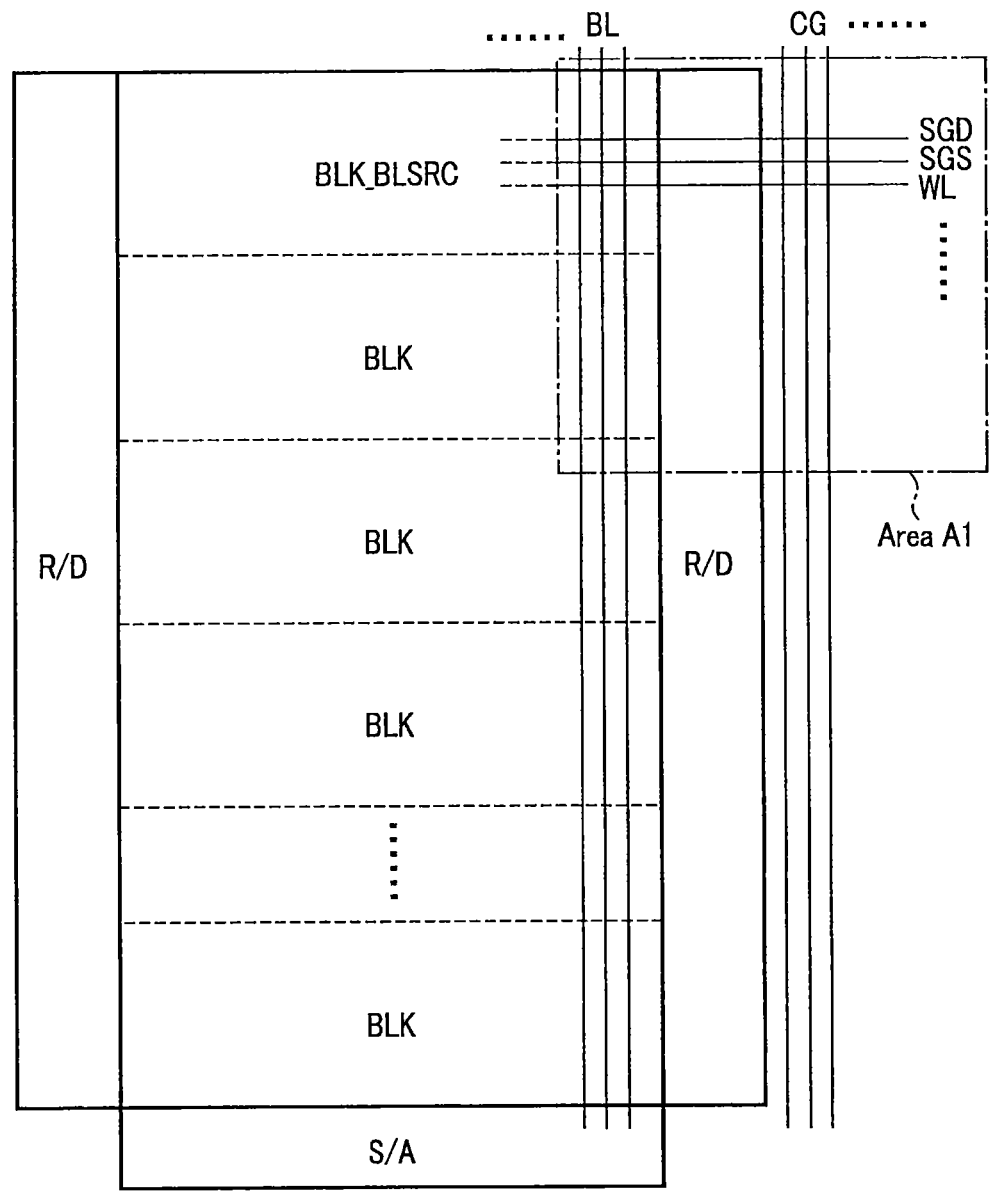
F I G. 53

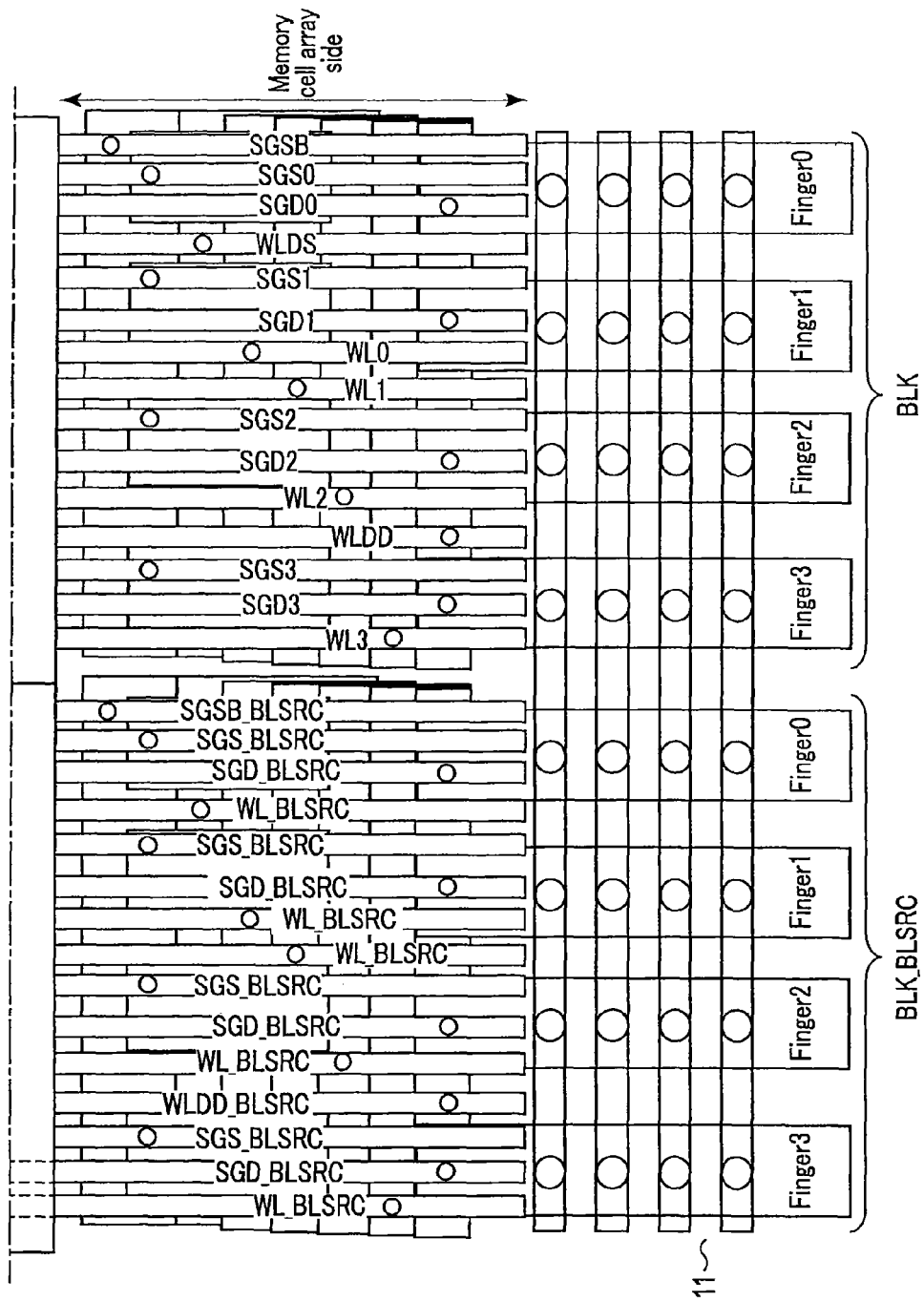
F I G. 54B

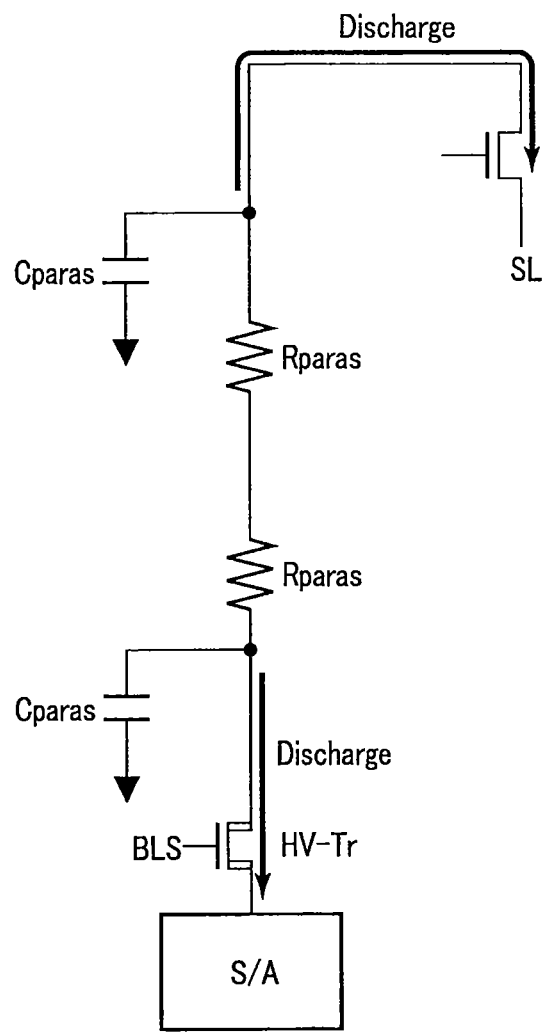
F I G. 57

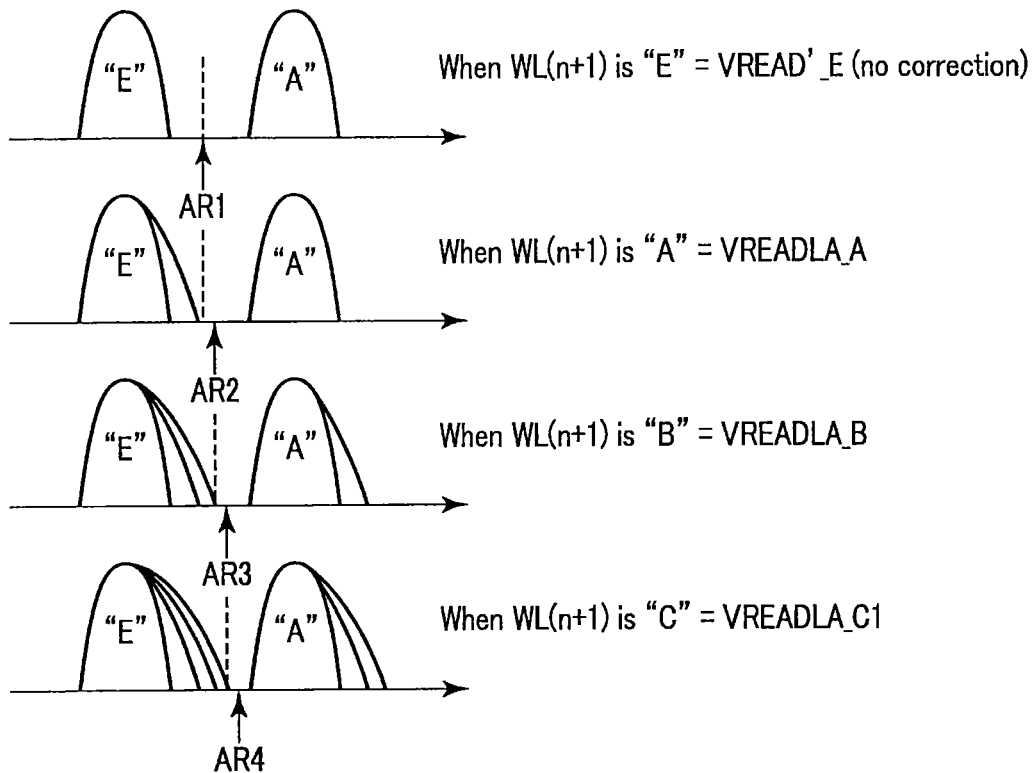
F I G. 58
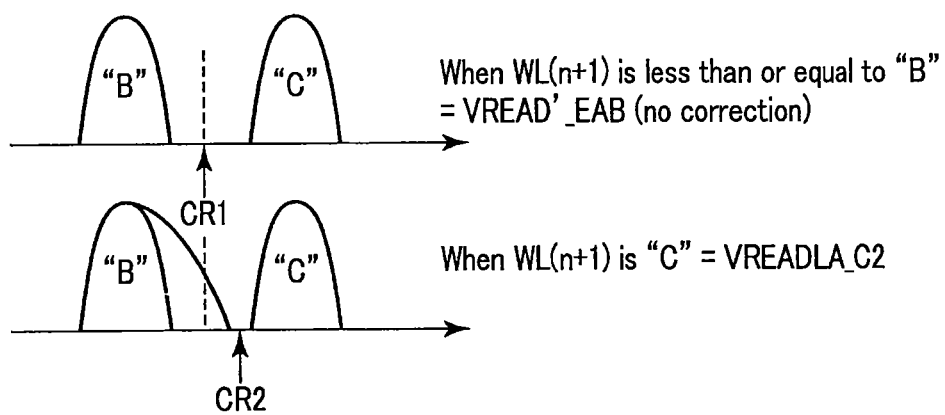
F I G. 59

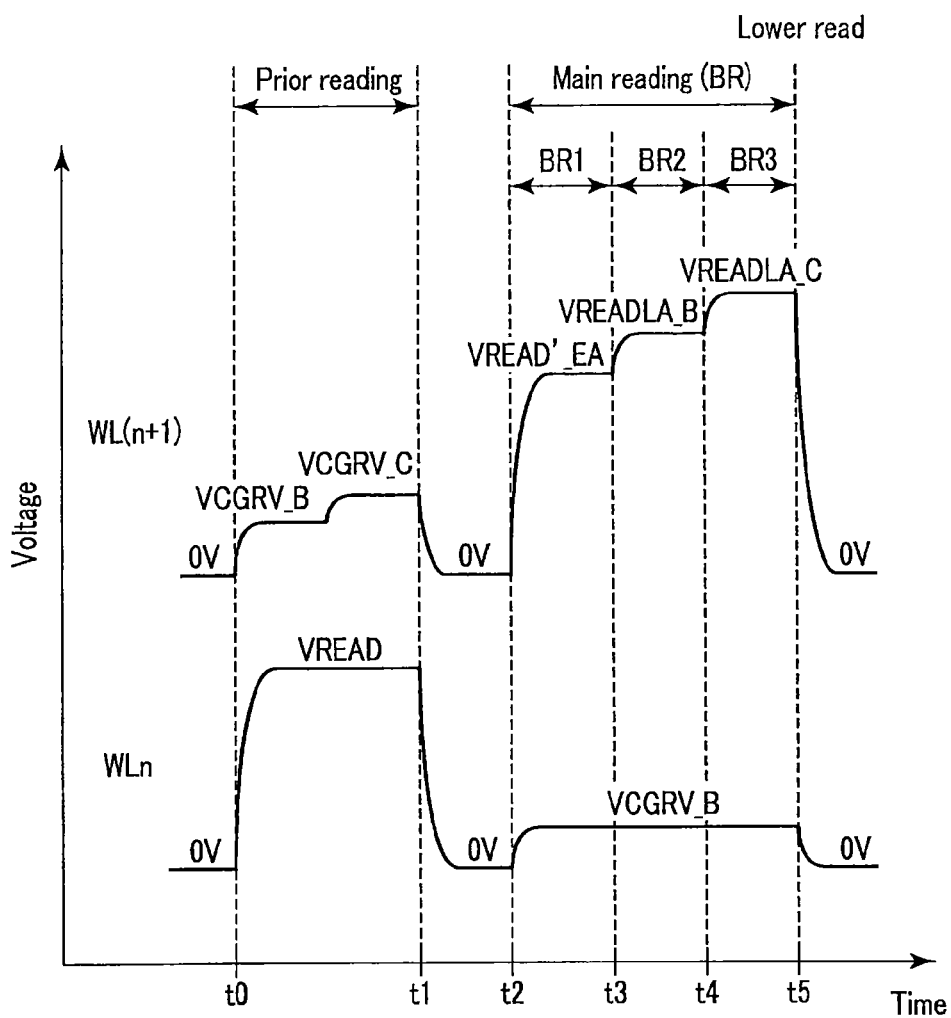
F I G. 63
| | VREAD'_E | VREADLA_A | VREADLA_B | VREADLA_C |
|---|---|---|---|---|
| WL0 | ΔVE0 | ΔVA0 | ΔVB0 | ΔVC0 |
| WL1 | ΔVE1 | ΔVA1 | ΔVB1 | ΔVC1 |
| WL2 | ΔVE2 | ΔVA2 | ΔVB2 | ΔVC2 |
| WL3 | ΔVE3 | ΔVA3 | ΔVB3 | ΔVC3 |
| ⋮ | ⋮ | ⋮ | ⋮ | ⋮ |
F I G. 64

SEMICONDUCTOR MEMORY DEVICE

CROSS-REFERENCE TO RELATED APPLICATIONS

This application is based upon and claims the benefit of priority from Japanese Patent Application No. 2014-188192, filed Sep. 16, 2014, the entire contents of which are incorporated herein by reference.

FIELD

Embodiments described herein relate generally to a semiconductor memory device.

BACKGROUND

A NAND flash memory in which memory cells are three-dimensionally arrayed has been known.

BRIEF DESCRIPTION OF THE DRAWINGS

FIG. 1 is a block diagram of a semiconductor memory device according to a first embodiment;

FIG. 2 and FIG. 3 are a circuit diagram and a sectional view of a memory cell array of the semiconductor memory device according to the first embodiment, respectively;

FIG. 7 is a circuit diagram of the NAND string of the semiconductor memory device according to the first embodiment and shows voltages applied to the respective interconnects during data reading;

FIG. 8 is a timing chart showing the changes of word line voltages during data reading of the semiconductor memory device according to the first embodiment;

FIG. 10 is a timing chart showing the changes of the word line voltages during data reading of the semiconductor memory device according to the first embodiment;

FIG. 11 is a schematic diagram showing page data and data fixed in a latch circuit in a sense amplifier during lower bit reading of the semiconductor memory device according to the first embodiment;

FIG. 12 to FIG. 16 are schematic diagrams showing models of charge distributions during writing, respectively;

FIG. 18 is a timing chart showing the changes of the word line voltages during data reading of the semiconductor memory device according to the second embodiment;

FIG. 24 is a circuit diagram of a NAND string of the semiconductor memory device according to a third embodiment and shows voltages applied to the respective interconnects during a data-verification;

FIG. 25 is a timing chart showing the changes of the word line voltages during data writing of the semiconductor memory device according to the third embodiment;

FIG. 26 is a timing chart showing the changes of the word line voltages during data reading of the semiconductor memory device according to the third embodiment;

FIG. 27 is a schematic diagram showing the variation of the threshold distribution of the memory cells of the semiconductor memory device according to the third embodiment;

FIG. 28 is a schematic diagram showing the state of a charge in a partial area of the NAND string of the semiconductor memory device according to the third embodiment;

FIG. 29 is a timing chart showing the changes of the word line voltages during data writing of the semiconductor memory device according to the third embodiment;

FIG. 30 is a timing chart showing the changes of the word line voltages during a program-verification of the semiconductor memory device according to the third embodiment;

FIG. 38 and FIG. 39 are sectional views of the NAND string, respectively;

FIG. 40 to FIG. 44 are graphs showing layer dependence of the voltages VREADLA of the semiconductor memory device according to modifications of the fifth embodiment, respectively;

FIG. 45A and FIG. 45B are timing charts showing the changes of the word line voltages during data reading of the semiconductor memory device according to a sixth embodiment;

FIG. 47 is a schematic diagram showing the variation of the threshold distribution of the memory cells;

FIG. 48 is a timing chart showing the changes of the word line voltages during data reading of the semiconductor memory device according to a modification of the sixth embodiment;

FIG. 50 is a block diagram of a semiconductor memory device according to a seventh embodiment;

FIG. 51 and FIG. 52 are a circuit diagram and a sectional view of the memory cell array of the semiconductor memory device according to the seventh embodiment, respectively;

FIG. 53 is a plan view of the semiconductor memory device according to the seventh embodiment;

FIG. 54A and FIG. 54B are plan views showing details of an area A1 in FIG. 53;

FIG. 57 is an equivalent circuit diagram of a bit line and a sense amplifier of the semiconductor memory device according to the seventh embodiment;

FIG. 58 to FIG. 60 are conceptual diagrams of corrective reading of the semiconductor memory device according to the first embodiment, respectively;

FIG. 63 is a timing chart showing the changes of the word line voltages during data reading of the semiconductor memory device according to a modification of the first embodiment;

FIG. 64 is a conceptual diagram of a correction table of the semiconductor memory device according to a modification of the fifth embodiment;

DETAILED DESCRIPTION

Figure 3:
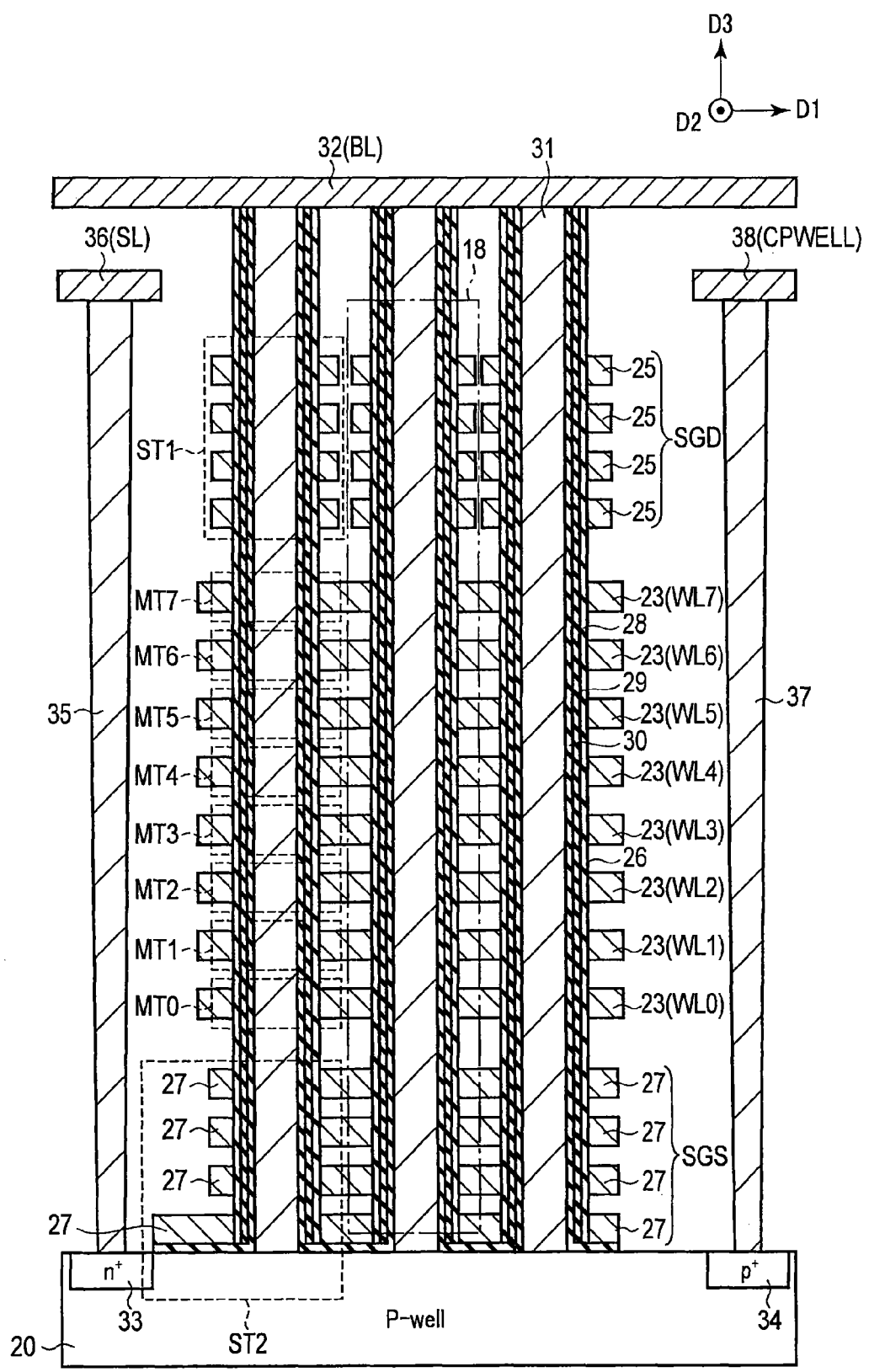

In general, according to one embodiment, a semiconductor memory device includes: a first memory cell; a second memory cell adjacent to the first memory cell; a first word line coupled to the first memory cell; and a second word line coupled to the second memory cell. When data is read from the first memory cell, a first voltage and a second voltage different from the first voltage are applied to the first word line. A voltage applied to the second word line changes a first number of times while the first voltage is applied to the first word line. The voltage applied to the second word line changes a second number of times different from the first number of times while the second voltage is applied to the first word line.

1. First Embodiment

A semiconductor memory device according to a first embodiment is described. A three-dimensionally stacked NAND flash memory in which memory cells are stacked above a semiconductor substrate is described below by way of example as the semiconductor memory device.

1.1 Regarding Configuration of NAND Flash Memory

First, the configuration of the NAND flash memory is described.

1.1.1 Regarding Overall Configuration of NAND Flash Memory

FIG. 1 is a block diagram of the NAND flash memory according to the present embodiment. As shown, a NAND flash memory 10 includes a memory cell array 11, a row decoder 12, a sense amplifier 13, a source line driver 14, a well driver 15, a sequencer 16, and a register 17.

The memory cell array 11 includes blocks BLK (BLK0, BLK1, BLK2, . . . ) each of which is a set of nonvolatile memory cells associated with word lines and bit lines. The block BLK serves as an erase unit, and data in the same block BLK are collectively erased. Each of the blocks BLK includes sets (these are referred to as fingers FNG (FNG0, FNG1, FNG2, . . . )) of NAND strings 18 in which the memory cells are connected in series. The number of blocks in the memory cell array 11 and the number of fingers in one block BLK are arbitrary. The data erasing operation may be executed in units of a region smaller than the block BLK. The data erasing operation is described in U.S. patent application Ser. No. 13/235,389, filed Sep. 18, 2011, entitled "NONVOLATILE SEMICONDUCTOR MEMORY DEVICE", U.S. patent application Ser. No. 12/694,690, filed Jan. 27, 2010, entitled "NONVOLATILE SEMICONDUCTOR STORAGE DEVICE", and U.S. patent application Ser. No. 13/483,610, filed May 30, 2012, entitled "NONVOLATILE SEMICONDUCTOR MEMORY DEVICE AND DATA ERASE METHOD THEREOF", the entire contents of which are hereby expressly incorporated by reference herein.

The row decoder 12 decodes a block address and a page address to select one of the word lines in the corresponding block. The row decoder 12 then applies necessary voltages to the selected word line and unselected word lines.

During data reading, the sense amplifier 13 senses data read from the memory cells to the bit line. During data writing, the sense amplifier 13 transfers write data to the memory cells. Data is read and written in the memory cell array 11 in units of a page.

The source line driver 14 applies a voltage to a source line.

The well driver 15 applies a voltage to a well region in which the NAND strings 18 are formed.

The register 17 holds various signals. For example, the register 17 holds the status of a data write or erase operation, and thereby informs a controller of whether the operation has been normally completed. Alternatively, the register 17 can hold a command or an address received from a controller 200, and also hold various tables.

The sequencer 16 controls the overall operation of the NAND flash memory 10.

1.1.2 Regarding Memory Cell Array 11

Now, details of the configuration of the memory cell array 11 are described. FIG. 2 is a circuit diagram of one block BLK. The other blocks BLK are similar in configuration.

As shown, the block BLK includes, for example, four fingers FNG (FNG0 to FNG3). Each of the fingers FNG includes the NAND strings 18.

Each of the NAND strings 18 includes, for example, 8 memory cell transistors MT (MT0 to MT7), and selection transistors ST (ST1 and ST2). A dummy transistor may be provided between the memory cell transistor MT and the selection transistor ST, and such an example will be described later in a fifth embodiment.

The memory cell transistor MT includes a control gate and a charge storage layer, and holds data in a nonvolatile manner. The number of the memory cell transistors MT is not limited to 8, and may be, for example, 16, 32, 64, and 128. The number is not limited. The memory cell transistors MT are arranged so that their current paths are connected in series between the selection transistors ST1 and ST2. The current path of the memory cell transistor MT7 at one end of the serial connection is connected to one end of the current path of the selection transistor ST1, and the current path of the memory cell transistor MT0 at the other end is connected to one end of the current path of the selection transistor ST2.

The gates of the selection transistors ST1 of the fingers FNG0 to FNG3 are connected to selection gate lines SGD0 to SGD3, respectively. On the other hand, the gates of the selection transistors ST2 are connected in common to the same selection gate line SGS among the fingers. The control gates of the memory cell transistors MT0 to MT7 in the same block are connected in common to word lines WL0 to WL7, respectively.

That is to say, while the word lines WL0 to WL7 and the selection gate line SGS are connected in common among the fingers FNG0 to FNG3 in the same block BLK, the selection gate lines SGD are independent for the fingers FNG0 to FNG3 even in the same block.

The other ends of the current paths of the selection transistors ST1 of the NAND strings 18 in the same row among the NAND strings 18 arranged in matrix in the memory cell array 11 are connected in common to one of bit lines BL (BL0 to BL(L−1), (L−1) is a natural number equal to or more than 1). That is to say, the bit line BL connects the NAND strings 18 in common among the blocks BLK. The other ends of the current paths of the selection transistors ST2 are connected in common to a source line SL. For example, the source line SL connects the NAND strings 18 in common among the blocks.

Data is collectively read and written in the memory cell transistors MT connected in common to one of the word lines WL in one of the fingers FNG in one of the blocks. This unit is called the "page".

FIG. 3 is a sectional view of a partial area of the memory cell array 11 according to the present embodiment. As shown, the NAND strings 18 are provided on a p-type well region 20. That is to say, interconnect layers 27 which function as the selection gate lines SGS, interconnect layers 23 which function as the word lines WL, and interconnect layers 25 which function as the selection gate lines SGD are provided above the p-type well region 20.

A memory hole 26 which reaches the well region 20 through the interconnect layers 25, 23, and 27 is made. A block insulating film 28, a charge storage layer 29 (insulating film), and a gate insulating film 30 are sequentially provided on the side surface of the memory hole 26, and the memory hole 26 is further filled with an electrically conductive film 31. The conductive film 31 functions as the current path of the NAND string 18, and is an area where a channel is formed during the operations of the memory cell transistors MT and the selection transistors ST.

The multiple (four in this example) interconnect layers 27 provided in each of the NAND strings 18 are electrically connected in common, and are connected to the same selection gate line SGS. That is to say, the four interconnect layers 27 substantially function as a gate electrode of one selection transistor ST2. The same also applies to the selection transistor ST1 (four selection gate lines SGD).

According to the configuration described above, the selection transistor ST2, the memory cell transistors MT, and the selection transistor ST1 are sequentially stacked in each of the NAND strings 18.

In the example shown in FIG. 3, the selection transistor ST includes the charge storage layer 29 in the same manner as the memory cell transistor MT. However, the selection transistor ST does not substantially function as a memory cell to hold data, but functions as a switch. Therefore, a threshold at which the selection transistor ST is switched on/off may be controlled by the charging of the charge storage layer 29.

A interconnect layer 32 which functions as the bit line BL is provided at the upper end of the conductive film 31. The bit line BL is connected to the sense amplifier 13.

Furthermore, an $n^+$-type impurity diffusion layer 33 and a $p^+$-type impurity diffusion layer 34 are provided in the surface of the well region 20. A contact plug 35 is provided on the diffusion layer 33, and an interconnect layer 36 which functions as the source line SL is provided on the contact plug 35. A contact plug 37 is provided on the diffusion layer 34, and an interconnect layer 38 which functions as a well interconnect line CPWELL is provided on the contact plug 37. The interconnect layers 36 and 38 are higher than the selection gate line SGD, and are formed in a layer lower than the interconnect layer 32.

The configurations described above are arrayed in the depth direction of the drawing of FIG. 3, and the finger FNG is formed by a set of the NAND strings 18 arranged in the depth direction. The interconnect layers 27 functioning as the selection gate lines SGS included in the same block are connected in common to one another. That is to say, the gate insulating film 30 is also formed on the well region 20 between the adjacent NAND strings 18, and the semiconductor layer 27 and the gate insulating film 30 adjacent to the diffusion layer 33 are formed up to the vicinity of the diffusion layer 33.

Therefore, when the selection transistor ST2 is turned on, a channel formed in the selection transistor ST2 electrically connects the memory cell transistor MT0 to the diffusion layer 33. A potential can be provided to the conductive film 31 by applying a voltage to the well interconnect line CPWELL.

The configuration of the memory cell array 11 may be some other configuration. That is to say, the configuration of the memory cell array 11 is described in, for example, U.S. patent application Ser. No. 12/407,403, filed Mar. 19, 2009 "Three-dimensionally stacked nonvolatile semiconductor memory". The configuration is also described in, for example, U.S. patent application Ser. No. 12/406,524, filed Mar. 18, 2009 "Three-dimensionally stacked nonvolatile semiconductor memory", U.S. patent application Ser. No. 12/679,991, filed Mar. 25, 2010 "Nonvolatile semiconductor memory device and manufacturing method of the same", and U.S. patent application Ser. No. 12/532,030, filed Mar. 23, 2009 "Semiconductor memory and manufacturing method of the same". The entire contents of these patent applications are incorporated herein by reference.

1.1.3 Regarding Threshold Distribution of Memory Cell Transistor

Figure 4:
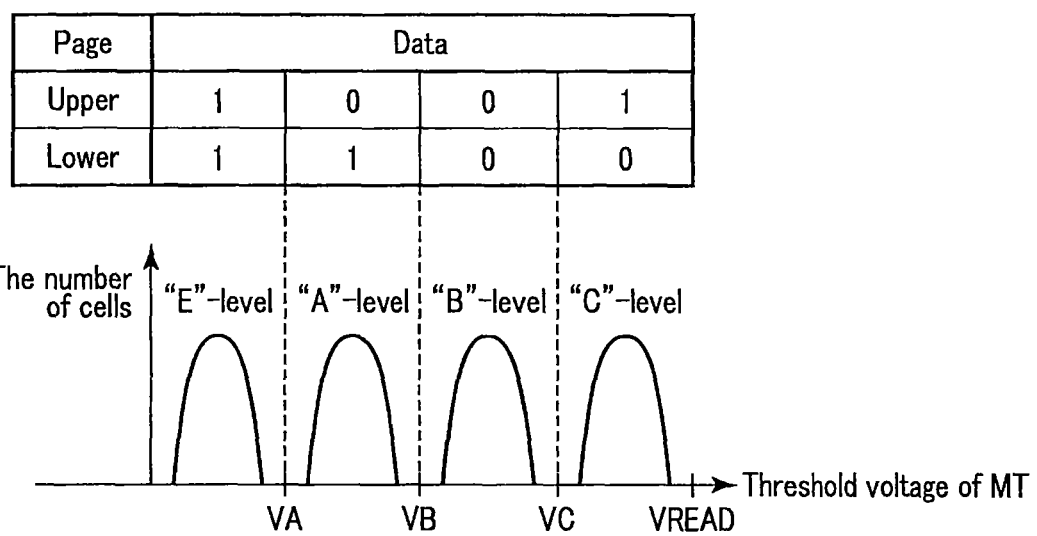
FIG. 4 is a graph showing a threshold distribution of memory cells of the semiconductor memory device according to the first embodiment.

FIG. 4 shows data and a threshold distribution that can be taken by the memory cell transistor MT according to the present embodiment.

As shown, each of the memory cell transistors MT can hold, for example, two-bit data depending on its threshold. The two-bit data are, for example, "11", "01", "00", and "10" in ascending order of threshold.

The threshold of the memory cell which holds the data "11" is at an "E"-level. The E-level is a threshold at which the charge storage layer is discharged and data is erased, and is a positive or negative value (e.g., less than a voltage VA).

The data "01", "00", and "10" corresponds to thresholds at which the charge storage layer is charged and data is written. The threshold of the memory cell which holds the data "01" is at an "A"-level, and is higher than the E-level (e.g., equal to or more than the voltage VA and less than a voltage VB, VA<VB). The threshold of the memory cell which holds the data "00" is at a "B"-level, and is higher than the A-level (e.g., equal to or more than the voltage VB and less than a voltage VC, VB<VC). The threshold of the memory cell which holds the data "10" is at a "C"-level, and is higher than the B-level (e.g., equal to or more than the voltage VC).

The relation between the two-bit data and the threshold is not limited to the above relations. For example, the data "11" may correspond to the "C"-level, and a suitable relation therebetween can be selected.

1.2 Regarding Data Write Operation

Figure 5:
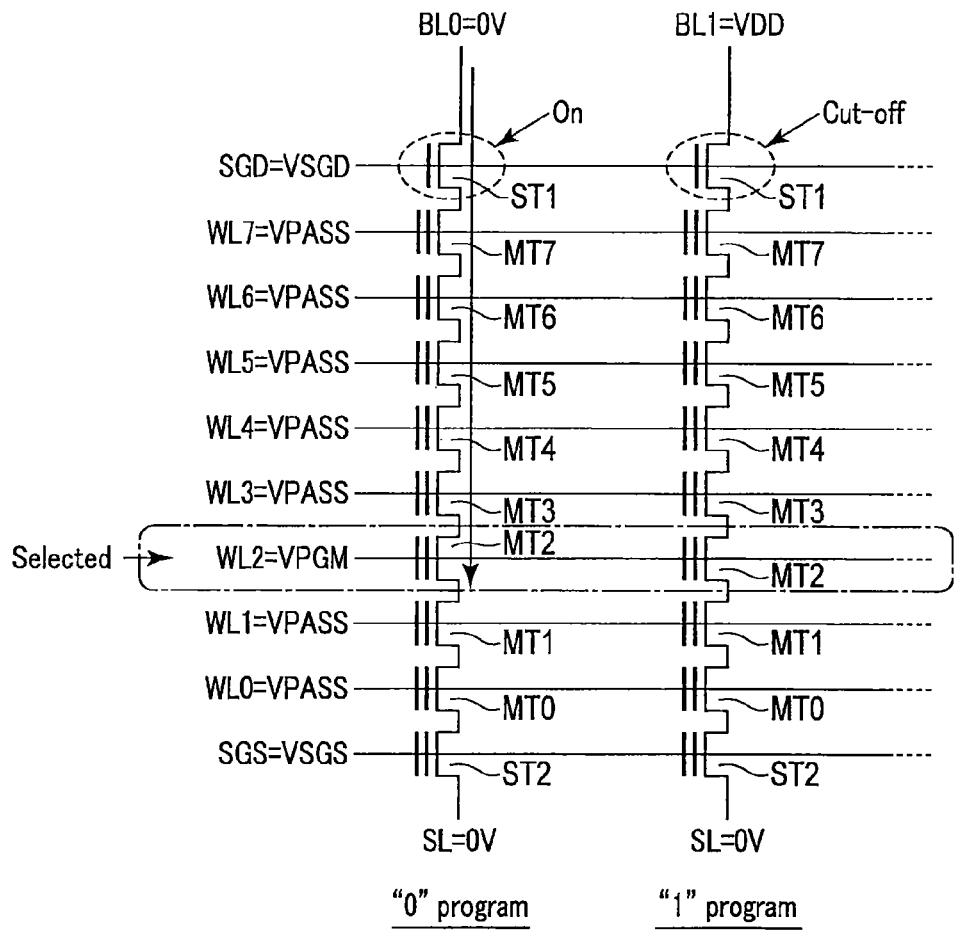
FIG. 5 is a circuit diagram of a NAND string of the semiconductor memory device according to the first embodiment and shows voltages applied to the respective interconnects during data program.

Now, a data write operation according to the present embodiment is briefly described. FIG. 5 is a circuit diagram of the NAND string 18 during data programming, and shows voltages applied to respective interconnects.

As shown, the sense amplifier 13 applies 0 V or a positive voltage VDD to the bit line BL in accordance with write data. That is to say, the sense amplifier 13 applies, for example, 0 V to the bit line BL when charging the charge storage layer to raise the threshold level from the "E"-level to the "A"-level or more (this is referred to as "0" programming). On the other hand, the sense amplifier 13 applies the positive voltage VDD to the bit line BL when maintaining the threshold level at the "E"-level (this is referred to as "1" programming).

Furthermore, the row decoder 12 selects, for example, the word line WL2, applies a positive high voltage VPGM (e.g., 20 V) to the selected word line WL2, and applies a positive voltage VPASS to the other unselected word lines WL0, WL1, and WL3 to WL7. The voltage VPGM is a high voltage for changing the charge storage layer by FN tunneling. The voltage VPASS is a voltage which turns on the memory cell transistor MT regardless of the held data and which prevents erroneous writing into unselected memory cell transistors as will be described later, and VPGM>VPASS.

The row decoder 12 applies a positive voltage VSGD to the selection gate line SGD of the selected finger FNG, and applies VSGS (e.g., 0 to 0.3 V) to the selection gate line SGS.

As a result, the memory cell transistors MT0 to MT7 are turned on. The selection transistor ST1 corresponding to the bit line to which 0V is applied is turned on, and the selection transistor ST1 corresponding to the bit line to which VDD is applied is cut off. The selection transistor ST2 is turned off.

Therefore, in the NAND string 18 in which the selection transistor ST1 is turned on, 0 V is transferred to the channel of the memory cell transistor MT2 connected to the selected word line WL2. Thus, the charge storage layer is charged by FN tunneling, and the threshold of the memory cell transistor MT2 is raised. On the other hand, in the NAND string in which the selection transistor ST1 is cut off, the channel of the memory cell transistor MT is electrically floating, and is capacitive-coupled with the word line WL so that its potential rises to a voltage close to VPASS. As a result, in the memory cell transistor MT2, a potential difference between the control gate and the channel is reduced, the charge storage layer is not charged, and the threshold level of the memory cell transistor MT2 is maintained (or the amount of the charging of the charge storage layer can be reduced to a significantly small amount, so that the variation of the threshold level is reduced, and substantially no data is written).

Figure 6:
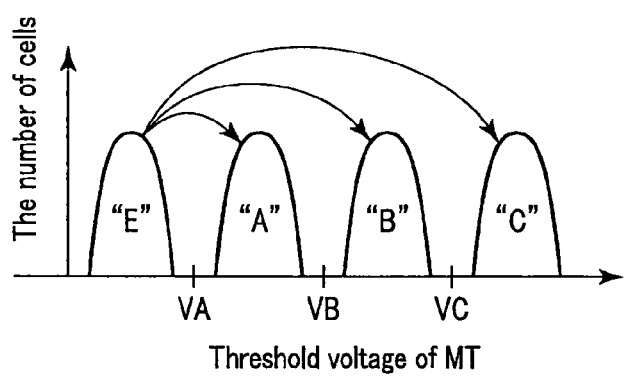
FIG. 6 is a graph showing threshold distributions of the memory cells of the semiconductor memory device according to the first embodiment.

FIG. 6 shows the variation of a threshold voltage during data writing according to the present embodiment. The data writing is a combination of a program operation which uses the voltage VPGM to vary the threshold and a verification operation which checks whether the threshold has risen to a desired level accordingly.

In this example, verification levels used to write the "A"-level, the "B"-level, and the "C"-level are consistently VA, VB, and VC, respectively. That is to say, a technique such as two-stage writing used in a NAND flash memory that uses an electric conductor as a charge storage layer is not used.

In the two-stage writing, initially, in the first writing, the threshold of the memory cell transistor MT to be written to the "E" and "A"-levels is maintained at the "E"-level, and the threshold of the memory cell transistor MT to be written to the "B"-and "C"-levels is written to, for example, an "LM"-level which is an intermediate level between VA and VC. A voltage VLM between VA and VB is used as the verification level. In the second writing, writing from the "LM"-level to the "B"-level and the "C"-level is then performed.

In this example, this "LM"-level is not used, and if a desired threshold level is the "C"-level, VC is used as the verification level from the beginning to perform writing. The same also applies to the "A"-level and the "B"-level.

1.3 Regarding Data Read Operation

Now, a read operation according to the present embodiment is described.

1.3.1 Regarding Flow of Read Operation

A rough flow of the read operation is described with reference to FIG. 7.

FIG. 7 is a circuit diagram of the NAND string 18 during the read operation, and shows the voltages of the respective interconnects. FIG. 7 also illustrates how data is read from the memory cell transistor MT2 connected to the word line WL2.

As shown, the read operation roughly includes "prior-reading" and "main-reading". The prior-reading is an operation to read data from the memory cell transistor MT connected to the word line WL3 which neighbors, on the drains side, the word line WL2 to originally read data from. The main-reading is an operation to read data from the word line WL2 originally targeted for reading. In the main-reading, a voltage VREADLA which is different from voltages applied to the other unselected word lines WL is applied to the unselected word line WL3 targeted for the prior-reading.

During the prior-reading, the sense amplifier 13 supplies a current to the bit line BL, and precharges the bit line BL with, for example, a voltage VBL. The row decoder 12 applies a positive voltage VCGRV to the selected word line WL3, and applies a positive voltage VREAD to the other unselected word lines WL0 and WL2, and WL4 to WL7. The voltage VCGRV changes with data to be read, and is, for example, one of the voltages VA, VB, and VC described with reference to FIG. 4. The voltage VREAD is a voltage to switch on the memory cell transistor MT regardless of the held data, and VCGRV<VREAD.

The row decoder 12 applies a positive voltage VSG to the selection gate lines SGD and SGS of the selected finger FNG.

As a result, the selection transistor ST and the memory cell transistors MT0 to MT2 and MT4 to MT7 are turned on, and the memory cell transistor MT3 is turned on if the threshold voltage of transistor MT3 is lower than VCGRV, otherwise the transistor MT 3 is turned off. In the prior-reading, VCGRV is sequentially raised, and data is read to the sense amplifier 13 from the memory cell transistor MT connected to the word line WL3.

The main-reading is different from the prior-reading in that the voltages VREADLA and VREAD' are applied to the unselected word line WL3 adjacent to the selected word line WL2. The voltage VREADLA is a voltage to turn on the memory cell transistor MT regardless of the held data in the same manner as the voltage VREAD. The voltage VREADLA is for compensating the influence of a threshold variation caused by a later-described inter-cell interference, and is different in value from VREAD. Depending on the degree of the inter-cell interference, it is possible that VREADLA>VREAD or VREADLA<VREAD. VREAD' is a voltage which is lower than the voltages VREADLA and VREAD and which turns on the memory cell transistor MT. However, VREAD' is not for compensating the threshold variation caused by the inter-cell interference.

In contrast to the voltage VREAD, the voltage VREADLA is stepped up for each level of the data held in the memory cell transistor MT3 during the read operation. Upon every step-up, data read from the corresponding memory cell transistor MT2 is strobed in the sense amplifier 13.

1.3.2 Regarding Details of Read Operation

Details of the above read operation are described. When each of the memory cell transistors MT can hold two or more bits of data, the above-mentioned main-reading is performed bit by bit. In the case described in this example, the memory cell transistor MT holds two-bit data as has been described with reference to FIG. 4. The main-reading for each of the bits (a lower bit and a upper bit) of the two-bit data is independently performed. In the upper bit reading, the bit (memory cell transistor MT) holding the "E"-level and the bit holding the "C"-level are specified. In the lower bit reading, it is specified whether each bit is less than or equal to the "A"-level (i.e., holds either the "E"-level or the "A"-level) or is equal to or more than the "B"-level (i.e., holds either the "B"-level or the "C"-level).

<Regarding Upper Bit Reading>

Firstly, upper bit reading is described with reference to FIG. 8. FIG. 8 is a timing chart showing the potential changes of the word line WLn (n is a natural number equal to or more than 1) targeted for reading and the word line WL(n+1) adjacent thereto on the drain side during the upper bit reading in the prior-reading and the main-reading.

As shown, the sequencer 16 first performs the prior-reading (times t0 to t1). In the prior-reading, the row decoder 12 selects the word line WL(n+1) and then sequentially applies voltages VCGRV_A, VCGRV_B, and VCGRV_C to WL(n+1) (n is the number of the selected word line, and is one of 0 to 6 in this example). The voltages VCGRV_A, VCGRV_B, and VCGRV_C may be, for example, the voltages VA, VB, and VC shown in FIG. 4. The row decoder 12 applies the voltage VREAD to the word line WLn and the other unselected word lines WL. As a result, data in all the memory cell transistors MT connected to the word line WL(n+1) in the selected finger FNG are determined, and held in, for example, the sense amplifier 13 or the sequencer 16.

The sequencer 16 then performs the main-reading (upper bit reading). In the example shown in FIG. 8, reading to specify whether each bit has a threshold at the "E"-level or a threshold equal to or more than the "A"-level (i.e., each bit has a threshold at one of the "A"-level, the "B"-level, and the "C"-level) (this is referred to as a read operation AR) is performed.

In the read operation AR, the row decoder 12 applies the voltage VCGRV_A (e.g., VA) to the selected word line WLn. The row decoder 12 also sequentially applies voltages VREAD'_E, VREADLA_A, VREADLA_B, and VREADLA_C1 to the unselected word lines WL(n+1) (the respective periods are referred to as periods AR1, AR2, AR3, and AR4). For example, VREAD'_E<VREADLA_A<VREADLA_B<VREADLA_C1. The voltage VREAD is applied to the other unselected word lines WL. The voltage VREAD is not limited to this, and is, for example, a voltage higher than VREAD'_E and lower than VREADLA_A. It should be understood that VREAD may be lower than VREAD'_E.

The sense amplifier 13 then senses and strobes data in the period AR1 for a column (bit line) in which the result of the prior-reading is the "E"-level. To "strobe" data means an operation to determine whether read data is "0" or "1" in accordance with the current flowing through the bit line or the voltage of the bit line, and load the data into a latch circuit in the sense amplifier 13. For a column in which the result of the prior-reading is the "B"-level, the sense amplifier 13 senses and strobes data in the period AR2. Moreover, for a column in which the result of the prior-reading is the "B"-level, the sense amplifier 13 senses and strobes data in the period AR2. For a column in which the result of the prior-reading is the "C"-level, the sense amplifier 13 senses and strobes data in the period AR4.

The sequencer 16 then performs reading (read operation CR) to specify a bit having the "C"-level.

In the read operation CR, the row decoder 12 applies the voltage VCGRV_C (e.g., VC) to the selected word line WLn. The row decoder 12 also sequentially applies voltages VREAD'_EAB and VREADLA_C2 to the unselected word lines WL(n+1) (the respective periods are referred to as periods CR1 and CR2). For example, VREAD'_EAB<VREADLA_C2. At least, VREAD'_EAB<VREADLA_C1.

The sense amplifier 13 then senses and strobes data in the period CR1 for columns in which the results of the prior-reading are the "E"-level, the "A"-level, and the "B"-level. For a column in which the result of the prior-reading is the "C"-level, the sense amplifier 13 senses and strobes data in the period CR2.

Consequently, the bits having the thresholds of the "E"-level and the "C"-level are specified for the word line WL targeted for reading.

Figure 9:
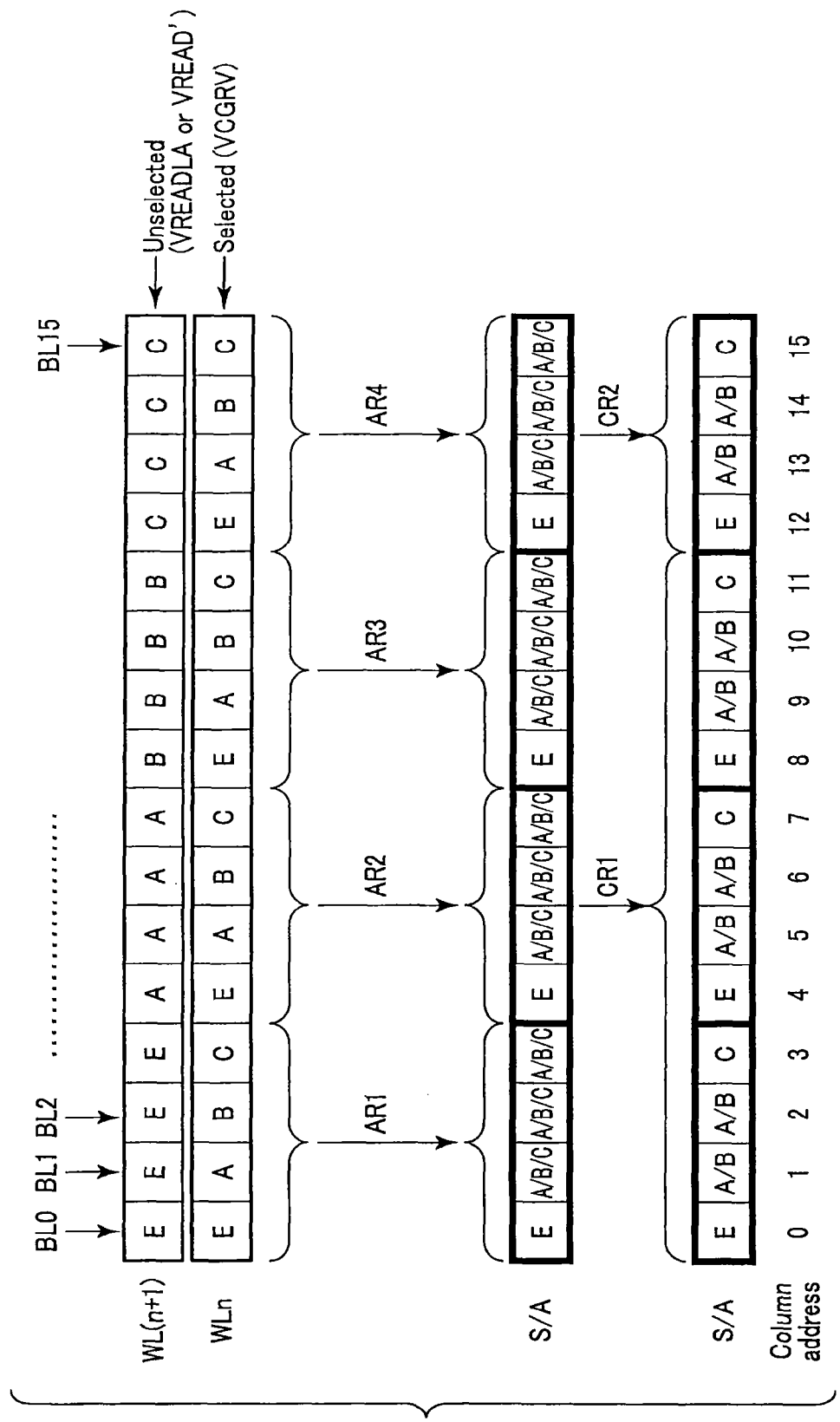
FIG. 9 is a schematic diagram showing page data and data fixed in a latch circuit in a sense amplifier during upper bit reading of the semiconductor memory device according to the first embodiment.

A specific example of the above operation is described with reference to FIG. 9. FIG. 9 is a schematic diagram showing page data corresponding to the word lines WLn and WL(n+1) and data determined by the latch circuit in the sense amplifier 13 during the upper bit reading. In the case assumed in FIG. 9, for simplification of explanation, one page corresponds to data held in 16 memory cell transistors. The memory cell transistors MT connected to the bit lines BL0 to BL15 or the data held in the memory cell transistors MT are referred to as a bit 0 to a bit 15, and column addresses corresponding to these bits are referred to as addresses 0 to 15. This page data is "EABCEABCEABCE-ABC".

As shown, as a result of the prior-reading, page data corresponding to the word line WL(n+1) is "EEEE-AAAABBBBCCCC".

The sequencer 16 then performs the main-reading. In this example, the bit holding the "E"-level is first specified before the main-reading (read operation AR).

In accordance with an instruction from the sequencer 16, the row decoder 12 applies VCGRV_A (e.g., VA) to the selected word line WLn, and applies VREAD'_E to WL(n+1) (period AR1). In this period AR1, the sense amplifier 13 senses and strobes the bit whose adjacent bit data (data in WL(n+1)) is at the "E"-level, that is to say, data read in the bit lines BL0 to BL3. In this example, a cell current flows through the bit line BL0 among the bit lines BL0 to BL3. Therefore, the bit 0="E" is determined, and this data is stored in the latch circuit of the sense amplifier 13. The bit in which the data is determined will not be targeted for reading from now on, and the bit line BL is fixed to a given potential such as 0 V. On the other hand, since no cell currents flow through the bit lines BL1 to BL3, the bits 1 to 3 are determined to be equal to or more than the "A"-level (i.e., it can also be said that data is undetermined). Of course, cell currents may flow through the bit lines BL4, BL8, and BL12 corresponding to the other bits 4, 8, and 12 holding the "E"-level (no currents flow if the threshold is raised by the inter-cell interference). However, the bits adjacent to the above bits are not at the "E"-level, and are therefore not sensed and strobed in the period AR1.

The row decoder 12 subsequently applies VCGRV_A to the selected word line WLn, and steps up the voltage applied to WL(n+1) to VCGRV_A (period AR2). In this period AR2, the sense amplifier 13 senses and strobes the bit whose adjacent bit data is at the "A", that is to say, data read in the bit lines BL4 to BL7. In this example, a cell current flows through the bit line BL4 among the bit lines BL4 to BL7. Therefore, the bit 4="E" is determined, and this data is stored in the latch circuit of the sense amplifier 13. As a result, the bit line BL4 will not be targeted for reading from now on. Since no cell currents flow through the bit lines BL5 to BL7, the bits 5 to 7 are determined to be equal to or more than the "A"-level. The cell currents can also flow through the bit lines BL8 to BL12, but are not sensed and strobed in AR2.

The row decoder 12 further applies VCGRV_A to the selected word line WLn, and steps up the voltage applied to WL(n+1) to VREADLA_B (period AR3). In this period AR3, the sense amplifier 13 senses and strobes the bit whose adjacent bit data is at the "B", that is to say, data read in the bit lines BL8 to BL11. In this example, a cell current flows through the bit line BL8 among the bit lines BL8 to BL11. Therefore, the bit 8="E" is determined, and this data is stored in the latch circuit of the sense amplifier 13. As a result, the bit line BL8 will not be targeted for reading from now on. Since no cell currents flow through the bit lines BL9 to BL11, the bits 9 to 11 are determined to be equal to or more than the "A"-level. The cell current can also flow through the bit line BL12, but is not sensed and strobed in AR3.

The row decoder 12 further applies VCGRV_A to the selected word line WLn, and steps up the voltage applied to WL(n+1) to VREADLA_C1 (period AR4). In this period AR4, the sense amplifier 13 senses and strobes the bit whose adjacent bit data is at the "C", that is to say, data read in the bit lines BL12 to BL15. In this example, a cell current flows through the bit line BL12 among the bit lines BL12 to BL15. Therefore, the bit 12="E" is determined, and this data is stored in the latch circuit of the sense amplifier 13. As a result, the bit line BL12 will not be targeted for reading from now on. Since no cell currents flow through the bit lines BL13 to BL15, the bits 13 to 15 are determined to be equal to or more than the "A"-level.

The sequencer 16 then specifies the bit holding the "C"-level (read operation CR). That is to say, in accordance with an instruction from the sequencer 16, the row decoder 12 applies VCGRV_C (e.g., VC) to the selected word line WLn, and applies VREAD'_EAB to WL(n+1) (period CR1). In this period CR1, the sense amplifier 13 senses and strobes the bits whose adjacent page data are at the "E", "A", and "B", and of which the data has not been determined, that is to say, data read in the bit lines BL1 to BL3, BL5 to BL7, BL9 to BL11, and BL13 to BL15. In this example, cell currents don't flow through the bit lines BL3, BL7, and BL11 among the BL1 to BL3, BL5 to BL7, BL9 to BL11, and BL13 to BL15. Therefore, the data of the bits 3, 7, and 11 is determined as "C", and this data is stored in the latch circuit of the sense amplifier 13. The potentials of these bit lines BL are fixed to given potentials. Of course, the cell current can also be prevented from flowing through the bit line BL15 corresponding to the bit 15 holding the "C"-level. However, the bit adjacent to the bit 15 is not at the "E"-level, and is therefore not sensed and strobed in the period CR1. The bits 1, 2, 5, 6, 9, and 10 other than the bits 0, 4, and 8 that have already been determined to be at the "E"-level are also determined to be at the "A"-level or the "B"-level.

The row decoder 12 subsequently applies VCGRV_C2 to the selected word line WLn, and steps up the voltage applied to WL(n+1) to VREADLA_C2 (period CR2). In this period CR2, the sense amplifier 13 senses and strobes the bit whose adjacent page data is at the "C", and of which the data has not been determined, that is to say, data read in the bit lines BL12 to BL15. In this example, a cell current flows through the bit lines BL12 to BL14 and a cell current is prevented from flowing through the bit line 15 among the bit lines BL12 to BL15. Therefore, the bit 15="C" is determined, and this data is stored in the latch circuit of the sense amplifier 13. The bits 13 and 14 other than the bit 12 that has already been determined to be at the "E"-level are also determined to be at the "A"-level or the "B"-level.

As a result of the upper bit reading described above, data of the bits 0, 3, 4, 7, 8, 11, 12, and 15 are determined. That is to say, all the bits having the "E"-level and the "C"-level are specified.

<Regarding Lower Bit Reading>

Next, lower bit reading is described with reference to FIG. 10. FIG. 10 is a timing chart showing the potential changes of the word lines WLn and WL(n+1) during the lower bit reading in the prior-reading and the main-reading.

As shown, the sequencer 16 first performs the prior-reading (times t0 to t1). This prior-reading is the same as the operation performed in the upper bit reading. When the upper bit and the lower bit are successively read in the same word line, the prior-reading in the lower bit reading may be omitted.

The sequencer 16 then performs the main-reading (lower bit reading). In the lower bit reading, whether the threshold of each bit is less than or equal to the "A"-level (i.e., has either the "E"-level or the "A"-level) or is equal to or more than the "B"-level (i.e., has either the "B"-level or the "C"-level) is judged (read operation BR).

That is, the row decoder 12 applies the voltage VCGRV_B (e.g., VB) to the selected word line WLn. The row decoder 12 also sequentially applies voltages VREAD'_EA, VREADLA_B, and VREADLA_C to the unselected word lines WL(n+1) (the respective periods are referred to as periods BR1, BR2, and BR3). For example, VREAD'_EA<VREADLA_B<VREADLA_C, and VREAD'_EA may be the same as VREAD, or may be lower than VREAD.

The sense amplifier 13 then senses and strobes data in the period BR1 for a column in which the result of the prior-reading is the "E"-level. For a column in which the result of the prior-reading is the "B"-level, the sense amplifier 13 senses and strobes data in the period BR2. Moreover, for a column in which the result of the prior-reading is the "C"-level, the sense amplifier 13 senses and strobes data in the period BR3.

Consequently, it is specified whether the threshold of each bit is less than or equal to the "A"-level or is equal to or more than the "B"-level.

A specific example of the above operation is described with reference to FIG. 11. FIG. 11 is a schematic diagram showing page data corresponding to the word lines WLn and WL(n+1) and data determined by the latch circuit in the sense amplifier 13 during the lower bit reading.

The sequencer first performs the prior-reading as described with reference to FIG. 9. As a result, page data corresponding to the word line WL(n+1) is "EEEE-AAAABBBBCCCC". The prior-reading can be omitted when the lower bit reading is successively performed after the bits at the "E"-level and the "C"-level are determined in FIG. 9.

The sequencer 16 then performs the main-reading to read the upper bit for the word line WLn. That is to say, in accordance with an instruction from the sequencer 16, the row decoder 12 applies VCGRV_B (e.g., VB) to the selected word line WLn, and applies VREAD'_EA to WL(n+1) (period BR1).

In this period BR1, the sense amplifier 13 senses and strobes the bits whose adjacent data are at the "E" and "A"-levels, that is to say, data read in the bit lines BL0 to BL7. In this example, cell currents flow through the bit lines BL0, BL1, BL4, and BL5 among the above bit lines. Therefore, the bits 0, 1, 4, and 5 are determined to be at the "E"-level or the "A"-level, and the determined data is stored in the latch circuit of the sense amplifier 13. On the other hand, no cell currents flow through the bit lines BL2, BL3, BL6, and BL7. Therefore, the bits 2, 3, 6, and 7 are determined to be at the "B"-level or the "C"-level, and the determined data is stored in the latch circuit.

The row decoder 12 subsequently applies VCGRV_B to the selected word line WLn, and steps up the voltage applied to WL(n+1) to VREADLA_B (period BR2). In this period BR2, the sense amplifier 13 senses and strobes the bit whose adjacent bit data is at the "B", that is, data read in the bit lines BL8 to BL11. In this example, cell currents flow through the bit lines BL8 and BL9. Therefore, the bits 8 and 9 are determined to be at the "E"-level or the "A"-level, and the bits 10 and 11 are determined to be at the "B"-level or the "C"-level, and the determined data is stored in the latch circuit of the sense amplifier 13.

The row decoder 12 further applies VCGRV_A to the selected word line WLn, and steps up the voltage applied to WL(n+1) to VREADLA_C (period BR3). In this period BR3, the sense amplifier 13 senses and strobes the bit whose adjacent bit data is at the "C", that is, data read in the bit lines BL12 to BL15. In this example, cell currents flow through the bit lines BL12 and BL13. Therefore, the bits 12 and 13 are determined to be at the "E"-level or the "A"-level, and the bits 14 and 15 are determined to be at the "B"-level or the "C"-level, and the determined data is stored in the latch circuit of the sense amplifier 13.

Consequently, as shown in the latch circuit in FIG. 11, whether the data of the bits 0 to 15 in the read target page are less than or equal to the "A"-level or are equal to or more than the "B"-level is determined.

1.4 Advantageous Effects According to the Present Embodiment

The semiconductor memory device according to the present embodiment can improve the reliability of the data read operation. These advantageous effects are described in detail below.

Figure 12:
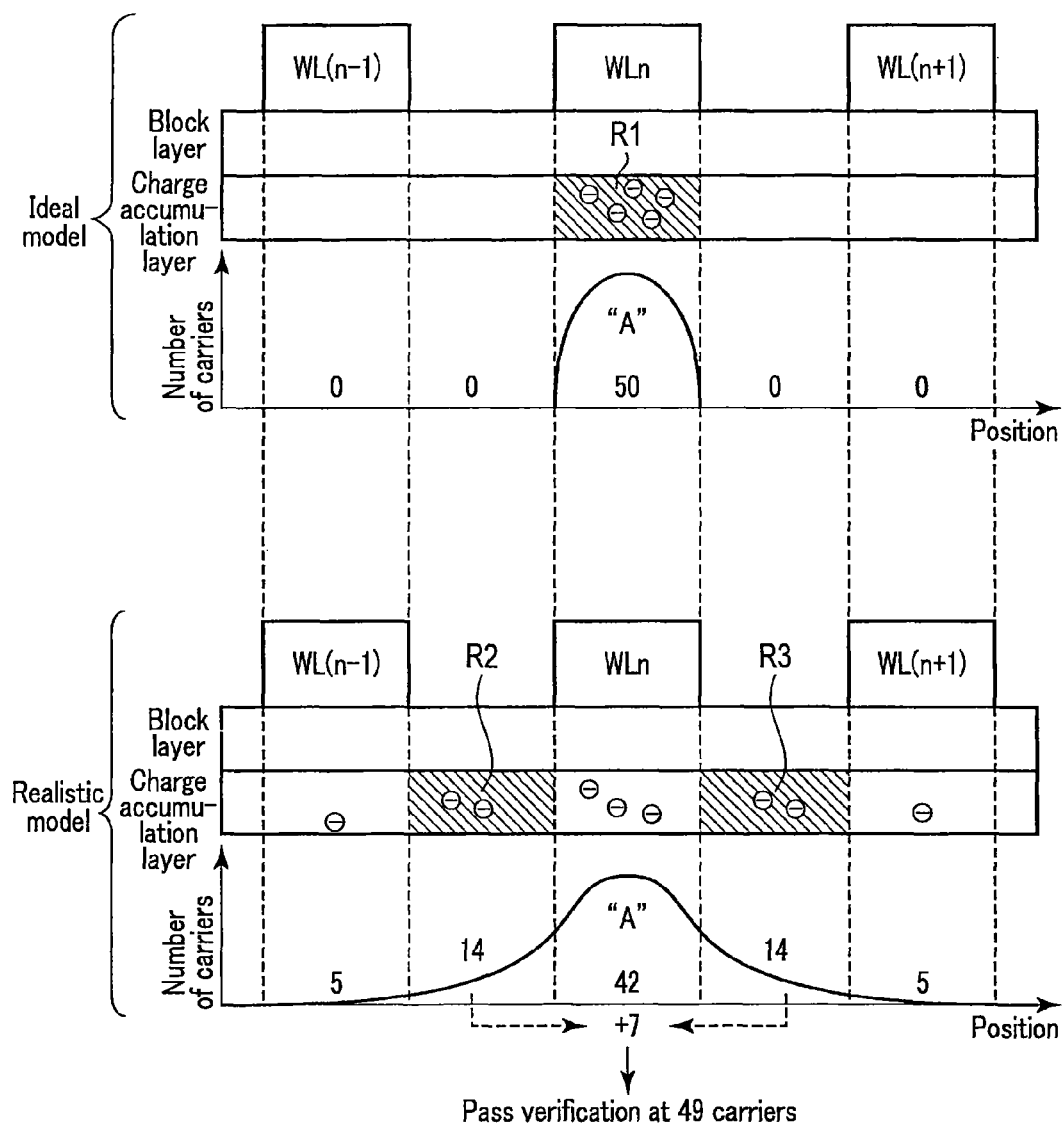
Figure 14:
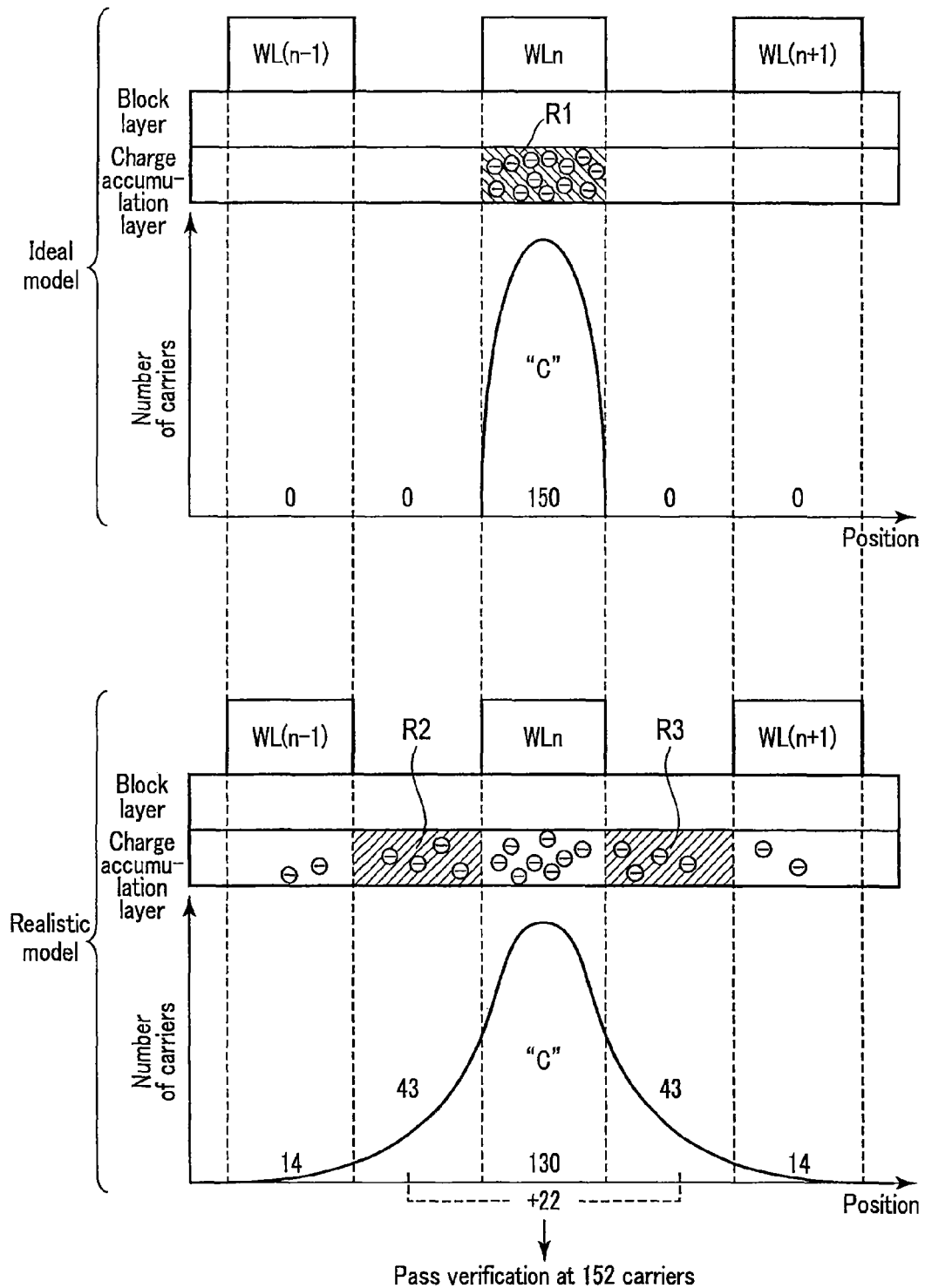

FIG. 12 to FIG. 14 show ideal models and realistic models of charge distributions in the writing of the "A"-level, the "B"-level, and the "C"-level into the word line WLn, respectively.

As shown in FIG. 12, if, for example, the threshold of the "A"-level is achieved by about 50 electrons, it is ideally desirable that all the electrons exist in an area R1 which overlaps the word line WLn. However, in a MONOS structure that uses insulating films as charge storage layers, the charge storage layers are connected to each other between the adjacent memory cell transistors MT. In other words, the charge storage layer is also provided between the neighboring word lines (areas R2 and R3). Therefore, as shown in the realistic model in FIG. 12, some of the electrons are also trapped in the areas R2 and R3.

Suppose that about one third of the electrons to enter the area R1 are trapped in the areas R2 and R3, and about one fourth of the electrons existing in the areas R2 and R3 contribute to a threshold variation. When the "A"-level is written, about 42 electrons, for example, exist in the area R1, and about 14 electrons exist in each of the areas R2 and R3. While the number of electrons in the area R1 is 42 which is less than 50, about seven of the electrons existing in the areas R2 and R3 contribute to the threshold variation. That is to say, this condition is equivalent to the condition in which 42+7=49 electrons exist in the area R1, so that this condition passes a program-verification.

The same also applies to the "B"-level and the "C"-level. FIG. 13 shows the case of the "B"-level. In the example of FIG. 13, the threshold of the "B"-level is achieved by, for example, about 100 electrons trapped in the area R1. Thus, in a realistic model, about 85 electrons exist in the area R1, and about 28 electrons exist in each of the areas R2 and R3. About 14 of the electrons existing in the areas R2 and R3 contribute to the threshold variation. That is, this condition is equivalent to the condition in which 85+14=99 electrons exist in the area R1, so that this condition passes a program-verification.

FIG. 14 shows the case of the "C"-level. In the example of FIG. 14, the threshold of the "C"-level is achieved by, for example, about 150 electrons trapped in the area R1. Thus, in the realistic model, about 130 electrons exist in the area R1, and about 43 electrons exist in each of the areas R2 and R3. About 22 of the electrons existing in the areas R2 and R3 contribute to the threshold variation. That is, this condition is equivalent to the condition in which 130+22=152 electrons exist in the area R1, so that this condition passes a program-verification.

Figure 15:
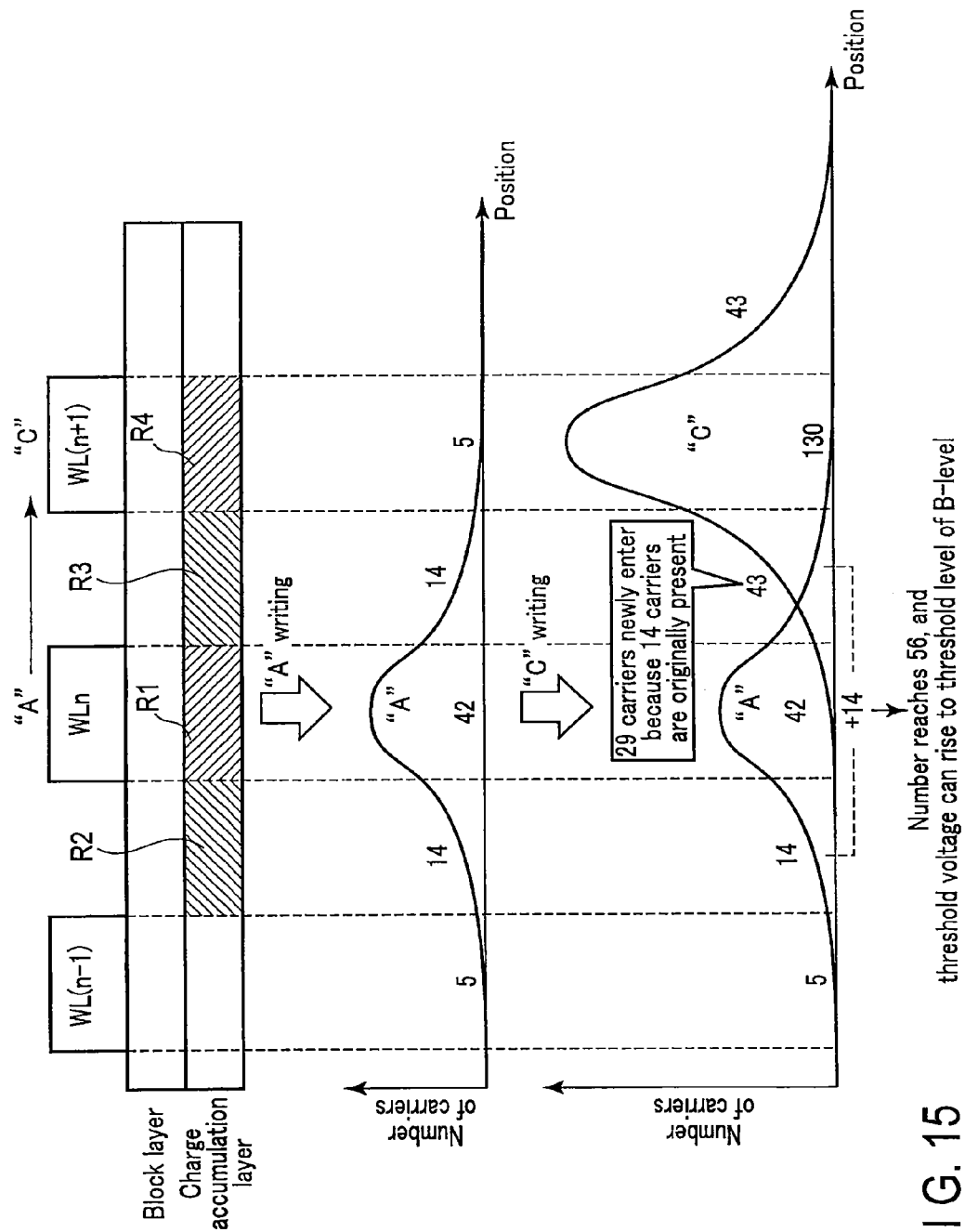
Figure 16:
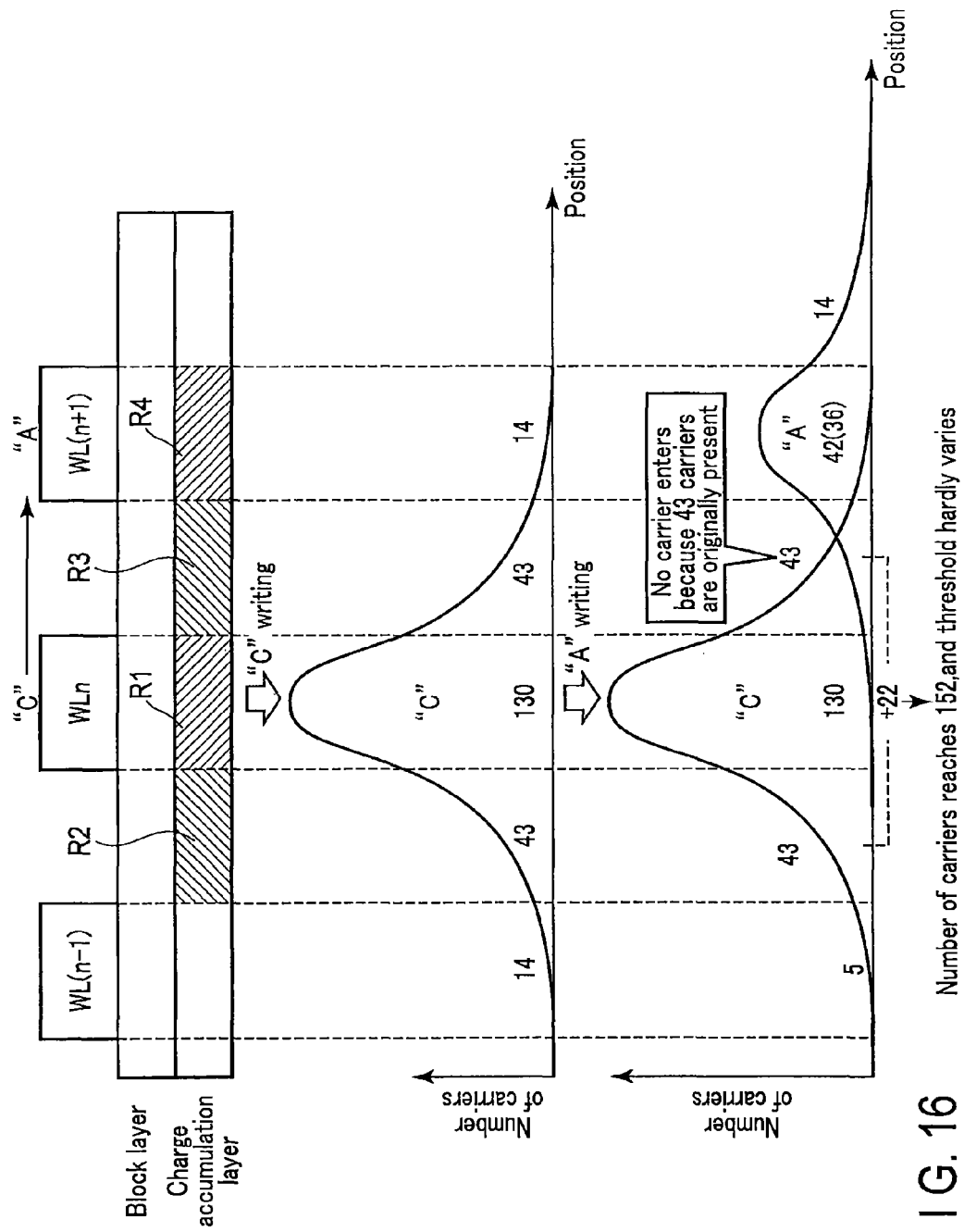

In accordance with the above models, the inter-cell interference between the word lines WLn and WL(n+1) is described with reference to FIG. 15 and FIG. 16. FIG. 15 shows a charge distribution in the case where the "A"-level is written into the word line WLn and then the "C"-level is written into the word line WL(n+1) in the realistic model. FIG. 16 shows a charge distribution in the case where the "C"-level is written into the word line WLn and then the "A"-level is written into the word line WL(n+1).

As shown in FIG. 15, when the "C"-level is written into the word line WL(n+1) after the "A"-level is written into the word line WLn, the number of electrons trapped in the area R3 is, for example, about 43. That is, about 14 electrons are trapped in the area R3 during the "A" writing, and about 29 electrons are newly trapped in the area R3 by the subsequent "C" writing.

As a result, the number of electrons which contribute to the threshold variation of the memory cell transistor MTn in the areas R2 and R3 is about 14. This is equivalent to the case where the number of electrons in the area R1 is 42+14=56. This number of electrons is greater by 100 or more than 50 which is the original number of electrons. As a result, the threshold of the memory cell transistor MTn can be higher than the "A"-level, and may reach the "B"-level.

On the other hand, no such phenomenon is considered to occur when the "A"-level is written into the word line WL(n+1) after the "C"-level is written into the word line WLn. This is because about 43 electrons are trapped in the area R3 at the time of the "C" writing as shown in FIG. 16. Therefore, no electrons are considered to enter the area R3 during the writing of "A" into the word line WL(n+1). Accordingly, the number of electrons which contribute to the "C"-level is about 152 which is substantially the same as the original number of electrons.

As apparent from the above, a certain memory cell transistor MT(n+1) affects the threshold of the memory cell transistor MT when the threshold of the memory cell transistor MT(n+1) is higher than the threshold of the memory cell transistor MTn.

Figure 17:
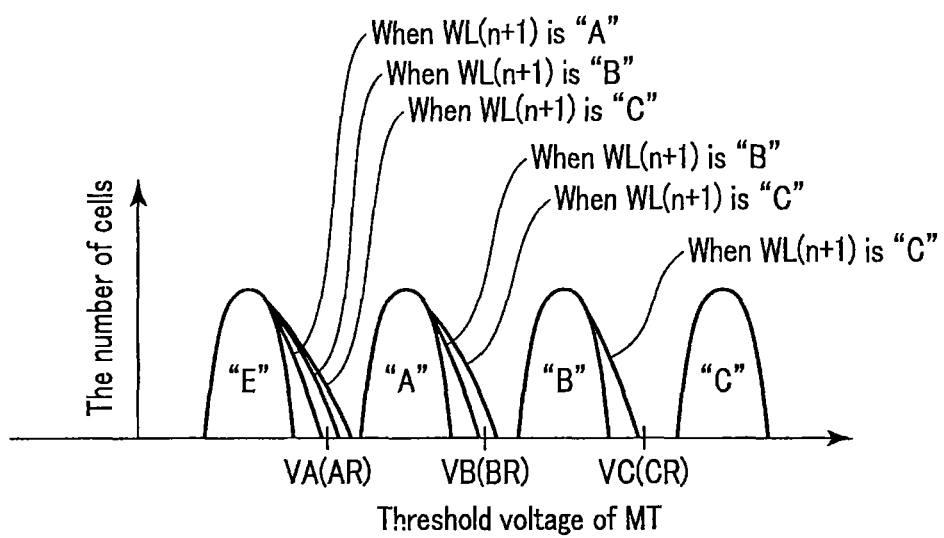
FIG. 17 is a graph showing threshold distributions of the memory cells.

FIG. 17 shows how the threshold distributions of the "E" to "C"-levels vary according to the above-mentioned inter-cell interference. As shown, when the memory cell transistor MTn has the "C"-level, there is no influence from the memory cell transistor MT(n+1) adjacent thereto on the drain side.

On the other hand, the threshold of the "B"-level rises when the memory cell transistor MT(n+1) has the "C"-level. The threshold of the "A"-level rises when the memory cell transistor MT(n+1) has the "B"-level or the "C"-level. Moreover, the threshold of the "E"-level rises when the memory cell transistor MT(n+1) has the "A"-level, the "B"-level, or the "C"-level.

On the assumption that the threshold voltage has risen due to the above inter-cell interference, the voltage VREADLA which is higher (lower in some cases) than VREAD is applied to the word line WL(n+1) adjacent on the drain side in the present embodiment (corrective reading). The voltage difference between VREAD and VREADLA can offset the influence of the threshold variation, and can prevent erroneous reading.

As has been described with reference to FIG. 15 and FIG. 16, the threshold variation can occur when the bit adjacent on the drain side has a threshold level higher than that of the bit targeted for reading. Therefore, the corrective reading is performed in this case, and no correction is made in other cases (i.e., the voltage VREAD' is applied to the word line WL(n+1)).

Thus, according to the present embodiment, it is possible to precisely estimate the degree of the threshold variation attributed to the inter-cell interference, and improve the reliability of data reading.

2. Second Embodiment

Now, a semiconductor memory device according to a second embodiment is described. The present embodiment is based on the assumption that the inter-cell interference also occurs when the threshold levels of the adjacent cells are the same in the first embodiment described above. The differences between the present embodiment and the first embodiment are only described below.

2.1 Regarding Details of Read Operation

The read operation according to the present embodiment is described below separately for the upper bit reading and the lower bit reading as in the first embodiment.

<Regarding Upper Bit Reading>

FIG. 18 is a timing chart showing the potential changes of the word lines WLn and WL(n+1) during the prior-reading and the upper bit reading according to the present embodiment.

As shown, the present embodiment is different from FIG. 8 described in the first embodiment in that the voltage applied to the word line WL(n+1) is stepped up in the order of VREAD'_EA, VREADLA_B2, and VREADLA_C2 in the read operation CR in the main-reading. The voltage VREADLA_B in the read operation AR in this example is referred to as a voltage VREADLA_B1 so that this voltage is distinguished from the voltage during the read operation CR. This voltage is different in value from the voltage VREAD. VREADLA_B1 and VREADLA_B2, and VREADLA_C1 and VREADLA_C2 may have the same value or different values.

Figure 19:
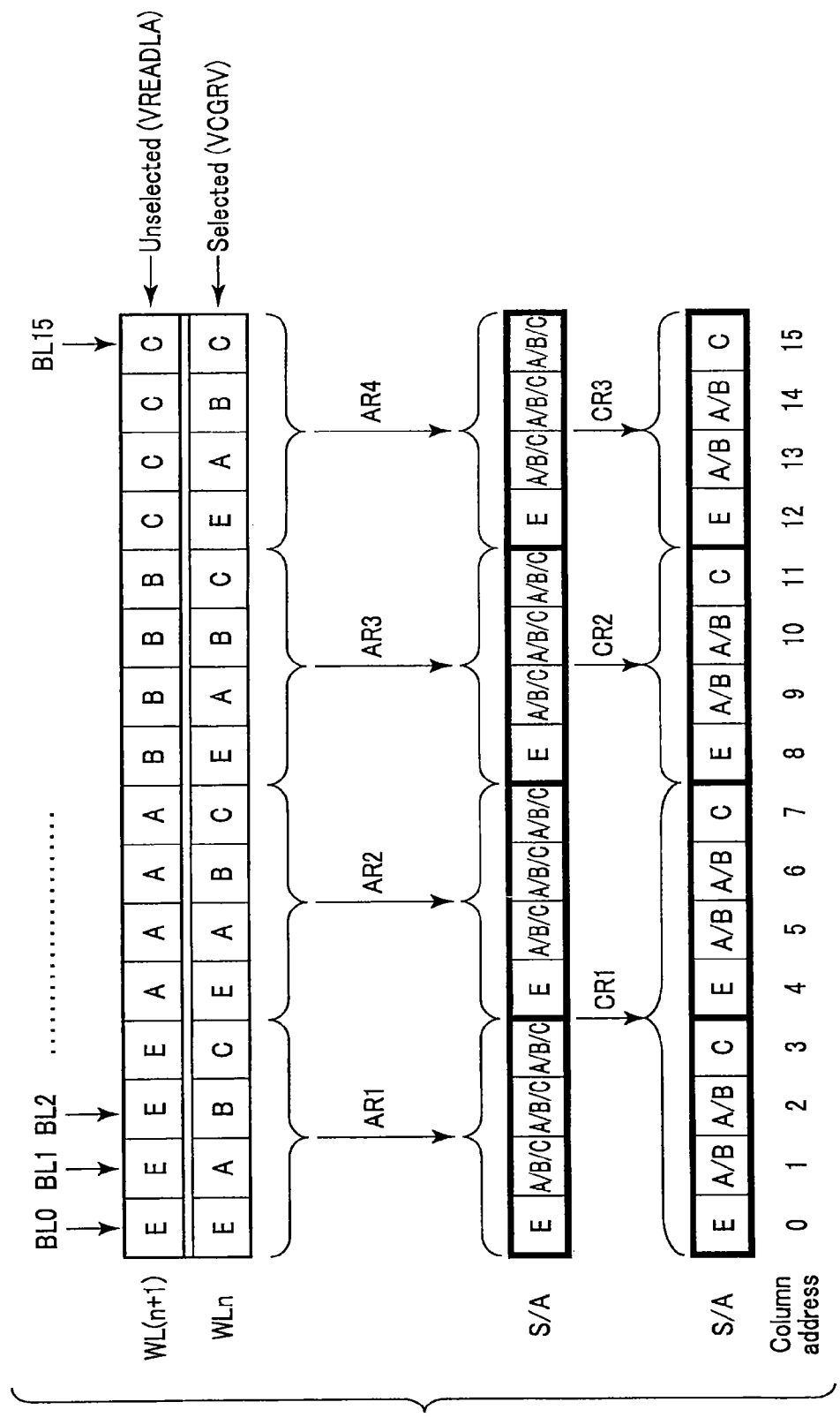
FIG. 19 is a schematic diagram showing page data and data fixed in a latch circuit in a sense amplifier during upper bit reading of the semiconductor memory device according to the second embodiment.

A specific example of the above operation is described with reference to FIG. 19. FIG. 19 corresponds to FIG. 9 described in the first embodiment.

As shown, in the period AR1, it is determined that the bit 0 is at the "E"-level, and the bits 1 to 3 are equal to or more than the "A"-level. In the period AR2, it is determined that the bit 4 is at the "E"-level, and the bits 5 to 7 are equal to or more than the "A"-level. Moreover, in the period AR3, it is determined that the bit 8 is at the "E"-level, and the bits 9 to 11 are equal to or more than the "A"-level. In the period AR4, it is determined that the bit 12 is at the "E"-level, and the bits 13 to 15 are equal to or more than the "A"-level.

In the period CR1, it is determined that the bits 3 and 7 are at the "C"-level, and the bits 1, 2, 5 and 6 are at the "A"-level or the "B"-level. Moreover, in the period CR2, it is determined that the bit 11 is at the "C"-level, and the bits 9 and 10 are at the "A"-level or the "B"-level. In the period CR3, it is determined that the bit 15 is at the "C"-level, and the bits 13 and 14 are at the "A"-level or the "B"-level.

<Regarding Lower Bit Reading>

Figure 20:
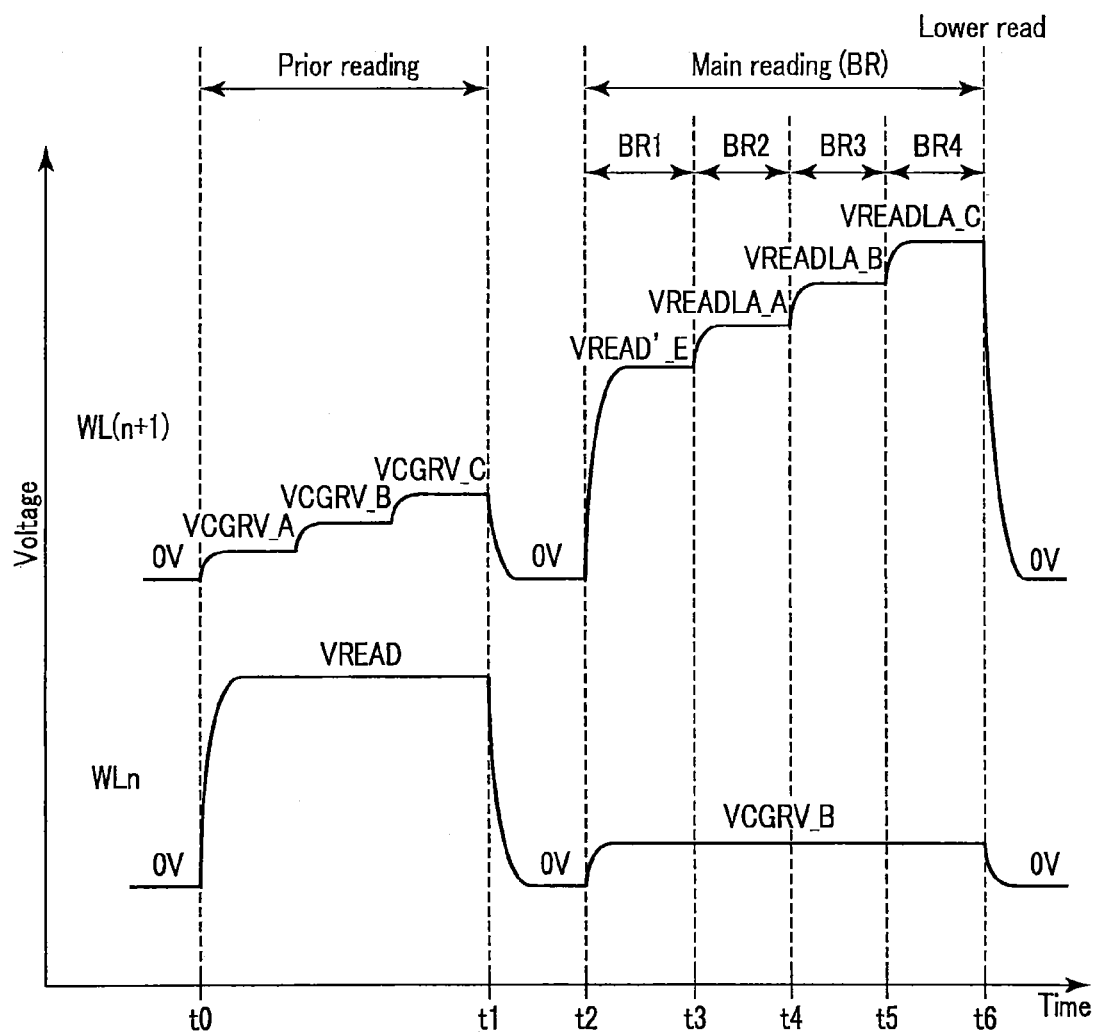
FIG. 20 is a timing chart showing the changes of the word line voltages during data reading of the semiconductor memory device according to the second embodiment.

Next, lower bit reading according to the present embodiment is described with reference to FIG. 20. FIG. 20 is a timing chart showing the potential changes of the word lines WLn and WL(n+1) during the lower bit reading in the prior-reading and the main-reading.

As shown, the present embodiment is different from the first embodiment in that the voltage applied to the word line WLn is changed depending on whether the word line WL(n+1) has the "E"-level or the "A"-level in the main-reading.

While VREAD'_EA, VREADLA_B, and VREADLA_C are prepared as the voltages to be applied to the word line WL(n+1) in the first embodiment, VREAD'_E, VREAD-LA_A, VREADLA_B, and VREADLA_C are prepared in the present embodiment.

If the periods in which the respective voltages are applied are the periods BR1, BR2, BR3, and BR4, the sense amplifier 13 senses and strobes data in the period BR1 for a column in which the result of the prior-reading is the "E"-level. For a column in which the result of the prior-reading is the "A"-level, the sense amplifier 13 senses and strobes data in the period BR2. Moreover, for a column in which the result of the prior-reading is the "B"-level, the sense amplifier 13 senses and strobes data in the period BR3. For a column in which the result of the prior-reading is the "C"-level, the sense amplifier 13 senses and strobes data in the period BR4.

Figure 21:
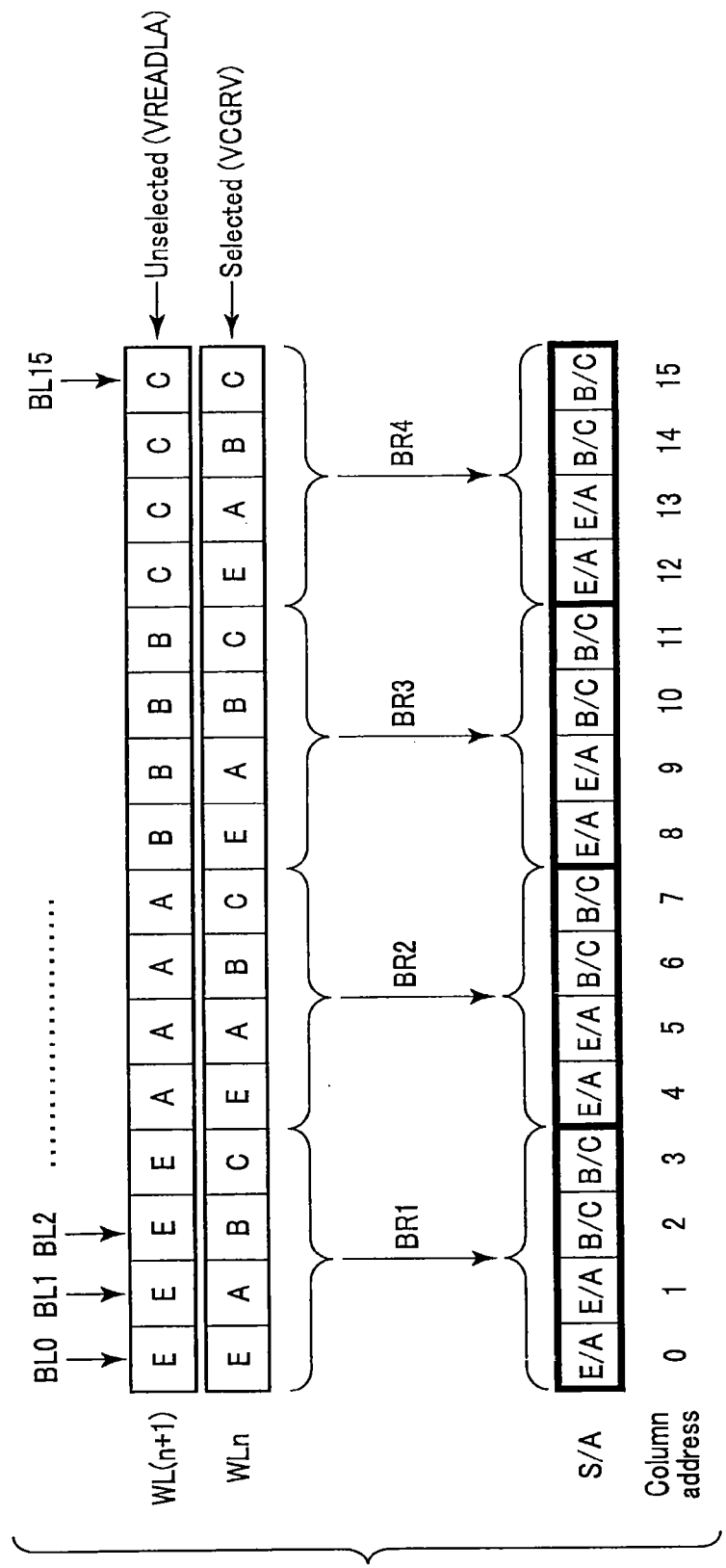
FIG. 21 is a schematic diagram showing page data and data fixed in a latch circuit in a sense amplifier during lower bit reading of the semiconductor memory device according to the second embodiment.

A specific example of the above operation is described with reference to FIG. 21. FIG. 21 corresponds to FIG. 10 described in the first embodiment.

As shown, in the period BR1, it is determined that the bits 0 and 1 are at the "E"-level or the "A"-level, and the bits 2 and 3 are at the "B"-level or the "C"-level. In the period BR2, it is determined that the bits 4 and 5 are at the "E"-level or the "A"-level, and the bits 6 and 7 are at the "B"-level or the "C"-level. Moreover, in the period BR3, it is determined that the bits 8 and 9 are at the "E"-level or the "A"-level, and the bits 10 and 11 are at the "B"-level or the "C"-level. In the period BR4, it is determined that the bits 12 and 13 are at the "E"-level or the "A"-level, and the bits 14 and 15 are at the "B"-level or the "C"-level.

2.2 Advantageous Effects According to the Present Embodiment

According to the present embodiment, it is possible to further improve the reliability of data reading than in the first embodiment. These advantageous effects are described in detail below.

Figure 22:
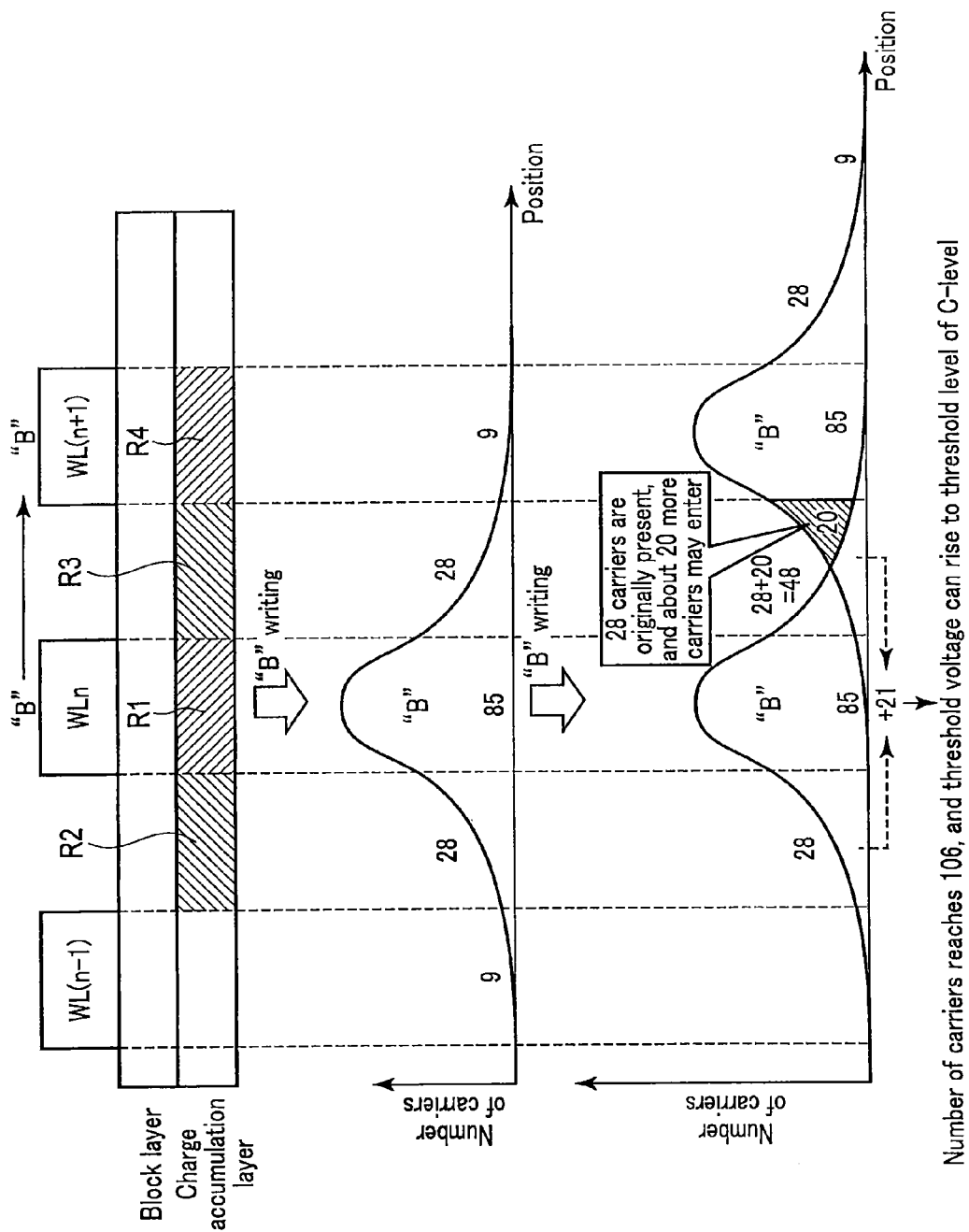
FIG. 22 is a schematic diagram showing a model of a charge distribution during writing.

FIG. 22 shows a charge distribution in the case where the "B"-level is written into the word line WLn and then the "B"-level is also written into the word line WL(n+1) in the models described with reference to FIG. 12 to FIG. 14 in the first embodiment.

As has been described with reference to FIG. 13, when the "B"-level is written into the word line WLn, 28 electrons, for example, are trapped in each of the areas R2 and R3 between the adjacent word lines WL(n−1) and WL(n+1).

Then in the model according to the first embodiment, no more electrons enter the area R3 when the same "B"-level is written into the word line WL(n+1) because about 28 electrons already exist in the area R3. However, it can be more realistic to consider that some electrons enter the area R3 rather than to consider that no more electrons enter. Based on this concept, FIG. 22 shows the case where about 20 electrons are newly trapped in the area R3 in which about 28 electrons already exist. In this case, the number of electrons in the area R1 is equivalently 106. That is to say, the threshold voltage of the "B"-level can rise to the "C"-level.

Figure 23:
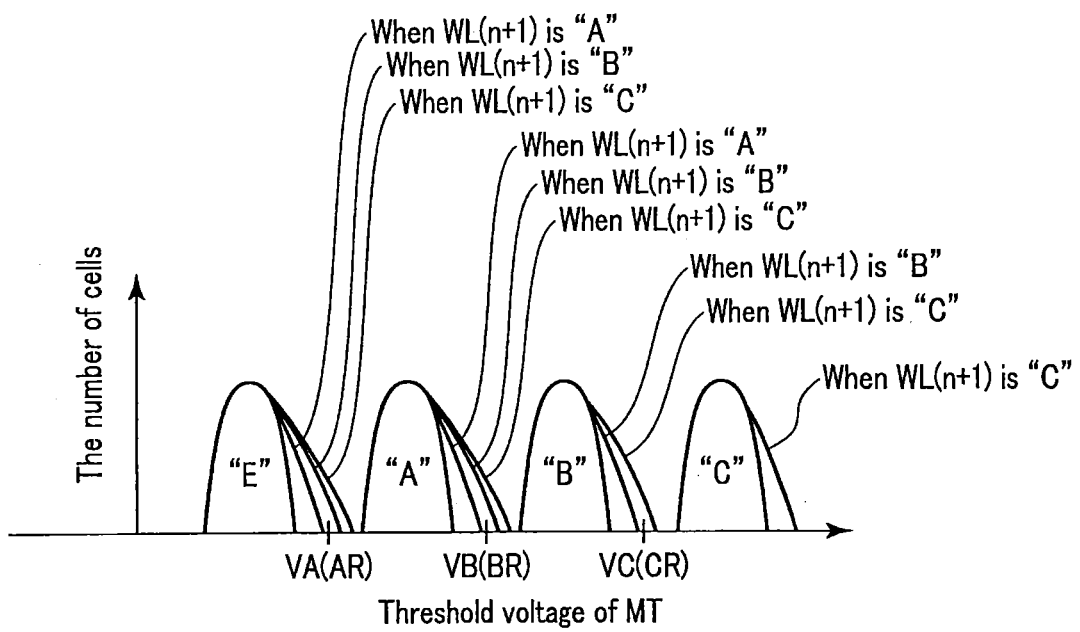
FIG. 23 is a graph showing threshold distributions of the memory cells.

FIG. 23 shows how the threshold distributions of the "E" to "C"-levels vary according to the above-mentioned inter-cell interference. As shown, when the memory cell transistor MTn has the "C"-level, the threshold rises if the memory cell transistor MT(n+1) adjacent thereto on the drain side has the "C"-level. The threshold of the "B"-level rises when the memory cell transistor MT(n+1) has the "B"-level or the "C"-level. The thresholds of the "A"-level and the "B"-level rise when the memory cell transistor MT(n+1) has the "A"-level, the "B"-level, or the "C"-level.

Thus, according to the present embodiment, the corrective reading is also performed when the bit adjacent on the drain side has the same threshold level as that of the bit targeted for reading. For example, in the period BR1 in FIG. 20, the corrective reading is performed by the application of VREADLA_E different from VREAD to the word line WL(n+1).

According to the present embodiment, it is also possible to precisely estimate the degree of the threshold variation attributed to the inter-cell interference, and improve the reliability of data reading.

3. Third Embodiment

Now, a semiconductor memory device according to a third embodiment is described. In the present embodiment, the voltage of the word line WL(n+1) is stepped up during a program-verification in the first or second embodiment described above. The differences between the present embodiment and the first and second embodiments are only described below.

Briefly, the concept of the present embodiment is described. The voltage V(n+1) applied to the unselected word line WL(n+1) in the program-verification corresponds to a program level ("A", "B", or "C" level) of the selected word line WLn. Further, the voltage VREADLA applied to the unselected word line WL(n+1) in the reading corresponds to a result of the prior-reading ("E", "A", "B", or "C" level) of the unselected word line WL(n+1). In the present embodiment, the voltages V(n+1) and VREADLA compensate an effect caused by electrons trapped into the charge storage layer between WLn and WL(n+1).

For example, the voltage V(n+1) is smaller than the voltage VREAD. Therefore, the data writing operation of the word line WLn passes the program-verification in a state with a lower channel conductance than in a case that the voltage VREAD is applied to the unselected word line WL(n+1). After that, when the data is read from the word line WLn, the state in which the program-verification is passed, that is, a low channel conductance state, may be recreated. Consequently, the value of the voltage VREADLA may be lowered than that in the first and second embodiments. In other words, the applying the voltage V(n+1) may be a preparation for lowering the voltage VREADLA.

3.1 Regarding Program-Verification

First, the program-verification according to the present embodiment is described with reference to FIG. 24. Data writing roughly includes a program operation to charge the charge storage layer to vary the threshold, and a program-verification operation to judge whether the threshold has risen to a desired value as a result of the programming. Data is then written by repeating the programming and the program-verification.

As shown in FIG. 24, a row decoder 12 applies a verification voltage Vvfy to the selected word line WL2 during the program-verification. The verification voltage Vvfy has a value corresponding to write data. The verification voltage Vvfy is Vvfy_A when the threshold level is the "A"-level. The verification voltage Vvfy is Vvfy_B when the threshold level is the "B"-level. The verification voltage Vvfy is Vvfy_C when the threshold level is the "C"-level. The verification voltages Vvfy_A, Vvfy_B, and Vvfy_C are voltages that are slightly higher than, for example, the read voltages VA, VB, and VC, respectively.

The row decoder 12 applies a voltage V(n+1) to the unselected word line WL3 adjacent to the selected word line WL2 on the drain side, and applies the voltage VREAD to the other unselected word lines WL0, WL1, and WL4 to WL7. The voltage V(n+1) will be described later.

The row decoder 12 applies the voltage VSG to the selection gate lines SGD and SGS, so that the selection transistors ST1 and ST2 are turned on. In this state, data is read from the memory cell transistor connected to the word line WL2 into the sense amplifier 13. If the memory cell transistor is turned on as a result, the threshold level has not reached a target level, and repeated programming is needed. On the other hand, if the memory cell transistor is turned off, the threshold level has reached the target level, and writing data into this memory cell transistor is completed.

FIG. 25 is a timing chart showing the potential changes of the word line WLn (WL2 in the example of FIG. 24) targeted for programming and the word line WL(n+1) (WL3 in the example of FIG. 24) adjacent thereto on the drain side during the data writing.

As shown, during programming, the row decoder 12 applies the program voltage VPGM to the selected word line WLn, and applies the voltage VPASS to the unselected word lines.

After applying the voltage VPGM to the selected word line WLn to perform programming, the program-verification is then performed. As shown in FIG. 25, during the program-verification, the verification voltages Vvfy_A, Vvfy_B, and Vvfy_C are sequentially applied to the selected word line WLn. However, depending on the number of repetitions of the combination of the programming and the program-verification, two or one of the voltages may be only applied. For example, the voltages Vvfy_A, Vvfy_B, and Vvfy_C are lower than the voltage VREAD.

Voltages V(n+1)_E, V(n+1)_A, and V(n+1)_B are applied to the word line WL(n+1) as the voltage V(n+1). The voltages V(n+1)_E, V(n+1)_A, and V(n+1)_B are associated with the verification voltages Vvfy_A, Vvfy_B, and Vvfy_C, respectively. Specifically, the voltage V(n+1)_E is applied to the word line WL(n+1) when the verification voltage Vvfy_A is applied to the word line WLn, the voltage V(n+1)_A is applied to the word line WL(n+1) when the verification voltage Vvfy_B is applied to the word line WLn, and the voltage V(n+1)_B is applied to the word line WL(n+1) when the verification voltage Vvfy_C is applied to the word line WLn.

3.2 Regarding Read Operation

Now, a data read operation according to the present embodiment is described with reference to FIG. 26. As shown, the voltages applied to the selected word line WLn and the unselected word line WL(n+1) during data reading are substantially similar to those described with reference to FIG. 8 in the first embodiment.

Although the upper bit reading is shown in FIG. 26, the same also applies to lower bit reading. That is, in FIG. 10 described in the first embodiment, the voltages VREAD'_EA, VREADLA_B, and VREADLA_C are applied to the unselected word line WL(n+1) when VCGRV_B is applied to the selected word line WLn.

3.3 Regarding Read Operation and Change of Threshold Distribution by Data Writing Now, the variation of the threshold distribution of the memory cell transistor and the voltage V(n+1) according to the present embodiment are described with reference to FIG. 27. In the case shown below, data is written into the memory cell transistor connected to the word line WLn, data is then written into the memory cell transistor connected to the word line WL(n+1), and data is then read from the memory cell transistor connected to the word line WLn.

<Writing into Word Line WLn>

As shown, data is first written into the memory cell transistor connected to the word line WLn. As a result, the threshold voltage of the memory cell transistor whose threshold level is the "A"-level becomes higher than the verification voltage Vvfy_A. The threshold voltage of the memory cell transistor whose threshold level is the "B"-level becomes higher than the verification voltage Vvfy_B. The threshold voltage of the memory cell transistor whose threshold level is the "C"-level becomes higher than the verification voltage Vvfy_C.

During writing into the word line WLn, the voltages V(n+1)_E, V(n+1)_A, and V(n+1)_B are applied to the word line WL(n+1) at the time of the program-verification. As shown in FIG. 27, the verification voltage Vvfy and the voltage V(n+1) have, for example, the following relations:

$$Vvfy\_A < V(n+1)\_E,$$

$$Vvfy\_B < V(n+1)\_A, \text{ and}$$

$$Vvfy\_C < V(n+1)\_B.$$

These relations are by way of example only. For example, V(n+1)_E may be higher than Vvfy_B, and V(n+1)_A may be higher than Vvfy_C. For example, at least V(n+1)_E<V(n+1)_A<V(n+1)_B<VREAD has only to be satisfied. The voltage V(n+1)_C shown in FIG. 27 may be, for example, substantially the same voltage as the voltage VREAD, or may be a voltage higher than VREAD.

<Writing into Word Line WL(n+1)>

Data is then written into the memory cell transistor connected to the word line WL(n+1). The operation in this case is similar to that in the writing into the word line WLn.

<Reading from Word Line WLn>

Data is then read from the memory cell transistor connected to the word line WLn. The read operations AR, BR, and CR are described below.

—Regarding Read Operation AR

In the read operation AR, the read voltage VA is applied to the selected word line WLn. When data is read from the selected cell (the memory cell transistor connected to the word line WLn) whose adjacent cell (the memory cell transistor connected to the word line WL(n+1)) is at the "E"-level in the prior-reading, the voltage V(n+1)_E is applied to the word line WL(n+1). When data is read from the selected cell whose adjacent cell is at the "A"-level, the voltage V(n+1)_A is applied to the word line WL(n+1). Moreover, when data is read from the selected cell whose adjacent cell is at the "B"-level, the voltage V(n+1)_B is applied to the word line WL(n+1). When data is read from the selected cell whose adjacent cell is at the "C"-level, the voltage V(n+1)_C is applied to the word line WL(n+1).

That is, in FIG. 26, the voltage of the word line WL(n+1) is set as follows:

$$VREAD'\_E = V(n+1)\_E,$$

$$VREADLA\_A = V(n+1)\_A,$$

$$VREADLA\_B = V(n+1)\_B,$$

$$VREADLA\_C1 = V(n+1)\_C$$

—Regarding Read Operation CR

In the read operation CR, the read voltage VC is applied to the selected word line WLn. When data is read from the selected cell whose adjacent cell is at the "E"-, "A"-, or "B"-level, the voltage V(n+1)_B is applied to the word line WL(n+1). When data is read from the selected cell whose adjacent cell is at the "C"-level, the voltage V(n+1)_C is applied to the word line WL(n+1).

That is, in FIG. 26, the voltage of the word line WL(n+1) is set as follows:

$$VREAD'\_EAB=V(n+1)\_B,$$

$$VREADLA\_C1=V(n+1)\_C$$

—Regarding Read Operation BR

In the read operation BR, the read voltage VB is applied to the selected word line WLn. When data is read from the selected cell whose adjacent cell is at the "E"-or "A"-level, the voltage V(n+1)_A is applied to the word line WL(n+1). Moreover, when data is read from the selected cell whose adjacent cell is at the "B"-level, the voltage V(n+1)_B is applied to the word line WL(n+1). When data is read from the selected cell whose adjacent cell is at the "C"-level, the voltage V(n+1)_C is applied to the word line WL(n+1).

That is, in FIG. 10, the voltage of the word line WL(n+1) is set as follows:

$$VREAD'\_EA=V(n+1)\_A,$$

$$VREADLA\_B=V(n+1)\_B,$$

$$VREADLA\_C1=V(n+1)\_C$$

3.4 Advantageous Effects According to the Present Embodiment

According to the present embodiment, it is also possible to compensate the threshold variation attributed to the inter-cell interference, and improve the reliability of data reading, as in the first and second embodiments. These advantageous effects are described below.

According to the present embodiment, the inter-cell interference is canceled by the voltages during the program-verification and reading. That is to say, when the word line WLn is selected, the voltage of the word line WL(n+1) is adjusted both during the program-verification and during reading to cancel the inter-cell interference.

First, in the program-verification, as has been described with reference to FIG. 25 and FIG. 27, the voltages V(n+1)_E, V(n+1)_A, and V(n+1)_B are applied to the word line WL(n+1) in accordance with the verification levels. The degree of the inter-cell interference depends on the threshold level of the word line WLn. That is to say, the easiness of the variation of the threshold voltage varies according to the data held.

Assuming that the voltage applied to the unselected word line WL(n+1) in the program-verification is independent (for example, constant voltage) from the program level of the selected word line WLn, the inter-cell interference on the cell is smaller and the variation of its threshold voltage is also smaller when the word line WLn is set to a higher threshold level (e.g., the "C"-level). In contrast, the inter-cell interference on the cell is greater and the variation of its threshold voltage is also greater when the word line WLn is set to a lower threshold level (e.g., the "A"-level).

According to the present embodiment, the correction amount for the cell having a lower threshold level is greater, and the correction amount for the cell having a higher threshold level is smaller. Specifically, to increase the correction amount, the voltage of the word line WL(n+1) for the program-verification (for example, V(n+1)_E, V(n+1)_A and, V(n+1)_B) is significantly lowered with respect to the voltage VREAD. On the other hand, to decrease the correction amount, the voltage of the word line WL(n+1) for the program-verification is slightly decreased with respect to the voltage VREAD. Thus, in the writing into the word line WLn, the selected cell is subjected to the influence of the voltage varying according to the data to be written from the word line WL(n+1).

In data reading, as has been described with reference to FIG. 26 and FIG. 27, the voltage V(n+1) is applied to the unselected word line WL(n+1) in accordance with the result of the prior-reading. For example, suppose that the threshold of the memory cell connected to the word line WLn is at the "A"-level, and the "C"-level is then written into the memory cell connected to the word line WL(n+1). Since the "C"-level is written into the memory cell connected to the word line WL(n+1), the "A"-level of the memory cell connected to the word line WLn is subjected to the inter-cell interference, and the threshold voltage shifts accordingly. However, it is known that the threshold level of the memory cell is the "C"-level because of the prior-reading when data is read from the memory cell connected to the word line WL(n+1). In this case, rather than the voltage V(n+1)_E used for the program-verification, the voltage VREADLA_C1 (=V (n+1)_C) is applied to the word line WL(n+1). As a result, the threshold voltage shift of the "A"-level can be canceled by the potential difference between the voltages V(n+1)_E and V(n+1)_C.

This situation is shown in the schematic diagram of FIG. 28. The uppermost stage in the diagram of FIG. 28 shows the situation of the program-verification when the "A"-level is programmed in the memory cell connected to the word line WLn. As shown, the verification voltage Vvfy_A=2 V is applied to the word line WLn, and the voltage VREAD=7 V is applied to the unselected word line WL(n+2). The voltage V(n+1)_E=4 V lower than VREAD is then applied to the unselected word line WL(n+1). Accordingly, the amount of charge induced between the word lines WLn and WL(n+1) is smaller and channel conductance is lower than when the voltage VREAD is applied. That is to say, programming to the memory cell connected to the word line WLn is performed so that the "A"-level is read under the condition in which the channel conductance is lower.

As shown in the middle stage of FIG. 28, the "C"-level is written into the memory cell connected to the word line WL(n+1). Accordingly, the voltage VPGM=23 V is applied to the selected word line WL(n+1), and the voltage VPASS=8 V is applied to the unselected word lines WLn and WL(n+2). The adjacent memory cells more affect each other as the space therebetween decreases. Therefore, as shown, a charge is trapped in the charge storage layer 29 in the region between the word lines WLn and WL(n+1) due to the voltages VPGM and VPASS. The trap amount varies according to the data to be written into the memory cell connected to the word line WL(n+1), and more charges are trapped when a higher threshold level is set.

As shown in the lower stage of FIG. 28, data is then read from the word line WLn. By a method according to the present embodiment, the state of the channel conductance during this reading is set to be equal to the state in the upper stage in the diagram of FIG. 28. To this end, the voltage of the unselected word line WL(n+1) is adjusted. In this example, the voltage VREADLA_C1(=V(n+1)_C)=7 V is applied to the word line WL(n+1). The influences of the voltage V(n+1)_C and the voltage VCGRV compensate the influence of the charge trapped in the charge storage layer 29 between the word lines WLn and WL(n+1). That is to say, the voltage of the word line WL(n+1) is selected in accordance with the results of the prior-reading of the memory cell connected to the word line WL(n+1). The selecting the voltage of the WL(n+1) cancels an influence of the charges trapped between the word lines WLn and the word line WL(n+1). For example, the voltage of the word line WL(n+1) is increased if the trap amount is great, and the voltage of the word line WL(n+1) is decreased if the trap amount is small.

As a result, the channel conductance during the reading of data from the memory cell connected to the word line WLn is substantially the same as that during the writing of data into the memory cell connected to the word line WLn, and data can be correctly read.

The voltages applied to the word line WL(n+1) during reading are not limited to the voltages in FIG. 26. For example, the voltages may be as shown in FIG. 29. That is, in the example described above, the voltage of the word line WL(n+1) is set to four levels (V(n+1)_E, V(n+1)_A, V(n+1)_B, and V(n+1)_C) in the read operation AR, three levels (V(n+1)_A, V(n+1)_B, and V(n+1)_C) in the read operation BR, and two levels (V(n+1)_B and V(n+1)_C) in the read operation CR.

However, the voltage may be set to three levels (V(n+1)_A, V(n+1)_B, and V(n+1)_C) in the read operation AR, two levels (V(n+1)_B and V(n+1)_C) in the read operation BR, and one level (V(n+1)_C) in the read operation CR.

The voltage may also be set as shown in FIG. 18 and FIG. 20 described in the second embodiment. In this case, the voltage may be set to four levels (V(n+1)_E, V(n+1)_A, V(n+1)_B, and V(n+1)_C) in the read operations AR and BR, three levels (V(n+1)_A, V(n+1)_B, and V(n+1)_C) in the read operation CR, and one level (V(n+1)_C) in the read operation CR.

Furthermore, according to the present embodiment, the voltage of the word line WL(n+1) may be set to four levels (V(n+1)_E, V(n+1)_A, V(n+1)_B, and V(n+1)_C) in all the read operations AR, BR, and CR. That is, the correcting operation of the threshold voltage may be performed regardless of the data held in the adjacent cell.

4. Fourth Embodiment

Now, a semiconductor memory device according to a fourth embodiment is described. According to the present embodiment, the value of the voltage VCGRV is shifted to cancel the inter-cell interference in the first or second embodiment.

4.1 Regarding Read Operation

The read operation according to the present embodiment roughly includes a first read operation and a second read operation. The first read operation is performed regardless of the inter-cell interference, and the second read operation is performed to cancel the inter-cell interference.

Therefore, during the first read operation, the prior-reading is not performed, and the main-reading is performed. In this instance, the voltage VREADLA for correction is not used, and, for example, the voltage VREAD is applied to all the unselected word lines.

The second read operation is performed when data can not be correctly read in the first read operation. That is to say, when the controller issues a read instruction to the NAND flash memory 10, the NAND flash memory 10 performs the first read operation in response to the instruction. However, when the read operation has failed, for example, when read data includes errors that cannot be corrected by ECC, the controller issues a second read instruction. In response to this instruction, the NAND flash memory 10 performs the second read operation.

Details of the second read operation are described with reference to FIG. 31. As shown, the voltage applied to the selected word line WLn and the unselected word line WL(n+1) during the second read operation are substantially similar to those in FIG. 8 described in the first embodiment. However, in contrast to FIG. 8, in the third embodiment, the value of the read voltage VCGRV applied to the selected word line WLn is higher than that in the first embodiment (a broken line in the graph indicates the case in the first embodiment, and a solid line indicates the case in the fourth embodiment). The value of the read voltage VCGRV during the second read operation is set to be higher than that of the voltage VCGRV during the first read operation.

Figure 31:
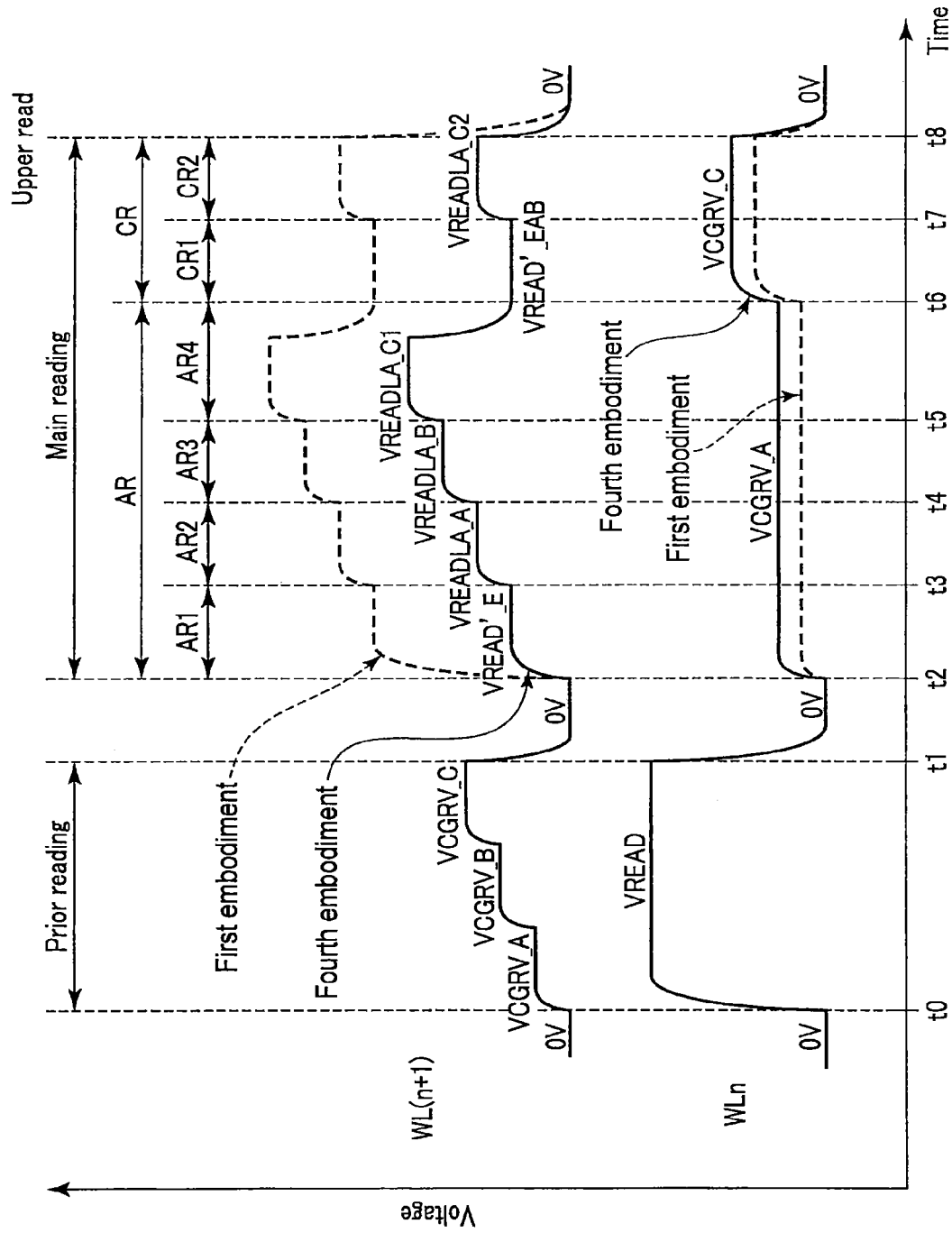
FIG. 31 is a timing chart showing the changes of the word line voltages during data writing of the semiconductor memory device according to a fourth embodiment.

Although the upper bit reading is only shown in FIG. 31, the same also applies to lower bit reading. That is to say, in FIG. 10 described in the first embodiment, the voltages VREAD'_EA, VREADLA_B, and VREADLA_C are set to lower values than in the first embodiment, and the read voltage VCGRV is set to a higher value.

4.2 Regarding Variation of Threshold Distribution

Figure 32:
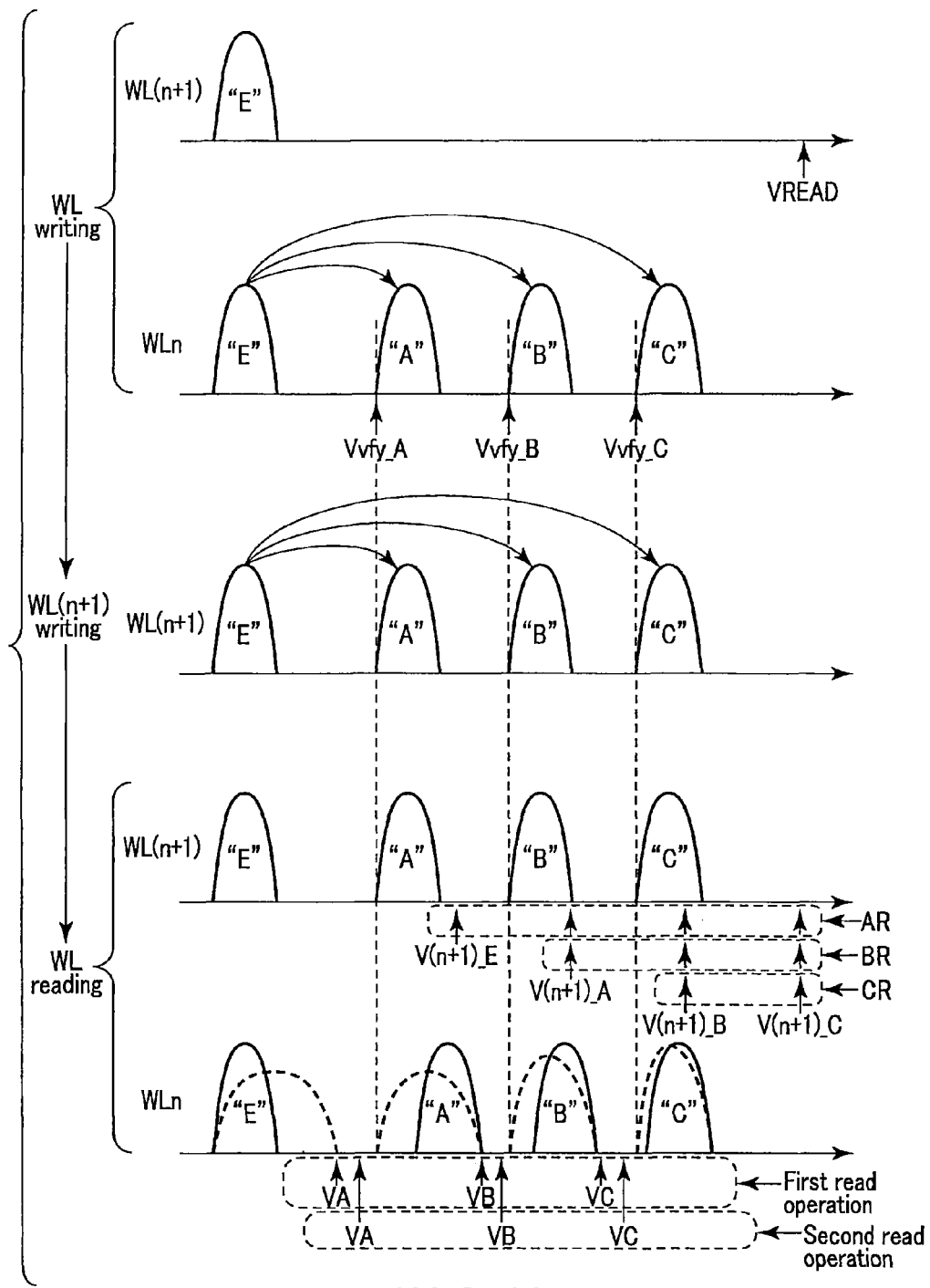
FIG. 32 is a schematic diagram showing the variation of the threshold distribution of the memory cells of the semiconductor memory device according to the fourth embodiment.

Now, the variation of the threshold distribution of the memory cell transistor according to the present embodiment is described with reference to FIG. 32. In the case shown below, data is written into the memory cell transistor connected to the word line WLn, data is then written into the memory cell transistor connected to the word line WL(n+1), and data is then read from the memory cell transistor connected to the word line WLn. The operation according to the present embodiment is substantially similar to that in FIG. 27 described in the fourth embodiment. The differences between FIG. 32 and FIG. 27 are only described below.

First, data is written into the memory cell transistor connected to the word line WLn. In contrast to FIG. 27, the voltage VREAD (or a voltage VREADk higher than VREAD) is applied to the word line WL(n+1) during the program-verification. That is, the word line WL(n+1) is set to a constant value (i.e., does not vary with the verification level) during the program-verification.

Data is then written into the memory cell transistor connected to the word line WL(n+1).

Data is then read from the memory cell transistor connected to the word line WLn. In the read operations AR, BR, and CR, the voltages applied to the unselected word line WL(n+1) are similar to those in FIG. 27. As described above, the voltage applied to the selected word line WLn is different from that in FIG. 27. The voltages VA, VB, and VC in the first read operation have the same values as those in, for example, FIG. 27. However, in the second read operation, the voltages VA, VB, and VC are stepped up. Moreover, in the second read operation, data is correctly read, or data is repeatedly read up to a specified number of times, and the voltages VA, VB, and VC are stepped up every time.

4.3 Advantageous Effects According to the Present Embodiment

According to the present embodiment, it is also possible to compensate the threshold variation attributed to the inter-cell interference, and improve the reliability of data reading, as in the first to third embodiments. These advantageous effects are described below.

As described above, the threshold voltage of the memory cell transistors coupled to the word line WLn rises due to the inter-cell interference during the writing into the word line WL(n+1). The degree of the rise in the memory cells having lower threshold levels is greater than that in the memory cells having higher threshold levels. For example, as shown in FIG. 17, the upper limit value of the threshold distribution shifts to the higher voltage side, and the lower limit value makes almost no change. As a result, the space between the threshold distributions of the neighboring threshold levels becomes narrower (i.e., the distribution width of the individual threshold level becomes greater), and erroneous reading more easily occurs.

Thus, according to the present embodiment, the voltage V(n+1) lower than the voltage VREAD used during the program-verification is applied to the word line WL(n+1) during reading. In this way, the lower limit value of the threshold distribution of the word line WLn is shifted to the higher voltage side. In this instance, the lower limit value of the threshold distribution makes almost no change.

As a result, the width of the threshold distribution during reading can be reduced. That is to say, as shown in the threshold distribution diagram of word line WLn during the reading from the word line WLn in FIG. 32, the threshold distribution that has spread as indicated by broken lines narrows as indicated by solid lines.

That is, all the threshold distributions of the "A"-, "B"- and "C"-levels shift to the higher voltage side. Thus, according to the present embodiment, the read voltage VCGRV (=VA, VB, and VC) is also shifted to the higher voltage side along with the shift of the threshold distributions. Therefore, a suitable voltage between the adjacent threshold distributions can be used as a read voltage, so that data can be correctly read.

Figure 33:
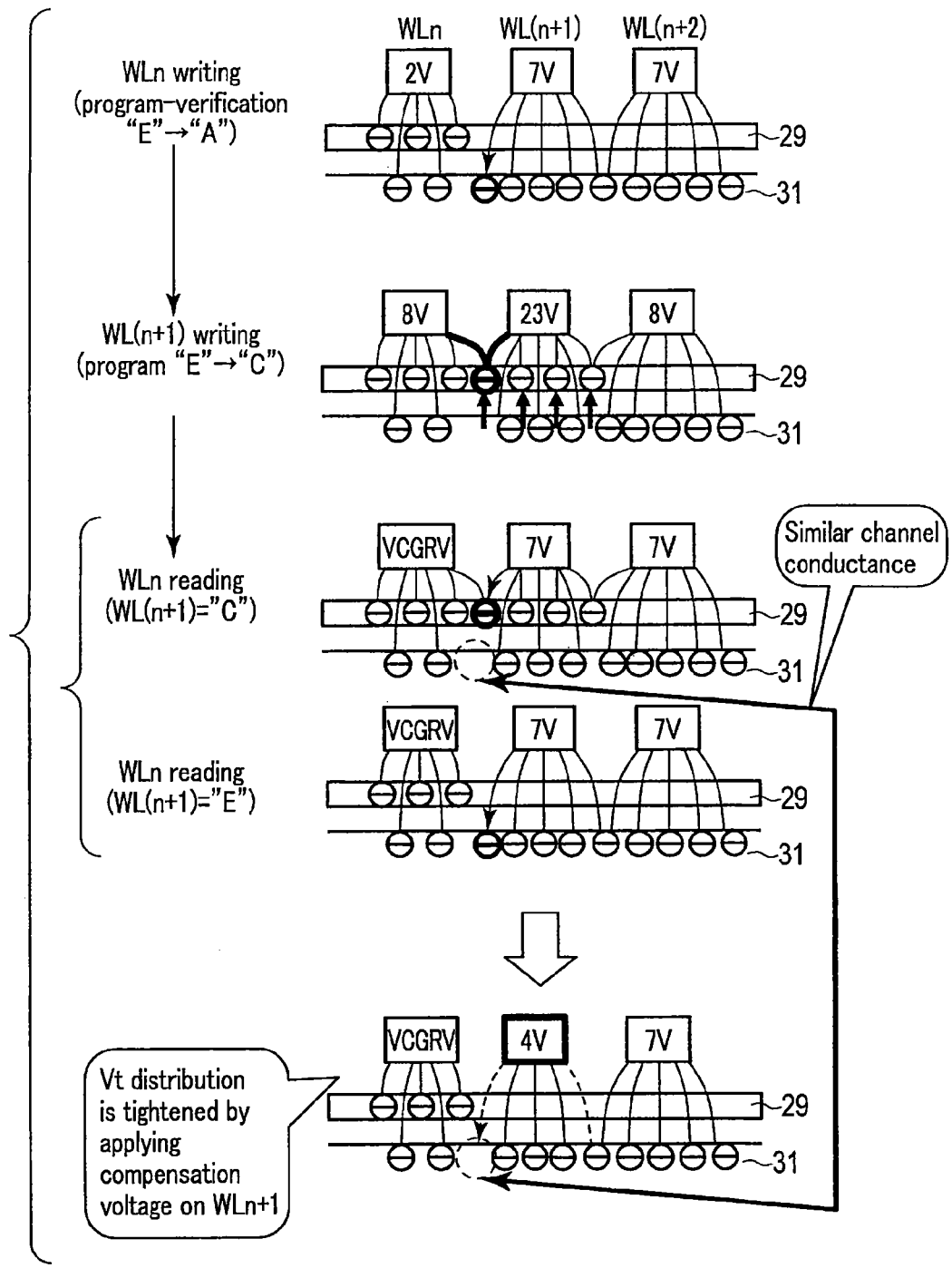
FIG. 33 is a schematic diagram showing the state of a charge in a partial area of the NAND string of the semiconductor memory device according to the fourth embodiment.

This situation is shown in the schematic diagram of FIG. 33. The uppermost stage in the diagram of FIG. 33 shows the situation of the program-verification when the "A"-level is programmed in the word line WLn. As shown, the verification voltage Vvfy_A=2 V is applied to the selected word line WLn, and the voltage VREAD=7 V is applied to the unselected word lines WL(n+1) and WL(n+2). Accordingly, the amount of charge induced between the word lines WLn and WL(n+1) is greater and channel conductance is higher than in the case described with reference to FIG. 28. That is to say, programming of the word line WLn is performed so that the "A"-level is read under the condition in which channel conductance is higher than that in FIG. 28.

As shown in the second stage of FIG. 33, the "C"-level is written into the word line WL(n+1). Accordingly, the voltage VPGM=23 V is applied to the selected word line WL(n+1), and the voltage VPASS=8 V is applied to the unselected word lines WLn and WL(n+2). As has been described with reference to FIG. 28, a charge is trapped in the charge storage layer 29 in the region between the word lines WLn and WL(n+1).

As shown in the third stage of FIG. 33, data is then read from the word line WLn. In the case shown in the third stage of the diagram, VREAD is applied to the word line WL(n+1) in two cases: when the word line WL(n+1) is at the "C"-level and the "E"-level. As shown, when the word line WL(n+1) is at the "C"-level, the influence of the charge trapped in the charge storage layer 29 between the word lines WLn and WL(n+1) is almost offset by VREAD of the word line WL(n+1) and VCGRV of the word line WLn. In contrast, when the word line WL(n+1) is at the "E"-level, no charge is trapped in the charge storage layer 29 between the word lines WLn and WL(n+1), so that a charge is induced between the word lines WLn and WL(n+1). That is to say, the channel conductance varies depending on the level of the word line WL(n+1).

Thus, according to the present embodiment, as shown in the lowermost stage of FIG. 33, the voltage V(n+1) corresponding to the threshold level of the word line WL(n+1) is applied to the word line WL(n+1). In the case shown in FIG. 33, the level of the word line WL(n+1) is the "E"-level, and the voltage V(n+1)_E=4 V is applied to the word line WL(n+1). As shown, the voltage of the word line WL(n+1) is reduced to 4 V from 7 V, so that the induction of a charge between the word lines WLn and WL(n+1) can be inhibited. As a result, the channel conductance when the adjacent cell is at the "C"-level can be substantially equal to the channel conductance when the adjacent cell is at the "E"-level.

In addition, the method of the corrective reading described in the first to third embodiments may also be carried out during the second read operation. That is to say, when the first read operation is performed and data cannot be correctly read, the reading method described in the first to third embodiments may be carried out.

5. Fifth Embodiment

Now, a semiconductor memory device according to a fifth embodiment is described. In the present embodiment, the voltages VREADLA and VREAD' have layer dependence in the first and second embodiments described above. The differences between the present embodiment and the first and second embodiments are only described below.

5.1 Regarding Layer Dependence of Voltages VREADLA and VREAD'

Figure 34:
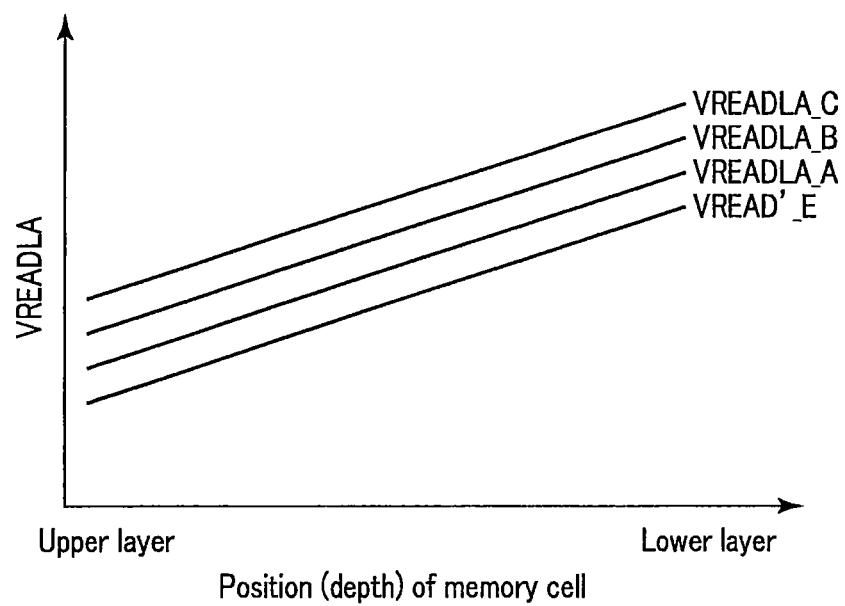
FIG. 34 and FIG. 35 are graphs showing layer dependence of voltages VREADLA of the semiconductor memory device according to a fifth embodiment, respectively.
Figures 35, 36:
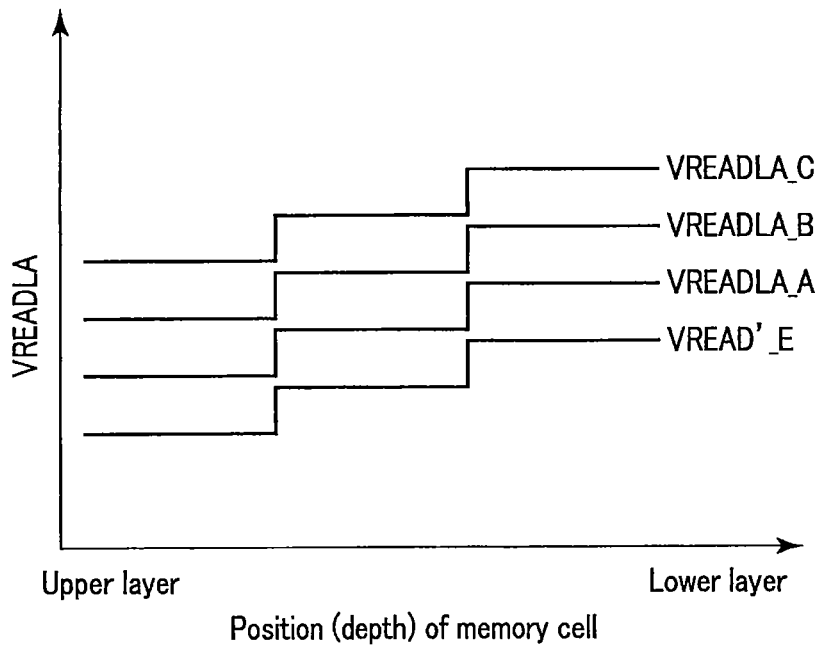
FIG. 36 is a conceptual diagram of a correction table of the semiconductor memory device according to the fifth embodiment.

FIG. 34 and FIG. 35 are graphs showing the change of the voltage VREADLA according to the position of a memory cell. Although VREADLA_A, VREADLA_B, and VREADLA_C are shown as the voltages VREADLA in FIG. 34 and FIG. 35, the same also applies to the other voltages VREADLA, for example, VREADLA_EA and VREADLA_C1 described in the first embodiment.

As shown, VREADLA and VREAD' according to the present embodiment have layer dependence. In the example of FIG. 34 and FIG. 35, the voltage values of VREADLA applied to the lower memory cell transistors MT are higher. For example, in the example of FIG. 3, VREADLA and VREAD' applied to the lowermost word line WL0 are the highest, and VREADLA and VREAD' applied to the uppermost word line WL7 is the lowest.

The values of the voltage VREADLA and VREAD' may successively change as shown in FIG. 34 (the values of VREADLA and VREAD' change for every word line). Alternatively, as shown in FIG. 35, the values of the voltages VREADLA and VREAD' may change by a given zone unit (e.g., VREADLA and VREAD' applied to the word lines WL0 to WL1 may have the same value, VREADLA and VREAD' applied to the word lines WL2 to WL5 may have the same value, and VREADLA and VREAD' applied to the word lines WL6 to WL7 may have the same value).

5.2 Regarding Correction Table

FIG. 36 is a conceptual diagram of a correction table held in, for example, the register 17. The NAND flash memory 10 according to the present embodiment holds the correction table shown in FIG. 36 to control the voltages VREADLA and VREAD' as has been described with reference to FIG. 34 and FIG. 35. FIG. 36 shows the correction table corresponding to FIG. 35 by way of example.

The correction table holds correction values for the voltages VREADLA and VREAD'. For example, in the example of FIG. 36, a correction value $\Delta$VE_upper for an upper layer, a correction value $\Delta$VE_mid for a middle layer, and a correction value $\Delta$VE_low for a lower layer are held for the voltage VREAD'. A voltage generating circuit which is not shown in FIG. 1 then applies the correction value to the voltage VREAD in accordance with an instruction from the sequencer 16, and thereby generates the voltage VREAD'_E to be applied to each layer. That is to say, when the voltage VREAD'_E is applied to the upper word line WL, the voltage generating circuit generates VREAD+$\Delta$VE_upper as VREAD'_E. When the voltage VREAD'_E is applied to the middle word line WL, the voltage generating circuit generates VREAD+$\Delta$VE_mid as VREAD'_E. Moreover, when the voltage VREAD'_E is applied to the lower word line WL, the voltage generating circuit generates VREAD+

ΔVE_low as VREAD'_E. The same also applies to the other voltages VREADLA_A, VREADLA_B, and VREADLA_C.

Figure 37:
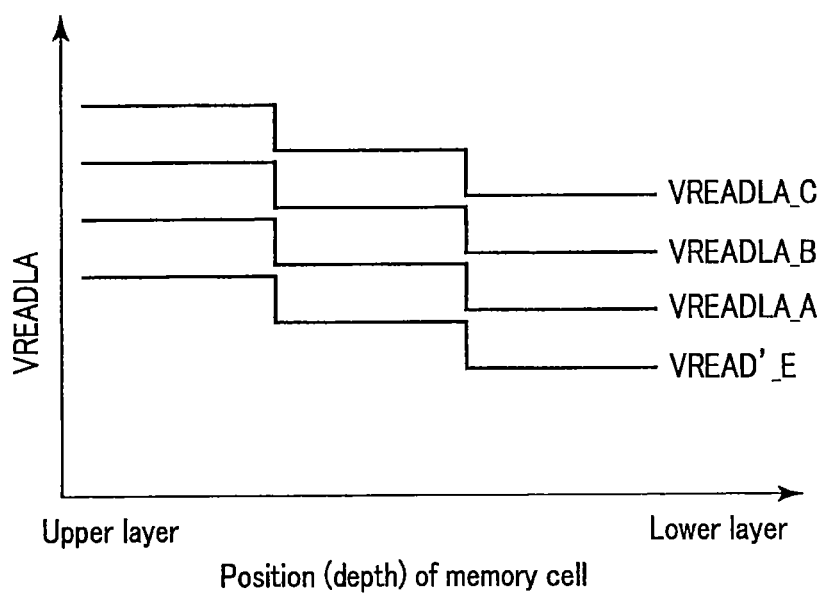
FIG. 37 is a graph showing layer dependence of the voltages VREADLA of the semiconductor memory device according to a modification of the fifth embodiment.

Although the inter-cell interference is greater in the lower layers in the case described above by way of example, the inter-cell interference may be greater in the upper layers. In this case, VREADLA and VREAD' have only to be higher in the upper layers as shown in FIG. 37.

5.3 Advantageous Effects According to the Present Embodiment

The configuration according to the present embodiment can further improve the reliability of data reading than in the first and second embodiments. These advantageous effects are described in detail below.

The memory cell array 11 shown in FIG. 3 is formed by, for example, the following method: First, the conductive layers 27, 23, and 25 are sequentially formed on the semiconductor substrate with unshown insulating films therebetween. The memory hole 26 is then made through the conductive layers 25, 23, and 27 and the insulating films. The insulating films 28, 29, and 30 are then formed inside the memory hole 26, and the conductive layer 31 is further formed to fill the memory hole 26.

When the memory cell transistor MT has the three-dimensionally stacked structure as shown in FIG. 3, the degree of integration can be improved by the increase in the number of layers in the conductive layer 23. However, when the number of layers is greater, it becomes more difficult to make the memory hole 26. Specifically, the memory hole is larger in diameter closer to its upper end and smaller in diameter closer to its lower end. This situation is shown in FIG. 38. That is to say, as shown in FIG. 38, the memory hole 26 is tapered. In other words, the size of the memory cell transistor MT varies according to the layer. As a result, the inter-cell interference may also vary according to the layer.

Thus, according to the present embodiment, the voltage VREADLA also has layer dependence in accordance with the layer dependence of the inter-cell interference. In the example of FIG. 34 and FIG. 35, it is assumed that the inter-cell interference is greater in the lower layers, and the values of VREADLA and VREAD' are higher in the lower layers. Therefore, the inter-cell interference can be effectively suppressed.

Figure 39:
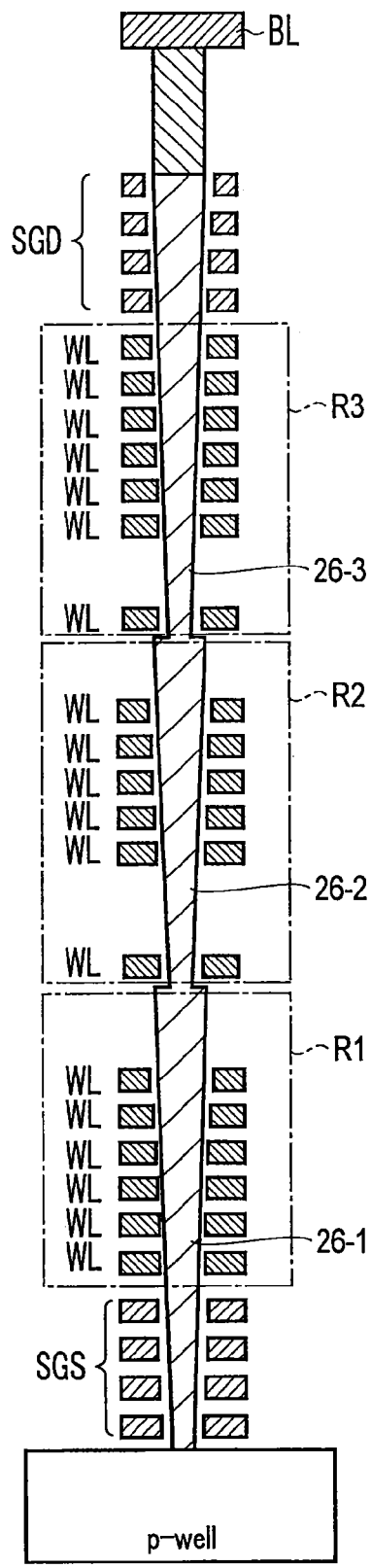
Figure 43:
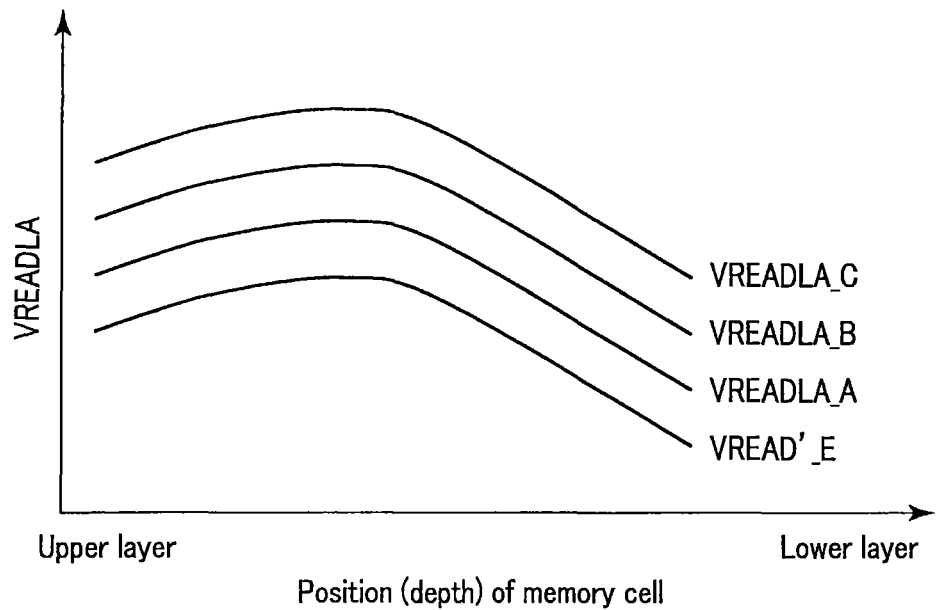
Figure 44:
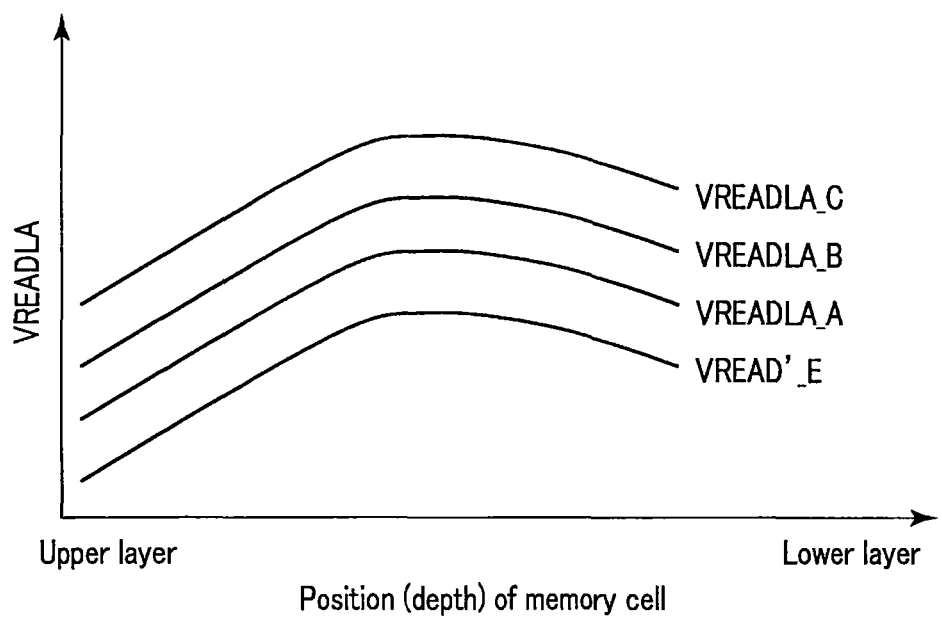

The memory hole 26 is not exclusively made by one etching step, and may be formed by multiple etching steps. The purpose of this is to lessen the size difference of the memory cells in the upper layers and the lower layers when the number of layers is greater. Such an example is shown in FIG. 39. In the example of FIG. 39, the memory hole 26 is made by three etching steps. As shown, tapered memory holes 26-1 to 26-3 are made in three regions R1 to R3 of the NAND string, respectively.

The voltages VREADLA and VREAD' in this case can be set, for example, as shown in FIG. 40. That is to say, VREADLA and VREAD' are not simply dependent on the layers, but may be dependent on the diameters of the memory holes 26, i.e., the sizes of the memory cell transistors MT. The sequencer 16 can recognize the layer in which the word line WL to apply VREADLA and VREAD' to is located, in accordance with the address received from the controller. That is to say, it can also be said that the address is associated with VREADLA and VREAD'.

The correction values shown in FIG. 36 may vary according to the kinds of VREADLA and VREAD' or vary according to the layer. Alternatively, the correction table may have information indicating the values of VREADLA and VREAD' instead of the correction values.

The layer dependence of the voltages VREADLA and VREAD' may be as shown in FIG. 41 to FIG. 44. That is to say, the diameter of the memory hole 26 may be the largest in the middle layer rather than in the upper layer. The values of VREADLA and VREAD' in this case may be set so that the value applied to the middle layer takes the maximum.

6. Sixth Embodiment

Now, a semiconductor memory device according to a sixth embodiment is described. The present embodiment takes into consideration the inter-cell interference from the word line WL(n−1) adjacent on the source side during reading for determining the "E"-level in the first to fifth embodiments. The differences between the present embodiment and the first to fifth embodiments are only described below.

6.1 Regarding Details of Read Operation

Figure 45A:
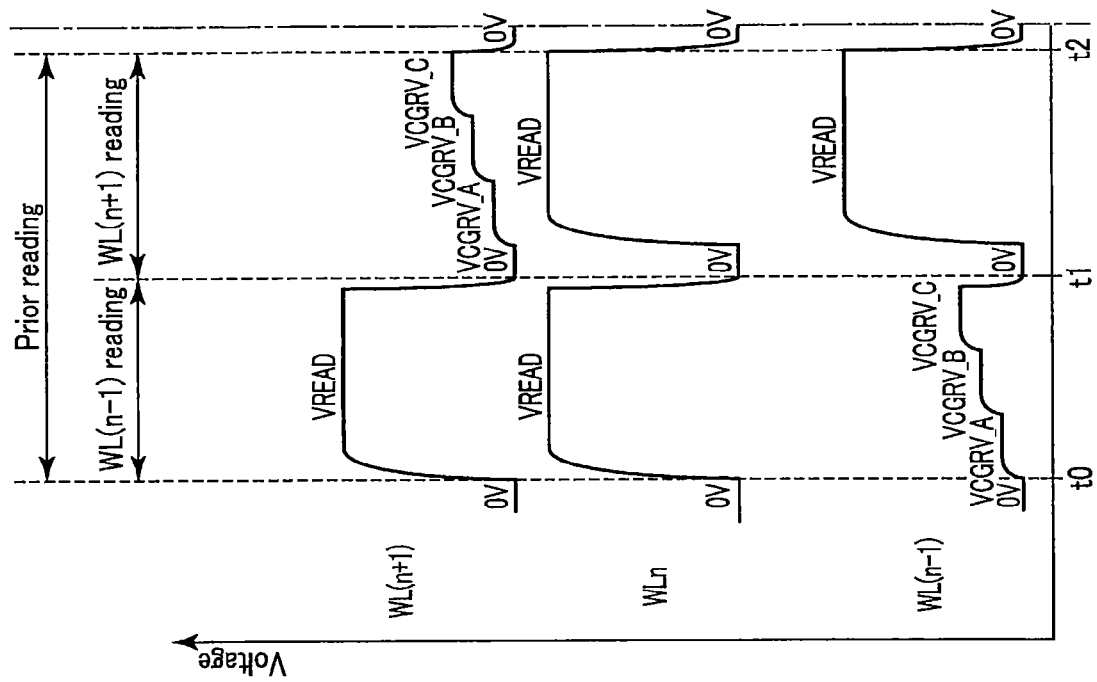

The read operation according to the present embodiment is described with reference to FIG. 45A and FIG. 45B. FIG. 45A and FIG. 45B are timing charts showing the potential changes of the word lines WLn, WL(n+1), and WL(n−1) in the read operation AR during the prior-reading and the main-reading according to the present embodiment. FIG. 45A shows a time period from t0 to t2, and FIG. 45B shows a time period from t3 succeeding time t2 to t20.

As shown, the present embodiment is different from FIG. 8 and FIG. 18 described in the first and second embodiments in the following points:

(1) In the prior-reading, not only the data held in the word line WL(n+1) but also the data held in the word line WL(n−1) is read.

(2) In the read operation AR in the main-reading, the voltages VREAD'_E, VREADLA_A, VREADLA_B, and VREADLA_C are sequentially applied not only to the word line WL(n+1) but also to the word line WL(n−1).

Details are described below.

As shown in FIG. 45A, the sequencer 16 first performs the prior-reading (times t0 to t2). In the prior-reading, the row decoder 12 selects the word line WL(n−1) and then sequentially applies the voltages VCGRV_A, VCGRV_B, and VCGRV_C to WL(n−1). At the same time, the voltage VREAD is applied to the unselected word lines WL. The row decoder 12 then selects the word line WL(n+1) and then sequentially applies the voltages VCGRV_A, VCGRV_B, and VCGRV_C to WL(n+1).

As a result of the above read operation, data in all the memory cell transistors MT connected to the word lines WL(n−1) and WL(n+1) in the selected finger FNG are determined, and held in, for example, the sense amplifier 13 or the sequencer 16.

The word lines WL(n−1) and WL(n+1) may be selected in reverse order.

The sequencer 16 then performs the main-reading (upper bit reading). In the example shown in FIG. 45B, reading to specify the bit which holds the "E"-level (read operation AR) is first performed.

In the read operation AR, the row decoder 12 first applies the voltage VCGRV_A (e.g., VA) to the selected word line WLn, and applies the voltage VREAD'_E to the unselected word line WL(n−1). In this state, the row decoder 12 sequentially applies the voltages VREAD'_E, VREADLA_A, VREADLA_B, and VREADLA_C to the unselected word lines WL(n+1) (the respective periods are referred to as periods AR1, AR2, AR3, and AR4, and these periods are collectively referred to as a period AR_E).

In the period AR_E, the bit in which the word line WL(n−1) is at the "E"-level is read. That is to say, in the period AR1, the bit whose two adjacent bits on the source side and drain side are at the "E"-level is read. In the period AR2, the bit whose adjacent bit on the source side is at the "E"-level and whose adjacent bit on the drain side is at the "A"-level is read. Moreover, in the period AR3, the bit whose adjacent bit on the source side is at the "E"-level and whose adjacent bit on the drain side is at the "B"-level is read. In the period AR4, the bit whose adjacent bit on the source side is at the "E"-level and whose adjacent bit on the drain side is at the "C"-level is read.

Furthermore, in the read operation AR, the row decoder 12 maintains the voltage of the selected word line WLn as it is, and at the same time steps up the voltages of the unselected word lines WL(n−1) to VREADLA_A. In this state, the row decoder 12 sequentially applies the voltages VREAD'_E, VREADLA_A, VREADLA_B, and VREADLA_C to the unselected word lines WL(n+1) (the respective periods are referred to as periods AR5, AR6, AR7, and AR8, and these periods are collectively referred to as a period ARA).

In the period AR_A, the bit in which the word line WL(n−1) is at the "A"-level is read. That is to say, in the period AR5, the bit whose adjacent bit on the source side is at the "A"-level and whose adjacent bit on the drain side is at the "E"-level is read. In the period AR6, the bit whose two adjacent bits on the source side and drain side are at the "A"-level is read. In the period AR7, the bit whose adjacent bit on the source side is at the "A"-level and whose adjacent bit on the drain side is at the "B"-level is read. In the period AR8, the bit whose adjacent bit on the source side is at the "A"-level and whose adjacent bit on the drain side is at the "C"-level is read.

Furthermore, in the read operation AR, the row decoder 12 maintains the voltage of the selected word line WLn as it is, and at the same time steps up the voltages of the unselected word lines WL(n−1) to VREADLA_B. In this state, the row decoder 12 sequentially applies the voltages VREAD'_E, VREADLA_A, VREADLA_B, and VREADLA_C to the unselected word lines WL(n+1) (the respective periods are referred to as periods AR9, AR10, AR11, and AR12, and these periods are collectively referred to as a period AR_B).

In the period AR_B, the bit in which the word line WL(n−1) is at the "B"-level is read. In the periods AR9 to AR12, the bits whose adjacent bit on the drain side are at the "E"-level, "A"-level, "B"-level, and "C"-level are read.

Furthermore, in the read operation AR, the row decoder 12 maintains the voltage of the selected word line WLn as it is, and at the same time steps up the voltages of the unselected word lines WL(n−1) to VREADLA_C. In this state, the row decoder 12 sequentially applies the voltages VREAD'_E, VREADLA_A, VREADLA_B, and VREADLA_C to the unselected word lines WL(n+1) (the respective periods are referred to as periods AR13, AR14, AR15, and AR16, and these periods are collectively referred to as a period AR_C).

In the period AR_C, the bit in which the word line WL(n−1) is at the "C"-level is read. In in the periods AR13 to AR16, the bits whose adjacent bits on the drain side are at the "E"-level, "A"-level, "B"-level, and "C"-level are read.

Consequently, the bits having the "E"-level are specified in the page targeted for reading.

The sequencer 16 then specifies the bit holding the "C"-level (read operation CR). That is to say, in accordance with an instruction from the sequencer 16, the row decoder 12 applies VCGRV_C to the selected word line WLn, and applies VREAD to WL(n−1) and WL(n+1).

Regardless of the result of the prior-reading, the sense amplifier 13 then senses and strobes data for all the columns while VREAD is applied to the word lines WL(n−1) and WL(n+1).

Although the inter-cell interference is not canceled in the read operation CR (VREAD is applied to WL(n+1)) in the case shown in this example, the voltage VREADLA may be applied to the word line WL(n+1) as has been described with reference to FIG. 8 and FIG. 18 as in the first embodiment. Although VREAD is higher than VREAD'_E and lower than VREADLA_A as described above in the case shown in the example of FIG. 45, the relation may be, for example, VREAD=VREADLA_C, or may be VREAD<VREADLA_C or VREAD>VREADLA_C.

The lower bit reading is similar to the read operation BR described in the first or second embodiment.

Figure 46:
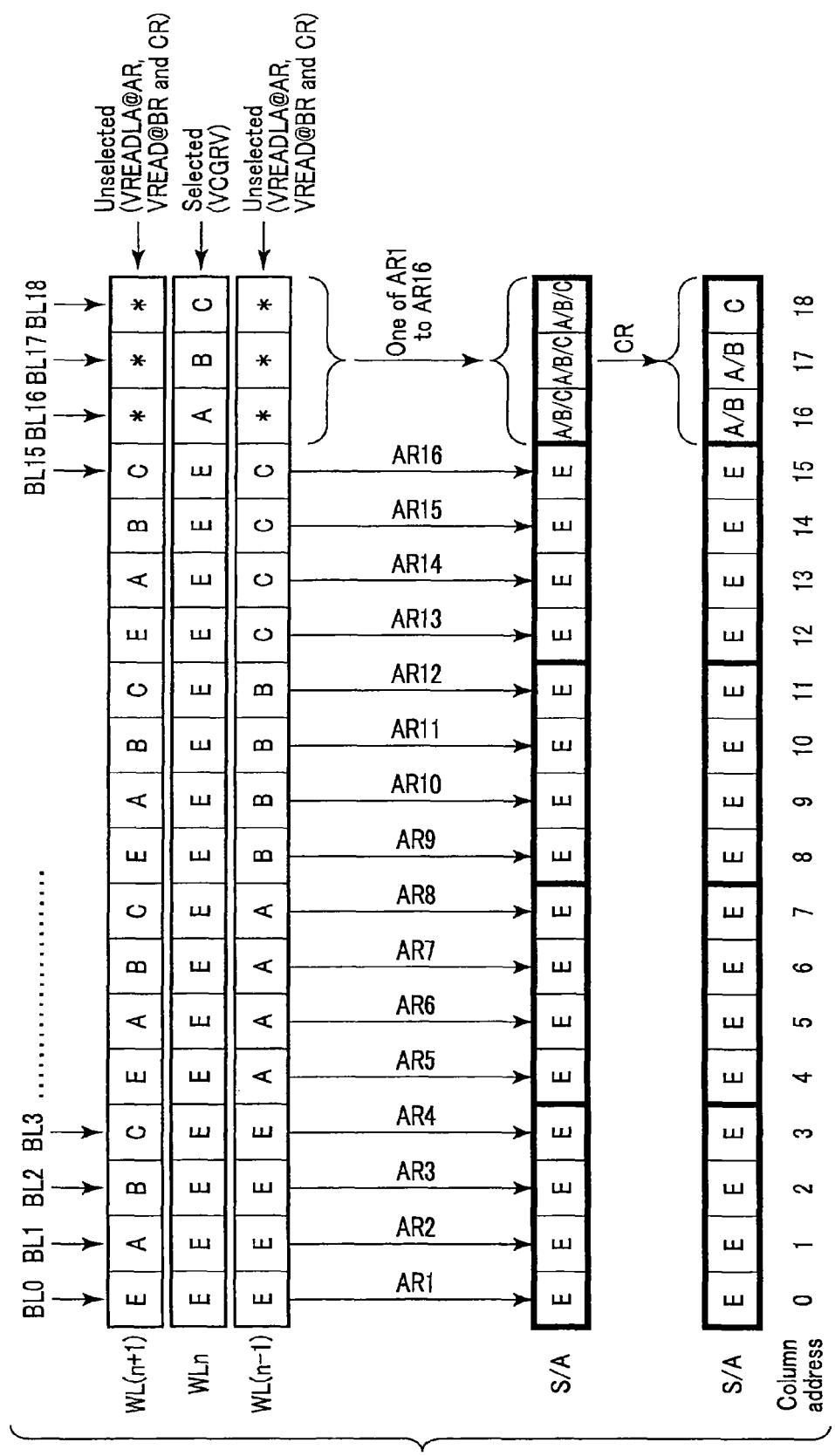
FIG. 46 is a schematic diagram showing page data and data fixed in a latch circuit in a sense amplifier during upper bit reading of the semiconductor memory device according to the sixth embodiment.

A specific example of the above operation is described with reference to FIG. 46. FIG. 46 is a schematic diagram showing page data corresponding to the word lines WL(n−1), WLn, and WL(n+1) and data determined by the latch circuit in the sense amplifier 13 in the read operation AR. In the case assumed in FIG. 46, for simplification of explanation, one page is composed of 19 memory cell transistors. The memory cell transistors MT connected to the bit lines BL0 to BL18 or the data held in the memory cell transistors MT are referred to as a bit 0 to a bit 18. The page data targeted for reading is "EEEEEEEEEEEEEEEEABC".

As shown, as a result of the prior-reading, page data corresponding to the word line WL(n−1) is "EEEE-AAAABBBBCCCC***". The mark * in FIG. 46 indicates that any one of the "E"-level, the "A"-level, the "B"-level, and the "C"-level is acceptable. Page data corresponding to the word line WL(n−1) is "EABCEABCEABCEABC***".

As shown in FIG. 46, data of the bit 0 to 15 is determined in the periods AR1 to AR16. Further, in the periods AR1 to AR16, no cell currents flow through the bit lines BL16 to BL18. As a result, the bits 16 to 18 are determined to be equal to or more than the "A"-level. The bits 16 to 18 are determined to be equal to or more than the "A"-level in one of the periods AR1 to AR16 in accordance with the adjacent bits on the source side and drain side.

The sequencer 16 then specifies the bit holding the "C"-level (read operation CR). That is to say, in accordance with an instruction from the sequencer 16, the row decoder 12 applies VCGRV_C to the selected word line WLn, and applies VREAD to WL(n−1) and WL(n+1). Accordingly, cell currents flow through the bit lines BL16 and BL17, and no cell current flows through the bit line BL18. Thus, the bit 18 is determined to be at the "C"-level, and the bits 16 and 17 are determined to be at either the "A"-level or the "B"-level.

6.2 Advantageous Effects According to the Present Embodiment

The configuration according to the present embodiment can further improve the reliability of data reading. This advantageous effect is described in detail below.

FIG. 47 shows the changes of the threshold distributions of the word lines WL(n−1), WLn, and WL(n+1) during data writing.

As shown, data is first written into the word line WL(n−1). Thus, the threshold level of the adjacent word line WLn rises (shaded areas in FIG. 47).

Data is then written into the word line WLn. Subsequently, data is written into the word line WL(n+1). Accordingly, the threshold levels of the adjacent word lines WLn and unshown WL(n+2) rise due to the inter-cell interference.

The spread of the threshold distribution of the "E"-level is not only affected by the writing in the word line WL(n+1) but also affected by the writing in the word line WL(n−1). Further, the memory cell transistor MT at the "E"-level is also disturbed during reading. Therefore, the threshold distribution tends to rise in the memory cell transistor MT in an erased state during both writing and reading.

Therefore, according to the present embodiment, when the bit having the "E"-level is specified (read operation AR), the read operation for the word line WLn is performed in consideration of the influence on not only the word line WL(n+1) but also WL(n−1). That is to say, in the prior-reading, data is also previously read from the word line WL(n−1). When data is read from the word line WLn, a suitable voltage VREADLA is also applied to not only the word line WL(n+1) but also WL(n−1). Thus, it is possible to offset the inter-cell interference associated with the word line WL(n−1) and improve the reading accuracy of the "E"-level.

In the example of FIG. 45A, FIG. 45B, and FIG. 46, all the combinations of the thresholds that can be taken by the word lines WL(n+1) and WL(n−1) are taken into consideration. However, it is not always necessary to take all the combinations into consideration.

FIG. 48 shows such an example. FIG. 48 is a timing chart showing the potential changes of the word lines WLn, WL(n+1), and WL(n−1) during the upper bit reading in the prior-reading and the main-reading according to a modification of the present embodiment, and corresponds to FIG. 45 described above.

As shown in FIG. 48, in this example, VCGRV_B alone is used as a read voltage in the prior-reading for the word line WL(n−1). That is to say, for the word line WL(n−1), information indicating whether the bit is less than or equal to the "A"-level or is equal to or more than the "B"-level is obtained.

Subsequently, the prior-reading for the word line WL(n+1) is performed. In this instance as well, VCGRV_B alone is used as a read voltage. Therefore, for the word line WL(n+1) as well, information indicating whether the bit is equal to or more than the "A"-level or is less than or equal to the "B"-level is obtained.

The main-reading is then performed. In the example of FIG. 48, reading to specify the bit which holds the "E"-or "A"-level (read operation AR_EA) is first performed.

In the read operation AR_EA, the row decoder 12 first applies the voltage VCGRV_A to the selected word line WLn, and applies the voltage VREADLA_EA to the unselected word line WL(n−1). In this state, the row decoder 12 sequentially applies the voltages VREADLA_EA and VREADLA_BC to the unselected word lines WL(n+1) (the respective periods are referred to as periods AR1 and AR2).

In the period AR1, the bit whose two adjacent bits on the source side and drain side are at the "E"-or "A"-level is read. In the period AR2, the bit whose adjacent bit on the source side is at the "E"-or "A"-level and whose adjacent bit on the drain side is at the "B"-or "C"-level is read.

Subsequently, reading to specify the bit which holds the "B"-or "C"-level (read operation AR_BC) is performed.

In the read operation AR_BC, the row decoder 12 maintains the voltage of the selected word line WLn at VCGRV_A, and at the same applies the voltage VREADLA_BC to the unselected word line WL(n−1), and sequentially applies the voltages VREADLA_EA and VREADLA_BC to the unselected word lines WL(n+1) (the respective periods are referred to as periods AR3 and AR4).

In the period AR3, the bit whose adjacent bit on the source side is at the "B"-or "C"-level and whose adjacent bit on the drain side is at the "E"-or "A"-level is read. In the period AR4, the bit whose two adjacent bits on the source side and drain side are at the "B"-or "C"-level is read.

The sequencer 16 then specifies the bit holding the "C"-level (read operation CR). The read operation CR is similar to that in the example of FIG. 45 and is therefore not described. Although VREAD is higher than VREADLA_EA and lower than VREADLA_BC as described above in the case shown in the example of FIG. 48, VREAD may have the same value as, for example, VREADLA_EA or VREADLA_BC.

Figure 49:
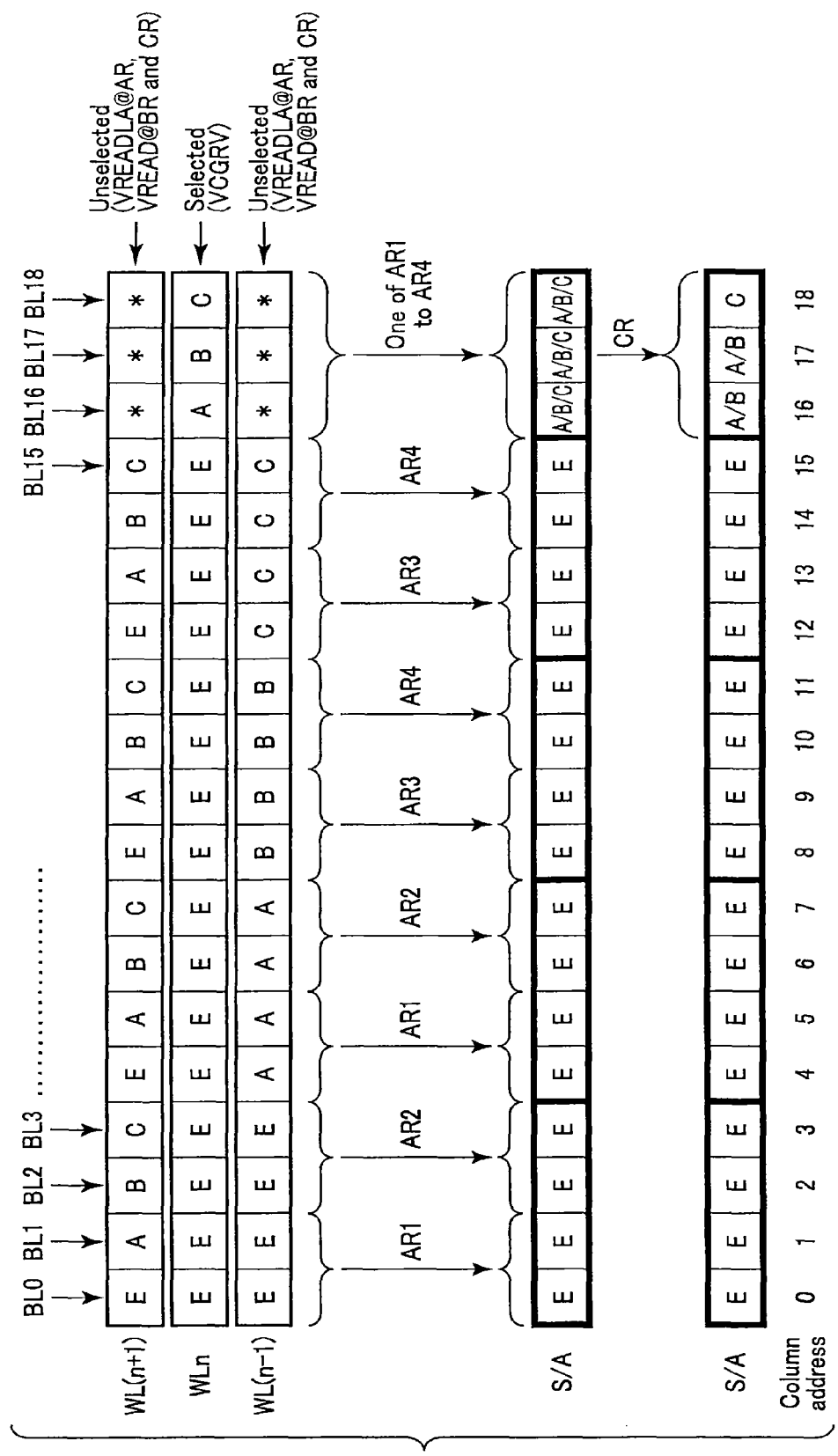
FIG. 49 is a schematic diagram showing page data and data fixed in a latch circuit in a sense amplifier during upper bit reading of the semiconductor memory device according to a modification of the sixth embodiment.

A specific example of the above is shown in FIG. 49. FIG. 49 corresponds to FIG. 46 described in the previous embodiment. As shown, data in the bits 0, 1, 4, and 5 whose adjacent bits on the source side and drain side are at the "E"-or "A"-level are determined in the period AR1. Data in the bits 2, 3, 6, and 7 whose adjacent bits on the source side are at the "E"-or "A"-level and whose adjacent bits on the drain side are at the "B"-or "C"-level are determined in the period AR2. The same applies to the following. The same also applies to the bits 16 to 18. For example, when the data in the word lines WL(n−1) and WL(n+1) are at the "E"-or "A"-level in the bit 16, the bit 16 is determined to be equal to or more than the "A"-level in the period AR1. When the data in the word line WL(n−1) is at the "E"-level or the "A"-level and the data in the word line WL(n+1) is at the "B"-level or the "C"-level, the bit 16 is determined to be equal to or more than the "A"-level in the period AR2.

The bit having the "E"-level may be specified in the method described above. In this example, it is considered that the inter-cell interference caused when the neighboring bits are at the "E"-level is substantially equal to the inter-cell interference caused when the neighboring bits are at the "A"-level, and that the inter-cell interference caused when the neighboring bits are at the "B"-level is substantially equal to the inter-cell interference caused when the neighboring bits are at the "C"-level. Based on this concept, the correction amounts of the inter-cell interference when the neighboring bits are at the "E"-level and the "A"-level are equalized, and the correction amounts of the inter-cell interference when the neighboring bits are at the "B"-level and the "C"-level are equalized. Thus, the number of sense/strobe operations in the operation AR for determining the "E"-level can be reduced to one fourth of that in the case of FIG. 45A and FIG. 45B, and the data reading speed can be improved.

This concept may be applied to the main-reading. That is to say, in the main-reading as well, the degree of correction may be equal when the neighboring bits are at the "E"-level and the "A"-level, and the degree of correction may be equal when the neighboring bits are at the "B"-level and the "C"-level. In this case, the prior-reading for the word line WL(n+1) described with reference to FIG. 48 is similar to that performed for the word line WL(n−1) (the voltage VCGRV_B alone is used).

In FIG. 48 and FIG. 49, the correction amount of the inter-cell interference is changed in accordance with the standard of whether the neighboring bits are less than or equal to the "A"-level or equal to or more than the "B"-level. However, any standard may be used. For example, the inter-cell interference is the greatest when the neighboring bits are at the "C"-level. Therefore, the correction amount may be changed in accordance with the standard of whether the neighboring bits are less than or equal to the "B"-level or are at the "C"-level or whether the neighboring bits are at the "E"-level or are equal to or more than the "A"-level. The same also applies to the main-reading.

7. Seventh Embodiment

Now, a semiconductor memory device according to a seventh embodiment is described. The present embodiment relates to a configuration to efficiently discharge a voltage of the bit line after data writing, reading, and erasing in the first to sixth embodiments. The differences between the present embodiment and the first to sixth embodiments are only described below.

7.1 Regarding Configuration of Memory Cell Array

The configuration of the memory cell array 11 of the NAND flash memory 10 according to the present embodiment is first described with reference to FIG. 50. FIG. 50 is a block diagram of the NAND flash memory 10 according to the present embodiment.

As shown, the memory cell array 11 according to the present embodiment further comprises a discharge block BKL_BLSRC in the configuration described with reference to FIG. 1 in the first embodiment. The discharge block BKL_BLSRC is not a block to store data but a block to provide a current path for releasing the charge in the bit line BL to the source line SL.

The block BKL_BLSRC comprises discharge fingers FNG_BLSRC (FNG_BLSRC0, FNG_BLSRC1, FNG_BLSRC2, . . . ). The finger FNG_BLSRC is substantially similar in configuration to a finger FNG included in a normal block, and is a set of NAND strings.

FIG. 51 and FIG. 52 are a circuit diagram and a sectional view of the blocks BLK and BKL_BLSRC, and show a configuration corresponding to one bit line BL. For simplification of explanation, one NAND string includes four memory cell transistors MT in the case of FIG. 51 and FIG. 52.

As shown, in the NAND string of the finger FNG according to the present embodiment, the selection transistor ST2 includes two selection transistors ST2a and ST2b. The selection transistor ST2b is a transistor which uses the lowermost interconnect layer 27 shown in FIG. 52 as a gate, and is connected in common between the fingers FNG and also connected to a selection gate line SGSB. The selection transistor ST2a is a transistor which uses the upper three interconnect layers 27 shown in FIG. 52 as a gate, and is independently controlled in each of the fingers FNG. In this example, a dummy transistor DTD is provided between the selection transistor ST1 and the memory cell transistor MT3, and a dummy transistor DTS is provided between the selection transistor ST3a and the memory cell transistor MT0. This configuration is also applicable to the first to sixth embodiments. The gates of the dummy transistors DTD and DTS are respectively connected to dummy word lines WLDD and WLDS, and the potentials of the dummy word lines WLDD and WLDS are controlled by the row decoder 12.

The discharge finger FNG_BLSRC also has a configuration substantially similar to that of the finger FNG. In the finger FNG_BLSRC, the gate of the selection transistor ST1 is connected to a selection gate line SGD_BLSRC, and the gates of the selection transistors ST2a and ST2b are connected to selection gate lines SGS_BLSRC and SGSB_BLSRC. The selection gate line SGS_BLSRC connects the fingers FNG_BLSRC in common. The gates of the memory cell transistors MT0 to MT3 are connected in common to a word line WL_BLSRC. The gates of the dummy transistors DTD and DTS are respectively connected to dummy word lines WLDD_BLSRC and WLDS_BLSRC. The potentials of these interconnects are also controlled by the row decoder 12.

FIG. 53 is a plan layout view of the memory cell array 11, the row decoder 12, and the sense amplifier 13. As shown, in the memory cell array 11, the blocks BLK are arrayed in a first direction, and the sense amplifier 13 is disposed adjacent to the memory cell array 11 in the first direction. In the memory cell array 11, the finger FNG_BLSRC is disposed at a position farthest from the sense amplifier 13. These blocks BLK and blocks BLK_BLSRC are connected in common by the bit line BL provided along the first direction, and are further connected to the sense amplifier 13. The row decoder 12 is provided at a position across both sides of the memory cell array 11 along a second direction. The word lines WL and WL_BLSRC, the dummy word lines WLDD, WLDS, WLDD_BLSRC, and WLDS_BLSRC, and the selection gate lines SGD, SGS, SGSB, SGD_BLSRC, SGS_BLSRC, and SGSB_BLSRC are provided along the second direction that intersects at right angles with the first direction. These interconnects are connected to a CG interconnect line along the first direction via the row decoder 12.

Figure 54A:
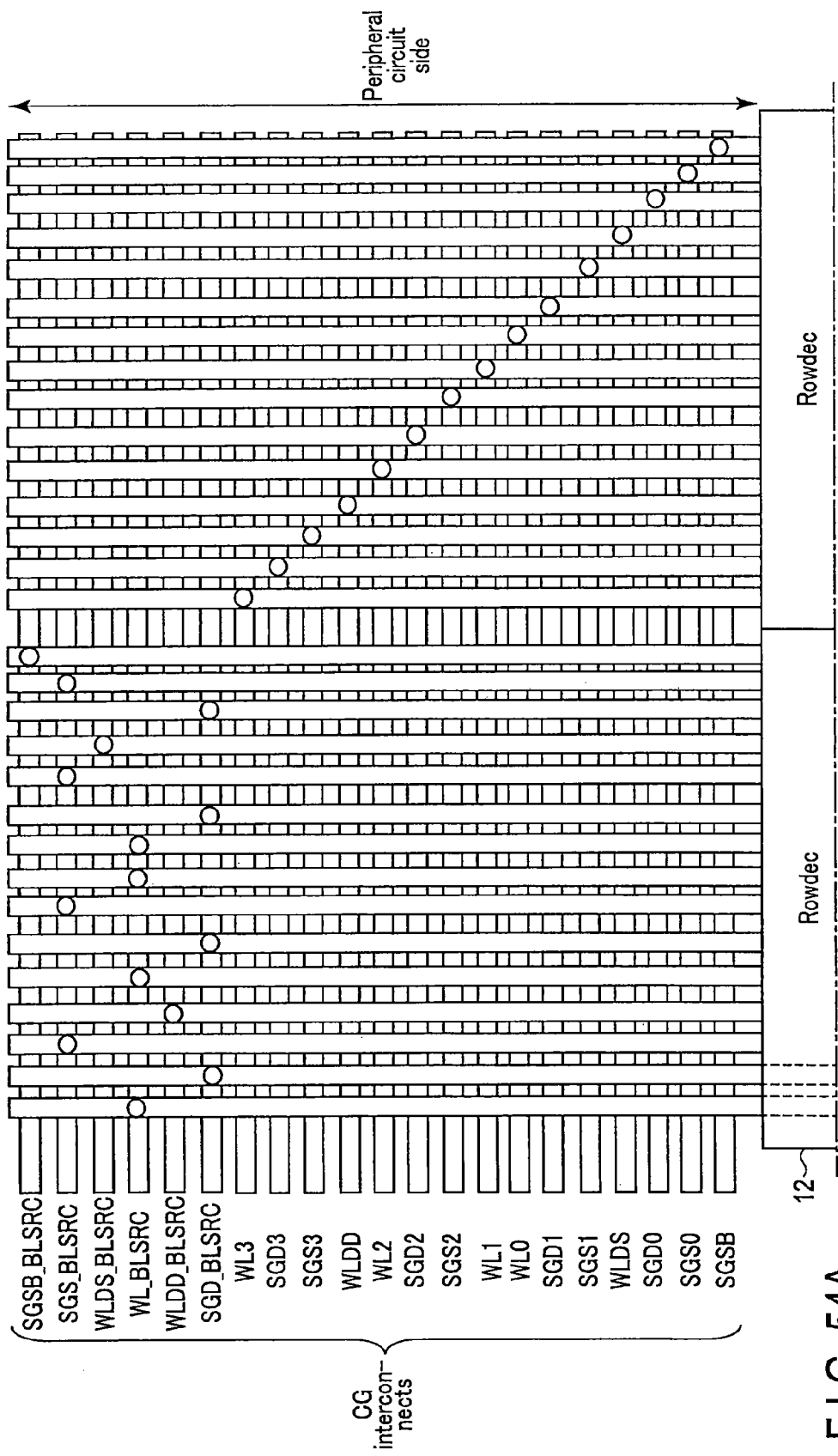

FIG. 54A and FIG. 54B is a plan view of an area A1 in FIG. 53. FIG. 54A shows the interconnects in one side of the row decoder 12 and FIG. 54B shows the interconnects in another side of the row decoder 12. As shown, each interconnect is separated into the memory cell array 11 side and the peripheral circuit side across the row decoder 12, and the row decoder 12 connects or disconnects the two sides in accordance with an address received from the controller. On the peripheral circuit side, each interconnect is connected to the CG interconnect by the contact plug, and is connected to an unshown driver circuit via the CG interconnect. The driver circuit selects a necessary voltage and applies the voltage to each CG interconnect.

7.2 Regarding Write Operation

Figure 55:
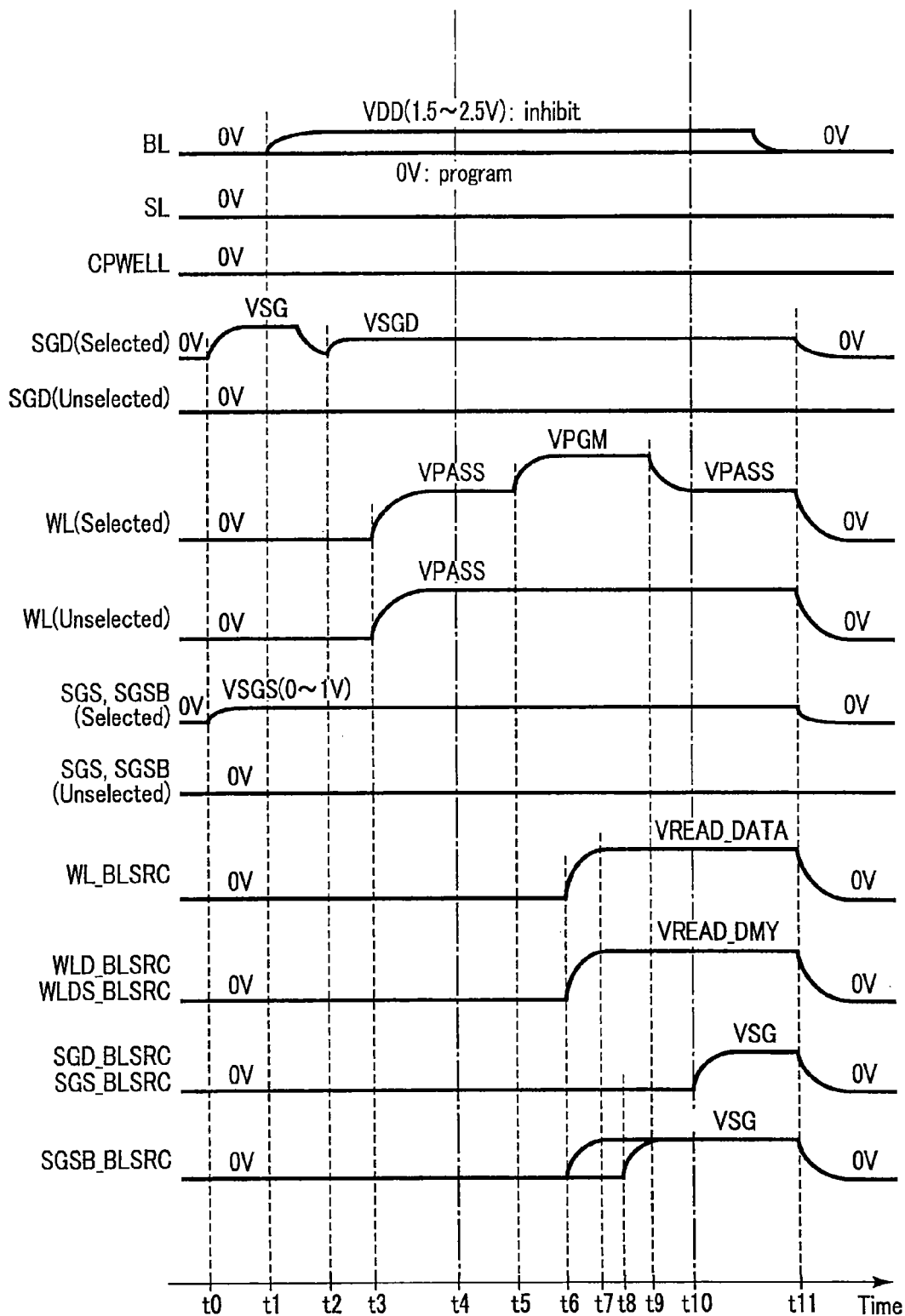
FIG. 55 and FIG. 56 are timing charts of various signals during data writing and reading of the semiconductor memory device according to the seventh embodiment, respectively.

Now, a write operation according to the present embodiment is described with reference to FIG. 55. FIG. 55 is a timing chart showing the potential changes of various interconnects during writing.

As shown, at a time t0, the row decoder 12 applies the voltage VSG to the selection gate line SGD of the selected finger FNG. The voltage VSG is a voltage to switch on the selection transistor ST1.

The sense amplifier 13 applies 0 V to the bit line BL which has not yet passed a program-verification, and applies the voltage VDD to the bit line BL which has already passed a program-verification and to the unselected bit lines BL (time t1). The selection transistor ST1 transfers these voltages to the source from the drain.

Subsequently, at a time t2, the row decoder 12 reduces the potential of the selection gate line SGD to VSGD. That is, VSG is lower than VSGD. As a result, the selection transistor ST1 corresponding to the bit line BL which has already passed a verification and to the unselected bit lines BL (i.e., the bit lines to which VDD is applied) is cut off.

The row decoder 12 then applies the voltage VPASS to the selected word line, the unselected word line, and the dummy word lines WLDD and WLDS (time t3). The potential of the unselected word line is then raised to VPGM, so that the program operation is performed (time t5).

On the other hand, the selection transistor ST1 is cut off in the NAND string corresponding to the bit line BL which has already passed a verification and to the unselected bit lines BL, so that the channel is electrically floating. As a result, the potential of the channel rises due to the coupling with the word line, and programming is forbidden.

At a time t6 of the program period, the row decoder 12 applies a voltage VREAD_DATA to the word line WL_BLSRC, applies a voltage VREAD_DMY to WLDD_BLSRC and WLDS_BLSRC, and applies the voltage VSG to the selection gate line SGSB_BLSRC.

At a time t10 when the program operation has finished and the potential of the word line WL decreases to VPASS, the row decoder 12 then applies the voltage VSG to the selection gate lines SGD_BLSRC and SGS_BLSRC. As a result, a current path which reaches the source line SL from the bit line BL is formed in each of the fingers FNG_BLSRC0 to FNG_BLSRC3 shown in FIG. 51, and the potential of the bit line BL is discharged to 0 V.

The timing for applying the voltage VSG to a selection gate line SGSB_BLSRC may be a time t8 after the voltage VREAD_DATA is applied to the word line WL_BLSRC and before the voltage VSG is applied to the selection gate lines SGD_BLSRC and SGS_BLSRC.

7.3 Regarding Read Operation

Figure 56:
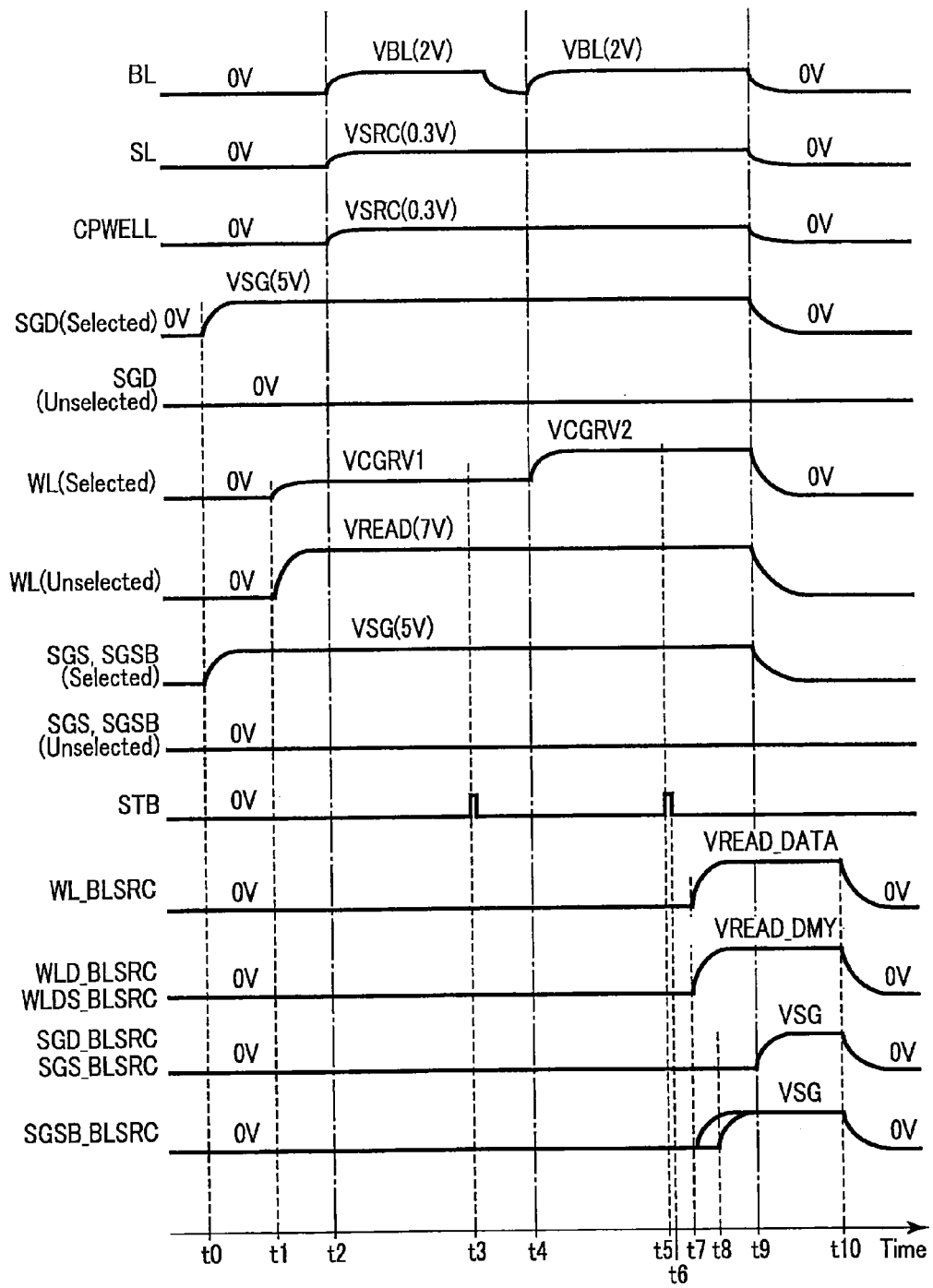

Now, a read operation according to the present embodiment is described with reference to FIG. 56. FIG. 56 is a timing chart showing the potential changes of various interconnects during reading. In the case shown, reading is continuously performed at two read levels (e.g., the read operations AR and CR of the main-reading in FIG. 8). For simplification of explanation, VREADLA is not shown.

As shown, at a time t0, the row decoder 12 applies the voltage VSG to the selection gate lines SGD, SGS, and SGSB of the selected finger FNG. Subsequently, the row decoder 12 applies a voltage VCGRV1 (e.g., the voltage VA) to the word line WL, and applies the voltage VREAD (e.g., 7 V) to the unselected word lines WL. The voltage VREADLA is applied to the word line adjacent to the selected word line on the drain side among the unselected word lines.

At a time t2, the sense amplifier 13 then precharges the bit line BL to the voltage VBL (e.g., 2 V). At the same time, the source line driver 14 and the well driver 15 apply voltages VSRC (e.g., 0 to 0.3 V) to the source line SL and a p-type well region 20, respectively.

The sense amplifier 13 then senses, for example, the cell current flowing through the bit line BL, and the sequencer 16 brings a signal STB to the "H"-level at a certain timing, so that the sense amplifier 13 strobes read data (time t3). The bit line BL in which the memory cell transistor MT has been judged to be switched on as a result of the strobing of the data is fixed at a constant potential by, for example, the sense amplifier 13.

Subsequently, at a time t4, the row decoder 12 sets the voltage to be applied to the selected word line WL to a voltage VCGRV2 (e.g., the voltage VC). The signal STB is also set to the "H"-level at a time t5, so that data is strobed.

After the strobing of the data (after STB is set to "L"), the row decoder 12 applies the voltage VREAD_DATA to the word line WL_BLSRC, applies the voltage VREAD_DMY to WLDD_BLSRC and WLDS_BLSRC, and applies the voltage VSG to the selection gate line SGSB_BLSRC.

At a time t9 when the read operation has finished, the row decoder 12 applies the voltage VSG to the selection gate lines SGD_BLSRC and SGS_BLSRC. As a result, a current path which reaches the source line SL from the bit line BL is formed in the fingers FNG_BLSRC0 to FNG_BLSRC3 shown in FIG. 51, and the potential of the bit line BL is discharged to 0 V.

The timing for applying the voltage VSG to the selection gate line SGSB_BLSRC may be a time t8 after the voltage VREAD_DATA is applied to the word line WL_BLSRC and before the voltage VSG is applied to the selection gate lines SGD_BLSRC and SGS_BLSRC as in writing.

7.4 Advantageous Effects According to the Present Embodiment

The configuration according to the present embodiment can improve the operating speed of the NAND flash memory. This advantageous effect is described below.

FIG. 57 is an equivalent circuit diagram of the bit line BL and the sense amplifier according to the present embodiment. As shown, a parasitic resistance Rparas exists in the bit line BL, and the block BLK connected to the bit line BL has a parasitic capacitance Cparas. Therefore, the parasitic resistance Rparas increases if the number of blocks BLK is increased for higher memory capacity, and the parasitic capacitance Cparas increases if the number of stacked memory cells is increased for a higher degree of integration without the increase in the number of blocks. If the parasitic resistance Rparas and the parasitic capacitance Cparas increase, it takes more time to discharge the bit line.

In the NAND flash memory, a recovery operation to discharge the bit line BL to bring the potential to 0 V is required after data writing and reading (and erasing). However, for the reasons described above, if the memory capacity is increased, the parasitic resistance and the parasitic capacitance Cparas increase, and the time required for recovery increases.

In this respect, according to the present embodiment, the bit line BL is discharged by the sense amplifier 13 and also discharged in the block BLK_BLSRC. As has been described with reference to FIG. 51, the discharge block BLK_BLSRC is substantially similar in configuration to the normal block BLK, and connects the bit line BL to the source line SL through current paths. The discharge block BLK_BLSRC is provided at a position far from the sense amplifier 13. In this case, it is possible to discharge electricity from both ends of the bit line BL.

Therefore, it is possible to quickly discharge the bit line BL, and reduce the time required for recovery. As a result, the operating speed of the NAND flash memory can be improved.

8. Modification, Etc.

As described above, a semiconductor memory device according to the embodiment includes a first memory cell, a second memory cell coupled to the first memory cell, a first word line (WLn in FIG. 8) coupled to the first memory cell, and a second word line (WL(n−1) in FIG. 8) coupled to the second memory cell. When data is read from the first memory cell, a first voltage (VCGRV_A in FIG. 8) and a second voltage (VCGRV_C in FIG. 8) different from the first voltage are applied to the first word line. A voltage (VREAD' and VREADLA in FIG. 8) applied to the second word line (WL(n+1)) changes a first number of times (AR1 to AR4 in FIG. 8) while the first voltage (VCGRV_A) is applied to the first word line (WLn), and the voltage (VREAD' and VREADLA) applied to the second word line (WL(n+1)) changes a second number of times different from the first number of times (CR1 to CR2 in FIG. 8) while the second voltage (VCGRV_C) is applied to the first word line (WLn). In other words, the threshold voltage of the first memory cell is compensated by controlling the value of the voltage (VREADLA) applied to the second word line when the threshold level of the second memory cell is higher than the threshold level of the first memory cell. In this way, the inter-cell interference is effectively suppressed, and the operating performance of the NAND flash memory can be improved.

Figure 60:
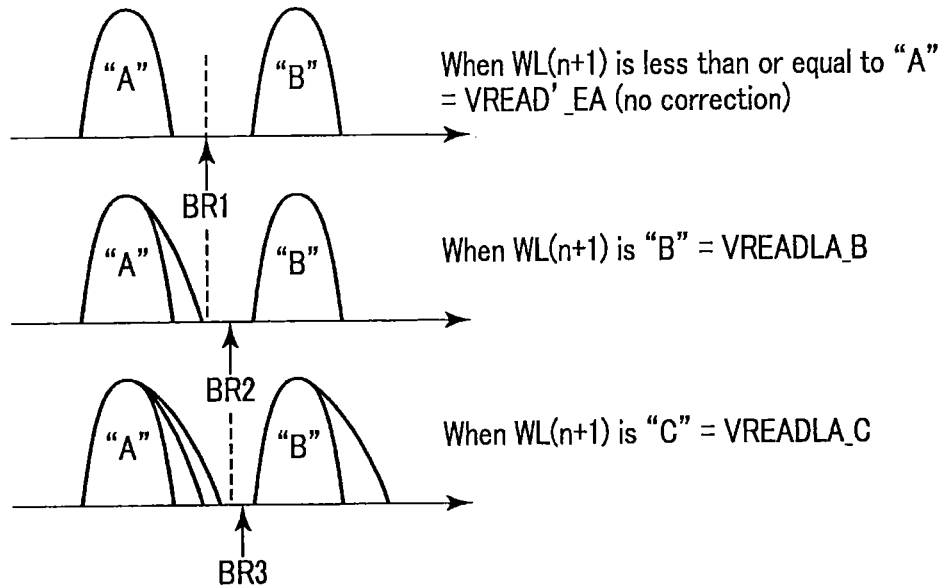

This situation is shown in FIG. 58 to FIG. 60. FIG. 58 to FIG. 60 are threshold distribution diagrams showing the concepts of the read operations AR, CR, and BR described in the first embodiment. As shown in FIG. 58, in the read operation AR, whether the threshold level is equal to or more than the "E"-level is judged. In this instance, there is no threshold variation caused by the inter-cell interference if the adjacent cell is at the "E"-level, so that the corrective reading is not performed (WLn-VREAD'_E). In contrast, if the adjacent cell is equal to or more than the "A"-level, the threshold of the "E"-level rises due to the inter-cell interference. The degree of the rise is the lowest when the adjacent cell is at the "A"-level, and the degree of the rise is the highest when the adjacent cell is at the "C"-level. Therefore, to correct the above, VREADLA_A, VREADLA_B, and VREADLA_C1 are applied to the word line WLn. As a result, judgment thresholds for the "E"-level and the "A"-level are substantially raised. In other words, the threshold distribution spread by the inter-cell interference can be the same as the distribution before spread.

FIG. 59 shows an example of CR. The "B"-level is subjected to the inter-cell interference only when the adjacent cell is written to the "C"-level. Therefore, the corrective reading is not performed when the adjacent cell is less than or equal to the "B"-level. When the adjacent cell is at the "C"-level, VREADLA_C2 is applied to WLn, so that the corrective reading is performed. The same also applies to BR shown in FIG. 60.

Figure 61:
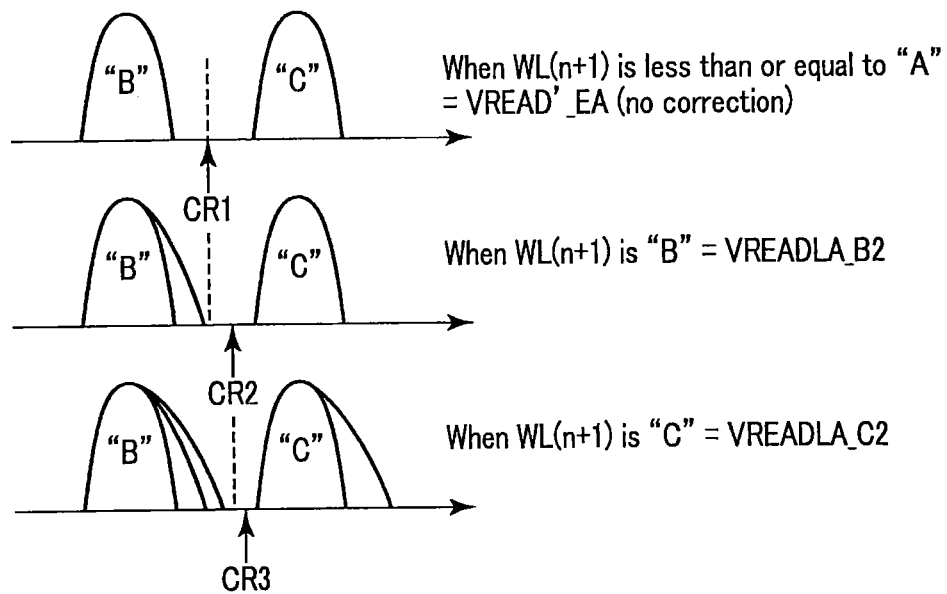
FIG. 61 and FIG. 62 are conceptual diagrams of corrective reading of the semiconductor memory device according to the second embodiment, respectively.
Figure 62:
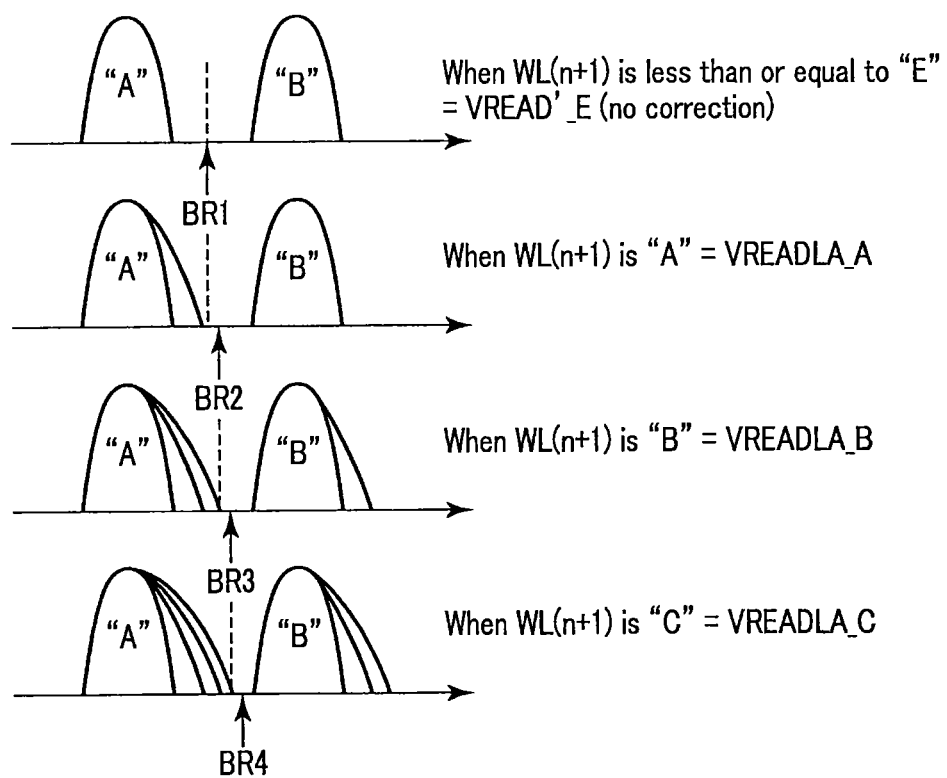

The controller may also compensate the threshold level of the first memory cell by controlling the value of the voltage (VREADLA) applied to the second word line when the data held in the second memory cell is the same as the data held in the first memory cell. This situation is shown in FIG. 61 and FIG. 62. FIG. 61 and FIG. 62 are threshold distribution diagrams showing the concepts of the read operations CR and BR described in the second embodiment. The read operation AR is similar to that in FIG. 58. As shown in FIG. 61, in the read operation CR, there is no threshold variation caused by the inter-cell interference if the adjacent cell is less than or equal to the "A"-level, so that the corrective reading is not performed (WLn=VREAD'_EA). In contrast, if the adjacent cell is equal to or more than the "B"-level, the threshold of the "B"-level rises due to the inter-cell interference. Therefore, to correct the above, VREADLA_B2 and VREADLA_C2 are applied to the word line WLn. As a result, judgment thresholds for the "B"-level and the "C"-level are substantially raised. In other words, the threshold distribution spread by the inter-cell interference can be the same as the distribution before spread. FIG. 62 shows an example of BR. As shown, in the BR, the corrective reading is performed when the adjacent cell is equal to or more than the "A"-level.

The same also applies to the third and fourth embodiments.

The embodiments are not limited to the above description, but can be variously modified, and can be suitably combined or independently carried out. For example, the configuration described in the seventh embodiment may be carried out independently of the first to sixth embodiments.

For example, in the lower bit reading described with reference to FIG. 10 in the first embodiment, the read operation using the voltage VCGRV_A in the prior-reading may be omitted. An example of this case is shown in FIG. 63. In the lower bit reading according to the first embodiment, VREADLA applied to the column whose adjacent bit is at the "E"-level and the column whose adjacent bit is at the "A"-level are not distinguished from each other. That is to say, it is only necessary to know whether the adjacent bit is less than or equal to the "A"-level, is at the "B"-level, or is at the "C"-level, and information indicating whether the adjacent bit is at the "E"-level or the "A"-level is not needed. Thus, reading that uses VCGRV_A may be omitted, which leads to a reduction in the time required for reading.

The layer dependence of VREAD_LA and VREAD' described in the fifth embodiment is not limited to the cases in FIG. 34 to FIG. 40. FIG. 64 shows a modification of the correction table described with reference to FIG. 36. As shown, the correction table may hold the correction amounts of VREADLA and VREAD'(or information regarding the values of VREADLA and VREAD') for each of the word lines WL. That is to say, the shape of the memory hole 26 may not necessarily be such a simple shape which decreases in diameter with the increase in depth. In this case, the layer dependence of VREADLA and VREAD' is also preferably controlled with accuracy per word line WL rather than monotonously decreasing or increasing with the depth.

Figure 65:
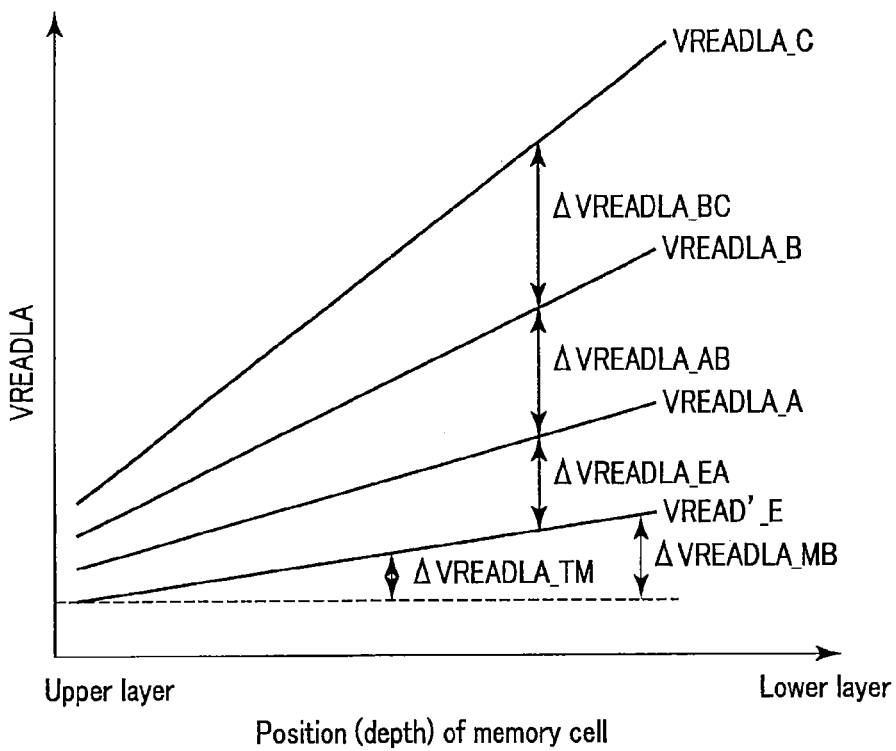
FIG. 65 is a graph showing layer dependence of the voltages VREADLA of the semiconductor memory device according to a modification of the fifth embodiment.

The layer dependence of VREADLA and VREAD' may also be as shown in FIG. 65. That is to say, the values of VREADLA and VREAD' increase as the position of the memory cell becomes deeper. The increase rate of VREADLA may be such that VREADLA_C is the highest and VREADLA_A is the lowest. This is because the influence of the inter-cell interference on the threshold is considered to be greatest during the writing to the "C"-level. The increase rate of VREAD' is lower than, for example, that of VREADLA_A.

Figure 66:
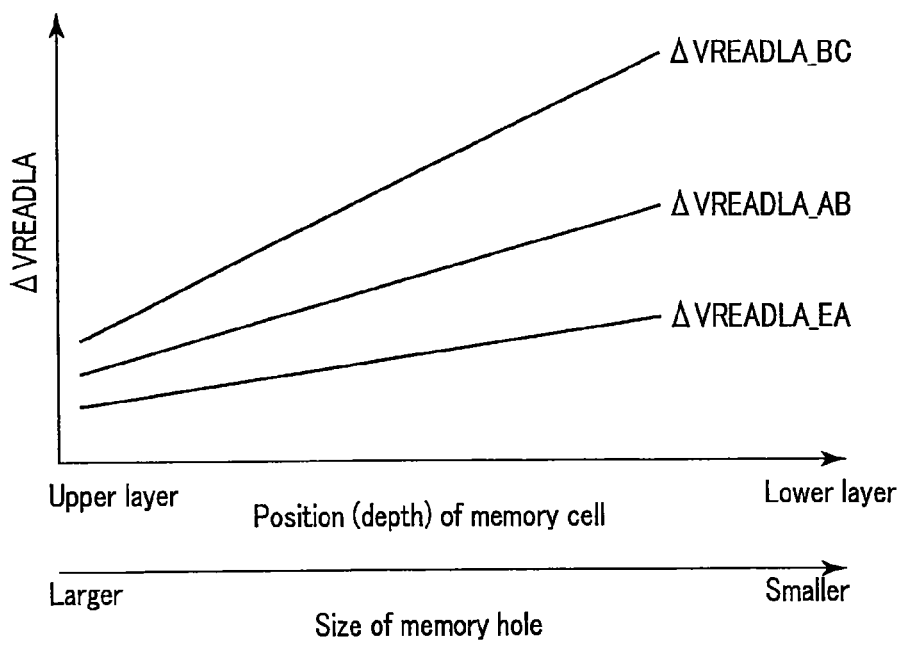
FIG. 66 is a graph showing layer dependence of change amounts of the voltages VREADLA of the semiconductor memory device according to the fifth embodiment.

That is to say, the difference ΔVREADLA_EA between VREAD'_E and VREADLA_A, the difference ΔVREADLA_AB between VREADLA_A and VREADLA_B, and the difference ΔVREADLA_BC between VREADLA_B and VREADLA_C may have layer dependence shown in FIG. 66. This layer dependence may be as size dependence of the memory hole 26 as shown in FIG. 66.

VREAD'_E may have layer dependence, or may decrease in value in the lower layers. That is to say, the difference ΔVREADLA_TM between VREAD'_E of the upper layer and VREAD'_E of the middle layer, and/or the difference ΔVREAD'_MB between VREAD'_E of the middle layer and VREAD'_E of the lower layer may be a positive value or a negative value. In the case of the negative value, VREAD'_E decreases in value in the lower layers. ΔVREADLA_TM and/or ΔVREADLA_MB may be zero. In this case, VREAD'_E does not have layer dependence.

Figure 67:
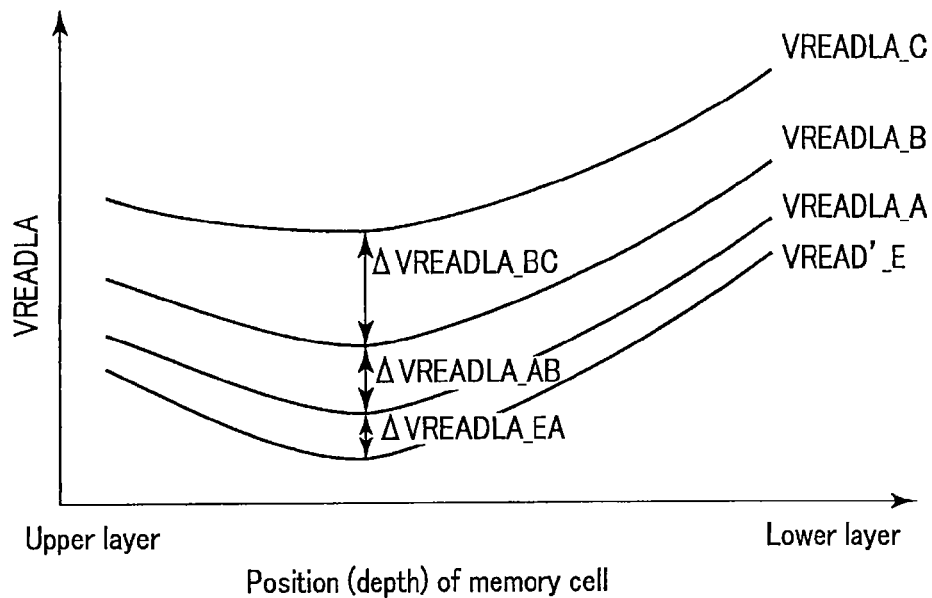
FIG. 67 is a graph showing layer dependence of the voltages VREADLA of the semiconductor memory device according to a modification of the fifth embodiment.
Figure 68:
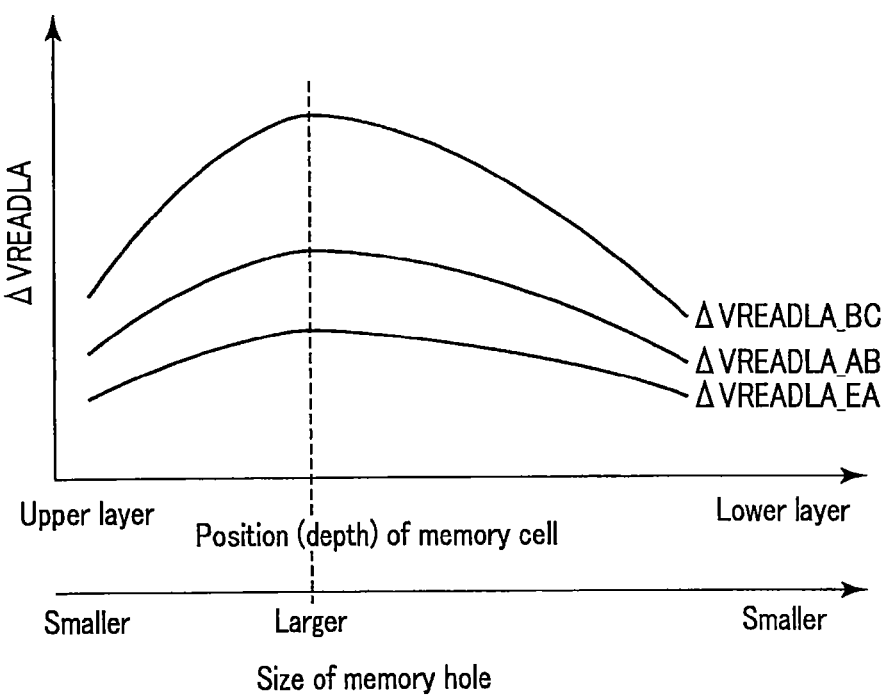
FIG. 68 is a graph showing layer dependence of change amounts of the voltages VREADLA of the semiconductor memory device according to the fifth embodiment.

The above relation also applies to the case in FIG. 41 to FIG. 44 described in the fifth embodiment. FIG. 67 shows the relation between VREADLA and VREAD' and the position of the memory cell when the values of the voltages VREADLA and VREAD' are higher at the position where the memory hole is larger in the example of FIG. 41. FIG. 68 shows the relation between ΔVREADLA and VREAD' and the position of the memory cell in FIG. 67.

As shown, in the example of FIG. 67 and FIG. 68, the diameter of the memory hole takes the maximum value in the middle layer, so that ΔVREADLA is also highest in the middle layer.

The graphs shown in FIG. 65 to FIG. 68 are by way of example only. The level relation between the depth and the voltage may be reversed, and the value of VREADLA can be set suitably in accordance with the characteristics of the memory cell transistor MT located in each layer.

Furthermore, the three-dimensionally stacked NAND flash memory has been described above by way of example in the embodiments. However, the present invention is also applicable to a planar NAND flash memory in which memory cell transistors having a MONOS structure are two-dimensionally arrayed on a semiconductor substrate. It should be understood that each memory cell transistor MT may have three or more bits of data, and the present invention is applicable to semiconductor memories in general in which the inter-cell interference is a problem.

It should be understood that the specific values of the voltages used in FIG. 28 and FIG. 33 are by way of example only, and the values are not limited to those shown in the drawings.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 µs to 38 µs, 38 µs to 70 µs, or 70 µs to 80 µs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 µs to 1800 µs, 1800 µs to 1900 µs, or 1900 µs to 2000 µs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 µs to 4000 µs, 4000 µs to 5000 µs, or 4000 µs to 9000 µs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell;
a second memory cell adjacent to the first memory cell;
a first word line coupled to the first memory cell; and
a second word line coupled to the second memory cell,
wherein when data is read from the first memory cell,
    a first voltage and a second voltage different from the first voltage are applied to the first word line,
    a voltage applied to the second word line changes a first number of times while the first voltage is applied to the first word line, and the voltage applied to the second word line changes a second number of times different from the first number of times while the second voltage is applied to the first word line,
    the first voltage is lower than the second voltage, and
    the first voltage of times is larger than the second number of times.

2. The device according to claim 1, wherein the second voltage is applied to the first word line subsequent to the first voltage.

3. The device according to claim 1, wherein the first voltage is applied to the first word line subsequent to the second voltage.

4. The device according to claim 1, further comprising:
a third memory cell coupled to the first word line;
a fourth memory cell adjacent to the third memory cell, the third memory cell being coupled to the second word line, wherein
when the data held in the first memory cell is read, data held in the third memory cell is also read,
data read from the first memory cell at a time when the voltage applied to the second word line is changed a third number of times is fetched in a sense amplifier,
data read from the third memory cell at a time when the voltage applied to the second word line is changed a fourth number of times is fetched in the sense amplifier,
the third number of times is different from the fourth number of times,
data is read from the second and fourth memory cells before the first and second voltages are applied to the first word line,
the third number of times depends on the data read from the second memory cell, and the fourth number of times depends on the data read from the fourth memory cell.

5. The device according to claim 1, wherein in a program-verification operation of the first memory cell,
a voltage applied to the first word line and a voltage applied to the second word line are changed more than once.

6. The device according to claim 5, wherein in the program-verification operation, the voltages applied to the first word line and the second word line are changed the same number of times.

7. The device according to claim 6, further comprising:
a third memory cell adjacent to the second memory cell; and
a third word line coupled to the third memory cell,
wherein in the program-verification operation, of the first memory cell, at a time, the voltage applied to the second word line is higher than the voltage applied to the first word line, and
wherein in the program-verification operation of the first memory cell, a fifth voltage is applied to the third work line, and a maximum voltage applied to the second word line is less than or equal to the fifth voltage.

8. The device according to claim 1, wherein
a data read operation of the first memory cell includes a first read operation and a second read operation,
in the first read operation, a third voltage lower than the first voltage and a fourth voltage lower than the second voltage are applied to the first word line and a constant voltage is applied to the second word line, and
in the second read operation, the first and second voltages are applied to the first word line and the voltage of the second word line is changed.

9. The device according to claim 1, further comprising:
a third memory cell; and
a third word line coupled to the third memory cell, wherein
the first word line is arranged between the second word line and the third word line,
data is read from the second and third memory cells before the first and second voltages are applied to the first word line, and
a voltage applied to the third word line changes a third number of times different from the first number of times and the second number of times while the first voltage is applied to the first word line.

10. The device according to claim 9, wherein the first voltage is for determining whether a threshold voltage of the first memory cell is in an erase level.

11. The device according to claim 1, wherein
the first and second word lines are stacked, and
the voltage of the second word line depends on a layer position in which the second word line is provided.

12. The device according to claim 1, further comprising:
a bit line electrically coupled to the second memory cell;
a sense amplifier coupled to the bit line;
a first block including the first and second memory cells; and
a second block discharging the bit line, wherein
the first block is arranged between the sense amplifier and the second block, and
the bit line is discharged by the sense amplifier and the second block after a data read operation.

13. The device according to claim 1, wherein when a threshold level of the second memory cell is higher than that of the first memory cell, the voltage of the second word line is controlled to correct a threshold voltage of the first memory cell.

14. The device according to claim 13, wherein when the threshold level of the second memory cell is the same as that of the first memory cell, the voltage of the second word line is controlled to correct the threshold voltage of the first memory cell.

15. A semiconductor memory device comprising:
a first memory cell;
a second memory cell coupled to the first memory cell;
a first word line coupled to the first memory cell; and
a second word line coupled to the second memory cell,
wherein in a program-verification operation of the first memory cell,
a voltage applied to the first word line changes a first number of times, and a voltage applied to the second word line changes a second number of times.

16. The device according to claim 15, wherein the first number of times is the same as the second number of times.

17. The device according to claim 16, wherein at a time, the voltage of the second word line is higher than the voltage of the first word line.

18. The device according to claim 15, wherein when data is read from the first memory cell,
a second voltage and a third voltage different from the second voltage are applied to the first word line, and
the voltage applied to the second word line changes a third number of times while the second voltage is applied to the first word line, and the voltage applied to the second word line changes a fourth number of times different from the third number of times while the third voltage is applied to the first word line.

19. The device according to claim 1, wherein the second memory cell on a source side is adjacent to the first memory cell on a drain side.

20. The device according to claim 19, further comprising:
a third memory cell on the drain side adjacent to the first memory cell on the source side; and
a third word line coupled to the third memory cell,
wherein while the first voltage is applied to the first word line and while the second voltage is applied to the first word line, a voltage to switch on the third memory cell regardless of held data of the third memory cell is applied to the third word line.

* * * * *